US009482410B2

(12) United States Patent
Lee et al.

(10) Patent No.: US 9,482,410 B2
(45) Date of Patent: Nov. 1, 2016

(54) LIGHT EMITTING MODULE AND SURFACE LIGHTING DEVICE HAVING THE SAME

(71) Applicant: SAMSUNG ELECTRONICS CO., LTD., Suwon-si, Gyeonggi-do (KR)

(72) Inventors: Ki Un Lee, Hwaseong-si (KR); June Jang, Seoul (KR); Seung Gyun Jung, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 177 days.

(21) Appl. No.: 14/068,915

(22) Filed: Oct. 31, 2013

(65) Prior Publication Data

US 2014/0160754 A1    Jun. 12, 2014

Related U.S. Application Data

(63) Continuation-in-part of application No. 14/067,798, filed on Oct. 30, 2013.

(30) Foreign Application Priority Data

Dec. 11, 2012  (KR) .................. 10-2012-0143955
Oct. 11, 2013  (KR) .................. 10-2013-0121182

(51) Int. Cl.
*F21V 11/00*  (2015.01)
*F21V 13/02*  (2006.01)
(Continued)

(52) U.S. Cl.
CPC .................. *F21V 13/02* (2013.01); *F21S 8/04* (2013.01); *F21V 5/04* (2013.01); *F21V 7/0033* (2013.01);
(Continued)

(58) Field of Classification Search
CPC .............. F21S 4/28; F21S 4/20; F21S 8/04; F21V 23/0442; F21V 5/04; F21V 7/0033; F21V 13/02; F21V 13/04
See application file for complete search history.

(56) References Cited

U.S. PATENT DOCUMENTS 8,523,393 B2 * 9/2013 Dong Soo ............... F21S 4/008
                                                362/235
8,870,407 B2 * 10/2014 Kim ......................... F21S 4/008
                                                362/217.02
(Continued)

FOREIGN PATENT DOCUMENTS

JP    2007-048773 A    2/2007
JP    2009-044099 A    2/2009
(Continued)

OTHER PUBLICATIONS

Office Action in parent application dated Mar. 10, 2016, U.S. Appl. No. 14/067,798, having references cited herewith.

*Primary Examiner* — Anabel Ton

(57) ABSTRACT

A light emitting module is configured to provide substantially uniform lighting using a plurality of lighting sources. The light emitting module includes a diffusion plate disposed at a set distance from the light emitting module. A light source substrate has a substantially quadrilateral outer perimeter with at least one gap formed therein, and a plurality of light sources are disposed on the light source substrate according to a repeated quadrilateral pattern. A distance between adjacent light sources in the repeated quadrilateral pattern is selected based on the set distance h from the diffusion plate to the light emitting module, and on a greater of two diagonal distances x, y of the quadrilateral pattern. The diffusion plate diffuses light emitted by the light sources to provide substantially uniform light. Various other aspects of the light emitting module are additionally described.

24 Claims, 37 Drawing Sheets

(51) Int. Cl.
*H01L 25/075* (2006.01)
*F21S 8/04* (2006.01)
*F21V 5/04* (2006.01)
*F21V 7/00* (2006.01)
*F21V 23/04* (2006.01)
*H05K 1/05* (2006.01)
*H05B 33/08* (2006.01)
*H05B 37/02* (2006.01)
*H01L 33/38* (2010.01)
*F21Y 101/02* (2006.01)
*F21Y 105/00* (2016.01)
*H05K 1/02* (2006.01)
*H05K 3/00* (2006.01)

(52) U.S. Cl.
CPC ....... *F21V 23/0442* (2013.01); *H01L 25/0753* (2013.01); *H05B 33/0872* (2013.01); *H05B 37/0227* (2013.01); *H05B 37/0272* (2013.01); *H05K 1/056* (2013.01); *F21Y 2101/02* (2013.01); *F21Y 2105/003* (2013.01); *H01L 33/382* (2013.01); *H01L 2224/48091* (2013.01); *H05K 1/021* (2013.01); *H05K 1/0206* (2013.01); *H05K 1/0209* (2013.01); *H05K 1/0278* (2013.01); *H05K 3/0061* (2013.01); *H05K 2201/09063* (2013.01); *H05K 2201/09081* (2013.01); *H05K 2201/09154* (2013.01); *H05K 2201/09781* (2013.01); *H05K 2201/10106* (2013.01); *H05K 2201/10409* (2013.01); *H05K 2203/0594* (2013.01); *Y10T 29/4913* (2015.01)

(56) References Cited

U.S. PATENT DOCUMENTS

| | | |
|---|---|---|
| 2006/0012993 A1 | 1/2006 | Ohkawa |
| 2008/0284944 A1 | 11/2008 | Jeong |
| 2009/0097230 A1 | 4/2009 | Masuda et al. |
| 2009/0225550 A1 | 9/2009 | Yamaguchi |
| 2010/0079977 A1 | 4/2010 | Lee et al. |
| 2010/0220463 A1 | 9/2010 | Kim et al. |
| 2010/0265711 A1 | 10/2010 | Lee |
| 2010/0284186 A1 | 11/2010 | Han et al. |
| 2010/0295762 A1 | 11/2010 | Yeom et al. |
| 2011/0050111 A1 | 3/2011 | Tanaka et al. |
| 2011/0051397 A1 | 3/2011 | Bae et al. |
| 2011/0205734 A1 | 8/2011 | Yamakita et al. |
| 2011/0280002 A1 | 11/2011 | Furukawa |
| 2011/0317094 A1 | 12/2011 | Takase |
| 2012/0243227 A1 | 9/2012 | Shimizu et al. |

FOREIGN PATENT DOCUMENTS

| | | |
|---|---|---|
| JP | 2009-152636 A | 7/2009 |
| JP | 2010-153549 A | 7/2010 |
| JP | 2011-049069 A | 3/2011 |
| KR | 10-2010-0098989 A | 9/2010 |
| KR | 10-1033008 B1 | 5/2011 |
| WO | 2009022661 | 2/2009 |

* cited by examiner

| CHANNEL INFORMATION (CH) | WIRELESS NETWORK ID INFORMATION (PAN_ID) | DEVICE ADDRESS (Ded_Add) | SENSING DATA (MOTION VALUE, ILLUMINATION INTENSITY VALUE) |

LIGHT EMITTING MODULE AND SURFACE LIGHTING DEVICE HAVING THE SAME

CROSS-REFERENCE TO RELATED APPLICATIONS

This is a Continuation-in-Part of U.S. application Ser. No. 14/067,798, filed on Oct. 30, 2013, which claims the priority of Korean Patent Application No. 10-2012-0143955 filed on Dec. 11, 2012 and No. 10-2013-0121182 filed on Oct. 11, 2013, with the Korean Intellectual Property Office, the disclosures of which are incorporated herein by reference.

TECHNICAL FIELD

The present disclosure relates to a light emitting module and a surface lighting device including the same.

BACKGROUND

In recent years, semiconductor light emitting devices have been used in backlight units provided in display devices such as television screens and computer monitors, or as light sources utilized in illuminating devices such as ceiling and other. As advances in semiconductor light emitting devices have increased component efficiency, and as pressure to reduce manufacturing costs remains high, illuminating devices are being developed that produce the same light output but include fewer semiconductor light emitting devices. However, because semiconductor light emitting devices produce a highly directional light, the uniformity of light produced by the illuminating devices may be deteriorated as the number of semiconductor light emitting devices is reduced and spacing between semiconductor light emitting devices consequently increases. Additionally, the need for the semiconductor light emitting devices to be spaced apart to provide uniform light makes it difficult to significantly reduce the area of the substrate on which the light emitting devise are disposed, and to thereby reduce material costs for producing the illuminating devices. Accordingly, a novel scheme to decrease the manufacturing costs of a light emitting module, while not affecting light properties of the light emitting module, is needed.

SUMMARY

An aspect of the present disclosure provides a light emitting module having improved light uniformity through a design and a layout of a light source substrate and light sources.

Other aspects of the present disclosure provide a surface lighting device including a light emitting module as described above, and a method for disposing light sources in a light emitting module as described above.

According to an aspect of the present disclosure, a light emitting module is configured to emit light to be diffused through a diffusion plate, the diffusion plate being disposed at a set distance from the light emitting module. The light emitting module includes: a light source substrate having a substantially quadrilateral outer perimeter with at least one gap formed therein; and a plurality of light sources disposed on the light source substrate according to a repeated quadrilateral pattern and configured to emit the light, wherein a distance between adjacent light sources in the repeated quadrilateral pattern is such that a ratio MH, of the set distance h from the diffusion plate to the light emitting module divided by a greater of two diagonal distances x, y of the quadrilateral pattern, is greater or equal to 1.

The plurality of light sources can be disposed in a repeated diamond pattern on the light source substrate.

The distance between adjacent light sources in the repeated quadrilateral pattern can be such that the ratio MH is smaller than or equal to 3.

The distance between adjacent light sources in the repeated quadrilateral pattern is such that the ratio MH can satisfy the inequality:

$$0.8 \le -0.0592 MH4 + 0.4979 MH3 - 1.5269 MH2 + 1.9902 MH - 0.0888.$$

The light emitting module can further include at least two connectors of different types disposed on the light source substrate and configured to receive power for driving the plurality of light sources.

The plurality of lights sources can be a plurality of lights emitting diodes (LEDs). Each LED of the plurality of LEDs can be a chip including: a substrate; a first conductivity-type semiconductor layer disposed on the substrate; an active layer disposed on the first conductivity-type semiconductor layer; a second conductivity-type semiconductor layer disposed on the active layer; and first and second electrodes electrically connected to the first and second conductivity-type semiconductor layers, respectively.

The first electrode of each LED can include a first electrode layer extending through one or more contact holes extending through the active layer and the second conductivity-type semiconductor layer, and the first electrode layer can be electrically insulated from the second conductivity-type semiconductor layer and the active layer by an insulating layer.

Each LED of the plurality of LEDs can include a plurality of nano light emitting structures, and each nano light emitting structures can include a nanocore having a rod structure and formed of the first conductivity-type semiconductor layer, the active layer disposed on the nanocore, and the second conductivity-type semiconductor layer disposed on the active layer.

Each LED chip can be located within an LED package disposed on the light source substrate, and the LED package can include: a package body having the LED chip disposed thereon; a plurality of electrodes disposed in the package body and electrically connected to the first and second electrodes of the LED chip; and a lens disposed above the package body and configured to guide light emitted by the LED chip.

The light source substrate can include: a first metal layer; an insulating layer disposed on the first metal layer; and a second metal layer disposed on the insulating layer, wherein the light source substrate includes a region located at an edge of the substrate and in which the insulating layer does not have the second metal layer disposed thereon.

The diagonal distances x, y of the quadrilateral pattern can be distances between centers of light sources disposed at apexes of the quadrilateral pattern.

The light source substrate can include a substantially rectangular spine part and at least two substantially rectangular branch parts emanating from a side of the spine part, and the plurality of light sources can be disposed on the rectangular branch parts such that the distance between adjacent light sources in the repeated quadrilateral pattern is such that the ratio MH is greater or equal to 1.

According to another aspect of the present disclosure, a light emitting module is configured to be mounted on a base part, and at least one hook extends from a surface of the base part having the light emitting module disposed thereon. The light emitting module includes: a light source substrate including a substantially rectangular spine part, at least one substantially rectangular branch part emanating from a side of the spine part, and at least one hook part configured to engage with the at least one hook extending from the surface of the base part to fix the light emitting module to the base part; and a plurality of light emitting diodes (LEDs) disposed on the at least one branch part of the light source substrate and operative to emit light.

The at least one hook part can be disposed at an end of the substantially rectangular branch part that is spaced away from the spine part.

The substantially rectangular branch part can have a width and a length greater than the width, and the hook part can have a width smaller than the width of the branch part.

The hook part can have a width smaller than the width of the branch part by at least 1.4 mm.

The hook part can have a width smaller than the width of the branch part by at least 2 mm.

The hook part can have a length, measured in the same direction as the length of the branch part, of at least 3 mm.

The hook part can have a length, measured in the same direction as the length of the branch part, of at least 5 mm.

The light source substrate can include a plurality of substantially rectangular branch parts emanating from the side of the spine part, and a plurality of hook parts each disposed on a corresponding one of the plurality of branch parts and each configured to engage with a corresponding hook extending from the surface of the base part to fix the light source emitting module to the base part.

The light source substrate can further include at least one through-hole for a screw fastening the light source substrate to the base part. The at least one through-hole may be located in the hook part.

According to another aspect of the present disclosure, a light emitting module includes: a light source substrate including a substantially rectangular spine part, and at least one substantially rectangular branch part emanating from a side of the spine part and having a width and a length greater than the width; a plurality of light emitting diodes (LEDs) disposed on the at least one branch part of the light source substrate and configured to emit light; and a plurality of lenses each disposed on a corresponding LED of the plurality of LEDs, wherein each lens of the plurality of lenses has a substantially circular cross-section parallel to a surface of the light source substrate and having a diameter smaller than the width of the branch part.

The ratio of the diameter of each lens to the width of the branch part can be smaller than or equal to 90%.

Spacing between an outer edge of the branch part and an outer edge of each lens can be at least 0.6 mm.

The diameter of each lens can measure less than 12.2 mm.

The branch part can have a width of at least 13 mm.

According to another aspect of the present disclosure, a light emitting module includes: a light source substrate including a substantially rectangular spine part, and at least one substantially rectangular branch part emanating from a side of the spine part and having a width and a length greater than the width; and a plurality of light emitting diodes (LEDs) disposed on the at least one branch part of the light source substrate and configured to emit light, wherein each LED is spaced away from edges of the branch part by at least 5% of the width of the branch part.

Spacing between an outer edge of the branch part and an outer edge of each LED can be at least 0.68 mm.

Each LED can have a width, measured in the same direction as the width of the branch part, that is less than 12.28 mm.

The spine part can have a width of at least 13.65 mm.

According to a further aspect of the present disclosure, a lighting device includes: a base part; a light source substrate mounted on the base part and having a substantially quadrilateral outer perimeter with at least one gap formed therein; a plurality of light emitting diodes (LEDs) disposed on the light source substrate according to a repeated diamond pattern and configured to emit the light; and a diffusion plate disposed at a set distance from the light source substrate and configured to diffuse the light emitted by the plurality of LEDs, wherein a distance between adjacent LEDs in the repeated diamond pattern is such that a ratio MH, of the set distance h from the diffusion plate to the plurality of LEDs divided by a greater of two diagonal distances x, y of the diamond pattern, is within a prescribed range.

The prescribed range can be MH≥1.

The prescribed range can be 1≤MH≤3.

The lighting device can further include: a light collecting sheet disposed on the diffusion plate and configured to collect light incident thereinto in a vertical direction; and a protective sheet disposed on the light collecting sheet and configured to protect the light collecting sheet, the diffusion plate, the light source substrate, and the plurality of LEDs.

The lighting device can further include: a fixing bar disposed above the light source substrate and attached to the base part so as to fix the light source substrate to the base part.

The light source substrate can include a substantially rectangular spine part, and at least one substantially rectangular branch part emanating from a side of the spine part, and the fixing bar can be disposed above the light source substrate so as to cover an end of the substantially rectangular branch part spaced away from the spine part.

According to another example of the present disclosure, a method includes: providing a light source substrate having a substantially quadrilateral outer perimeter with at least one gap formed therein for use in a lighting device including a diffusion plate disposed at a set distance from the light source substrate; determining a maximum distance between adjacent light sources in a repeated quadrilateral pattern of light sources on the light source substrate, wherein the maximum distance is such that a ratio MH, of the set distance h from the diffusion plate to the light source substrate divided by a greater of two diagonal distances x, y of the quadrilateral pattern, is greater or equal to 1; and disposing a plurality of light sources on the light source substrate according to the repeated quadrilateral pattern such that adjacent light sources are separated by a distance not exceeding the determined maximum distance.

The disposing of the plurality of light sources can include disposing the plurality of light sources on the light source substrate according to a repeated diamond pattern.

The maximum distance between adjacent light sources in the repeated quadrilateral pattern can be such that the ratio MH satisfies the inequality:

$$0.8 \leq -0.0592 MH^4 + 0.4979 MH^3 - 1.5269 MH^2 + 1.9902 MH - 0.0888.$$

The method can further include: disposing at least two connectors of different types on the light source substrate and configured to receive power for driving the plurality of light sources.

The plurality of lights sources can be a plurality of lights emitting diodes (LEDs).

The method can further include: disposing a plurality of lenses on each of the plurality of light sources on the light source substrate.

The method can further include: disposing a plurality of reflective parts on each of the plurality of light sources on the light source substrate, wherein each reflective part includes a curved surface facing a respective light source and a plurality of openings allowing light emitted by the respective light source to pass through.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1:
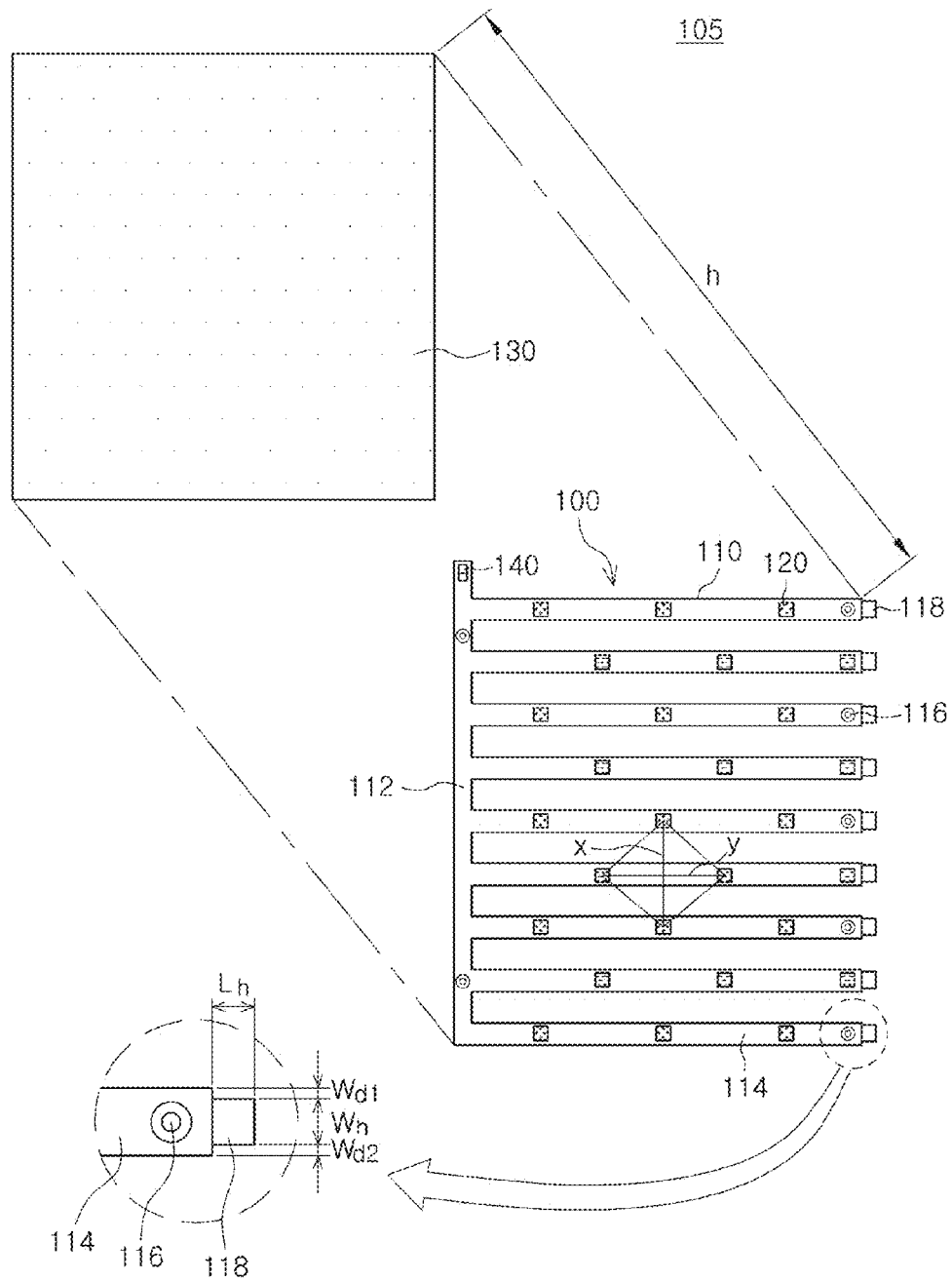
FIG. 1 is a plan view illustrating a light emitting module according to an embodiment of the present inventive concepts.

Embodiments of the present inventive concepts will now be described in detail with reference to the accompanying drawings.

The inventive concepts may, however, be exemplified in many different forms and should not be construed as being limited to the specific embodiments set forth herein. Rather, these embodiments are provided so that this disclosure will be thorough and complete, and will fully convey the scope of the inventive concepts to those skilled in the art.

In the drawings, the shapes and dimensions of elements may be exaggerated for clarity, and the same or like reference numerals will be used throughout to designate the same or like elements.

FIG. 1 is a plan view illustrating a lighting device according to an embodiment of the inventive concepts.

With reference to FIG. 1, a lighting device 105 according to an embodiment may include a light emitting module 100 including a light source substrate 110 and a plurality of light sources 120. The lighting device 105 can further include a diffusion plate 130.

The light source substrate 110 may be provided as a region in which the plurality of light sources 120 are disposed.

For example, the light source substrate 110 may include a circuit board having a wiring pattern provided on a surface thereof, in an inner portion thereof, and the like. Here, the circuit board may be made of a material having superior heat dissipation efficiency and light reflectivity. For example, the light source substrate 110 may include a general FR4-type printed circuit board (PCB), and may be made of an organic resin material containing epoxy, triazine, silicon, polyimide, or the like, other organic resin materials, a ceramic material such as silicon nitride, aluminum nitride (AlN), $Al_2O_3$, or the like, or metal and a metal compound. In addition, the light source substrate 110 may be a metal core printed circuit board (MCPCB), a metal printed circuit board (MPCB), a flexible printed circuit board (FPCB), or the like.

Here, the light source substrate 110 can have a substantially quadrilateral outer perimeter with one or more gaps formed therein, as shown in FIG. 1. In particular, the light source substrate 110 may include a spine part 112, and at least one branch part 114 extending from a side surface of the spine part 112. The spine part 112 may be rectangular, and the branch part 114 may be rectangular and may be understood to be a portion extending from a side of the spine part 112.

The light source substrate 110 including the spine part 112 and the branch part 114 may be provided to have various shapes. The light source substrate 110 may be shaped in such a manner that multiple light source substrates can be formed in and separated from a single mother substrate. This will be described in more detail through various examples with reference to FIGS. 2 to 4.

Figure 2:
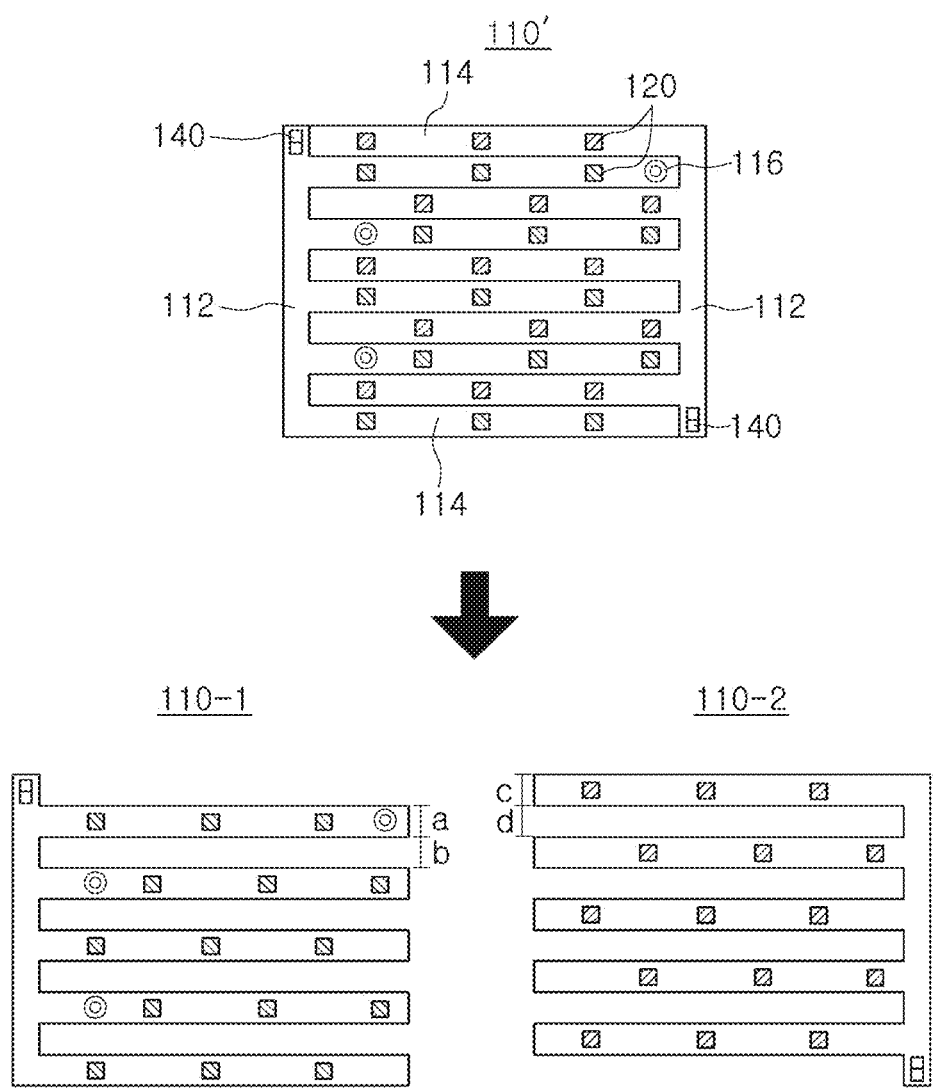
FIGS. 2 through 4 are plan views illustrating various examples of light source substrates that may be used in a light emitting module according to another embodiment of the present inventive concepts.
Figure 3:
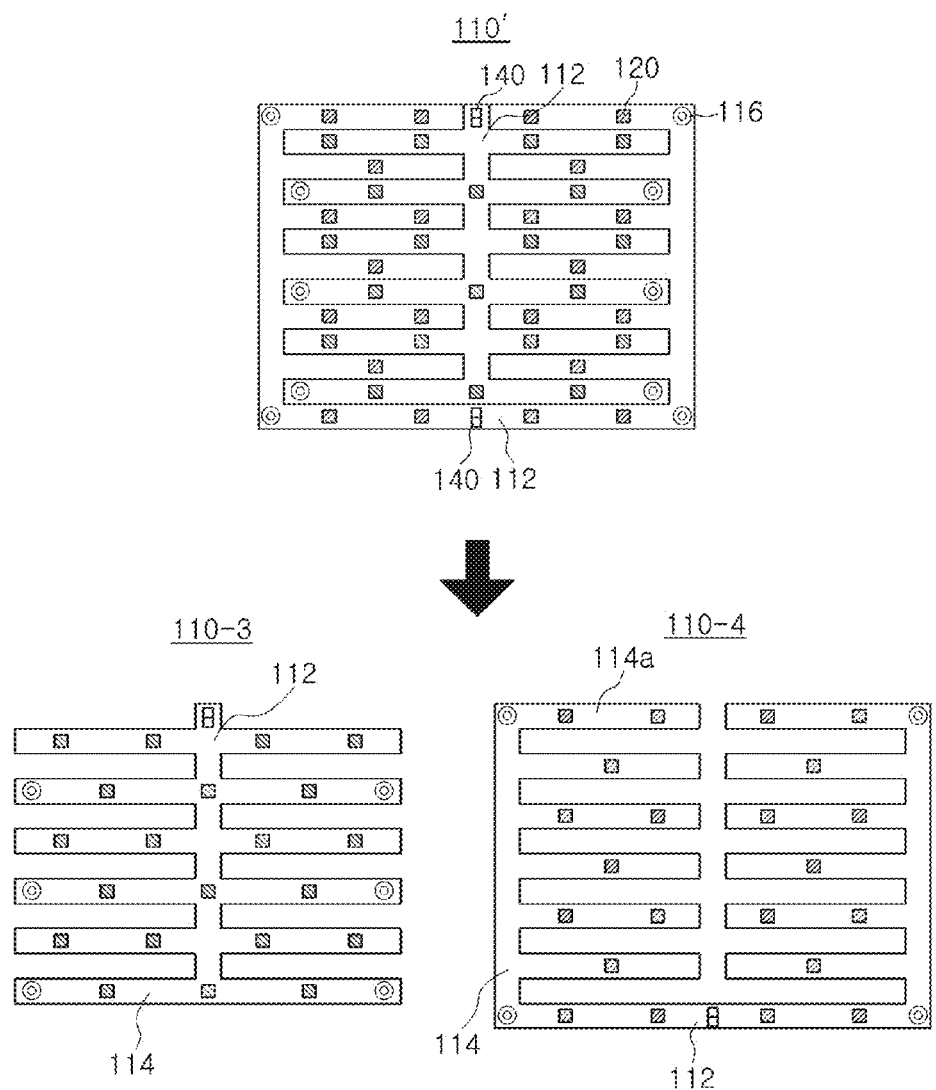
Figure 4:
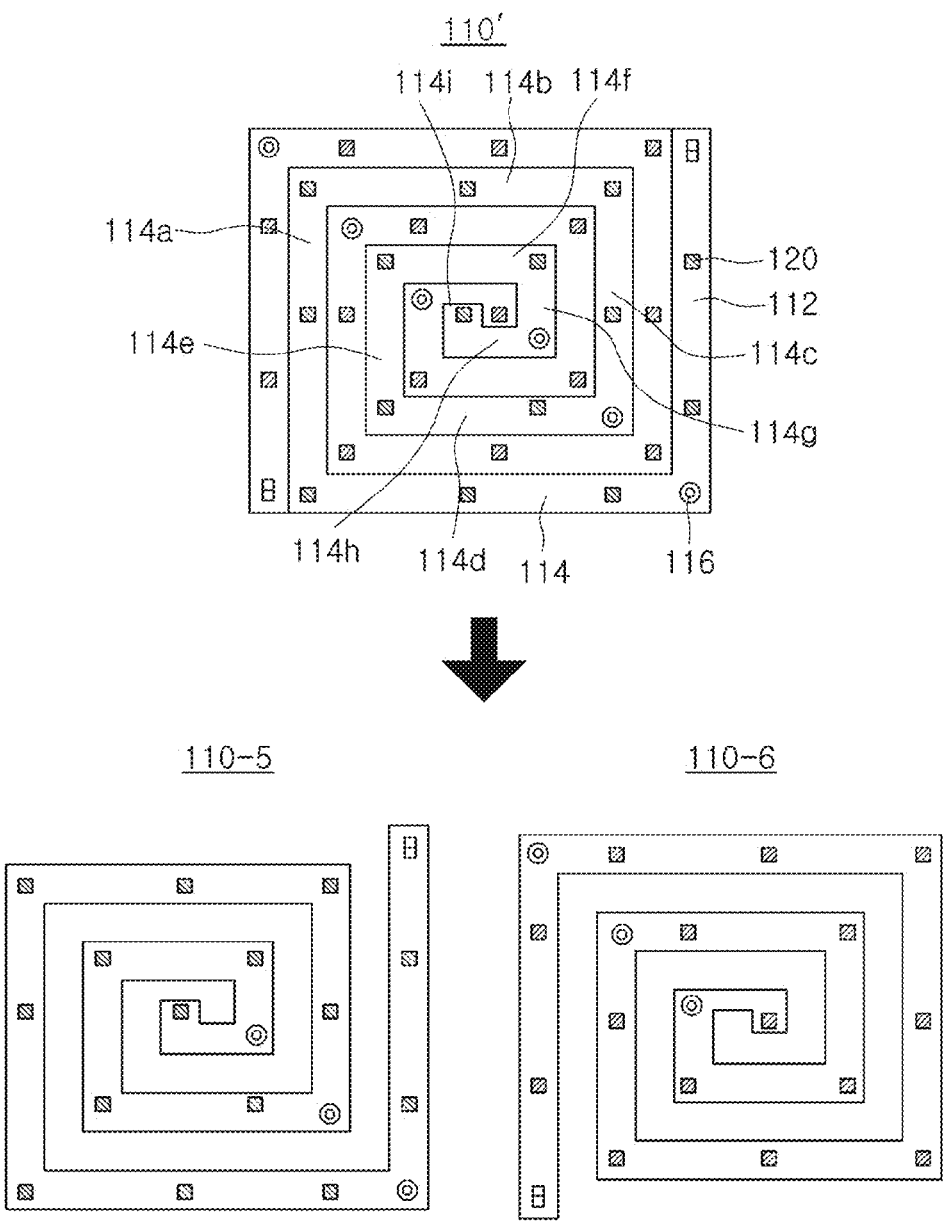

FIGS. 2 through 4 are plan views illustrating examples of light source substrates that may be used in a light emitting module according to various embodiments of the present inventive concepts.

According to an embodiment shown in FIG. 2, a mother substrate 110' may be separated by a single cut to thereby provide two separate and interlocking light source substrates 110-1 and 110-2. In addition, in order to secure homogeneous properties in the separated light source substrates 110-1 and 110-2, the cutting process may be performed such that branch parts 114 of each of the two light source substrates 110-1 and 110-2 have substantially the same widths a and c, respectively. In this case, it may be considered that, based on one of the light source substrates, respective intervals b and d between one branch part 114 and an adjacent branch part 114 in each of the substrates 110-1 and 110-2 have substantially the same width as each other.

In addition, according to another embodiment shown in FIG. 3, a single mother substrate 110' may be cut to thereby provide two interlocking light source substrates 110-3 and 110-4. Therefore, one light source substrate 110-3 of the two separated light source substrates may include a plurality of branch parts 114. In this case, the plurality of branch parts 114 may include branch parts extending from one side surface of a spine part 112 and branch parts extending from another side surface of the spine part 112 opposite to the one side surface.

Further, the other light source substrate 110-4 may include a plurality of branch parts 114. Here, the plurality of branch parts 114 may each include a plurality of sub-branch parts 114a extending from a side surface of the respective branch parts 114.

Alternatively, as shown in FIG. 4, a single mother substrate 110' may be cut to thereby provide two separate interlocking light source substrates 110-5 and 110-6. Each of the light source substrates 110-5 and 110-6 may include a spine part 112, a branch part 114 extending from a side surface of the spine part 112, and a sub-branch part 114a extending from a side surface of the branch part 114, and may further include a second sub-branch part 114b extending from a side surface of the sub-branch part 114a. More specifically, each light source substrate may include a single spine part 112 and a single branch part 114, and first to ninth sub-branch parts 114a to 114i forming a spiral, but is not limited thereto. Thus, the number of spine part(s), branch part(s), and sub-branch part(s) included in the light source substrate may be appropriately adjusted according to various embodiments.

As such, the light source substrate 110-1 through 110-6 according to the present embodiments may use a surface area that is reduced by approximately half as compared to a surface area of the entire single mother substrate 110', thereby providing improved efficiency in the amount of material used to form each substrate.

Meanwhile, in the above-described examples of light source substrates able to be used according to the inventive concepts, a light source substrate is manufactured by cutting a mother substrate. More generally, however, the light source substrate may be directly manufactured to have the above-described forms or shapes without relying on a cutting process.

Hereinafter, a plurality of light sources according to various embodiments of the inventive concepts will be described in more detail.

Referring back to FIG. 1, the light emitting module 100 according to the present embodiment may include a plurality of light sources 120 disposed on the light source substrate 110.

The plurality of light sources 120 may be any devices that emit light. For example, the plurality of light sources 120 may be light emitting device packages including semiconductor light emitting devices, or may be semiconductor light emitting devices directly mounted on the light source substrate 110. The plurality of light sources 120 may emit light having a predetermined wavelength. The plurality of light sources 120 may be provided by combining light emitting devices generating different colors of light or including a wavelength conversion material such as a phosphor in order to emit white light, but should not be construed as being limited thereto.

The plurality of light sources 120 may only be mounted on the branch parts 114 of the light source substrate 110, but are not limited thereto. That is, at least some of the plurality of light sources 120 may also be mounted on the spine part 112. In addition, the number of light sources 120 mounted on the branch parts 114 and the spine part 112 may be appropriately adjusted as needed. Therefore, in a substrate 110 in which the plurality of branch parts 114 are present, the light sources 120 may not be mounted on some (e.g., one or more) of the branch parts among the plurality of branch parts 114.

The plurality of light sources 120 may be disposed according to a repeated quadrilateral pattern on a surface of the substrate 110. For example, the plurality of light sources 120 may be disposed according to a repeated diamond shaped pattern. Each diamond has four vertices, and one respective light source 120 is disposed in each vertex position of the diamond pattern while no light sources are disposed in the interior of each diamond. In detail, the plurality of light sources 120 may be arrayed according to a first matrix pattern in which the plurality of light sources 120 are arrayed in rows and columns, and a second matrix pattern in which the plurality of light sources 120 are arrayed in rows and columns, and such that the first and second matrix pattern are offset from each other such that a single light source of the second matrix pattern is positioned inside a quadrangular shape formed by four adjacent light emitting devices included in the first matrix. To more clearly illustrate the description, the light sources 120 arrayed in the first matrix and the second matrix shown in FIG. 1 are represented by '+' and '−' patterns, respectively, in the figure.

Figure 29:
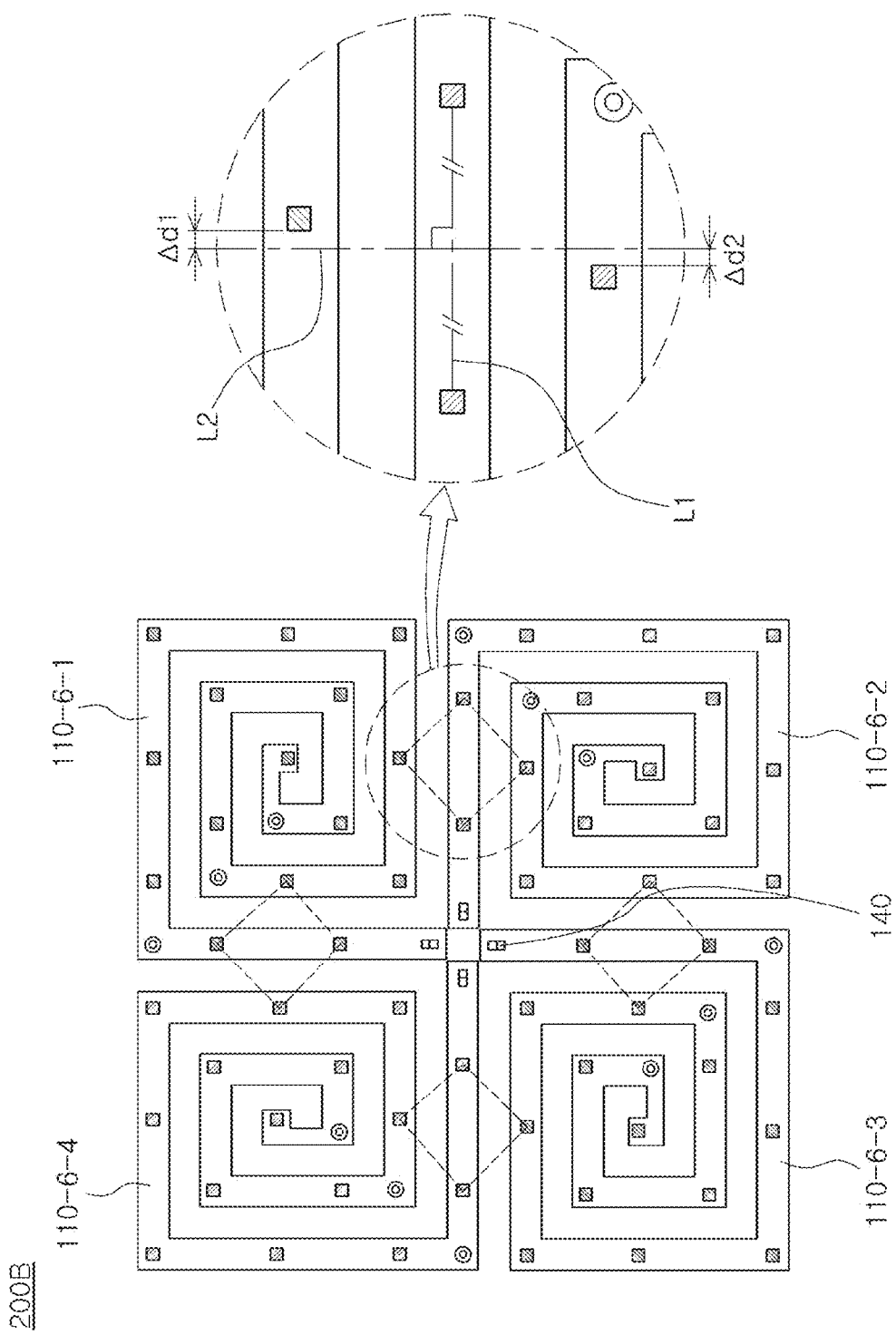

Meanwhile, in the present embodiment, the diamond shape may not be limited to a geometrically perfect diamond shape. For example, as illustrated in FIG. 29, a diamond shape may be understood as including a quadrilateral or quadrangular shape formed by four vertices such that two vertices thereof face one another in a horizontal direction and the other two vertices are spaced apart from a straight line L2 which crosses the center of a segment L1 linking the two vertices facing one another, by predetermined intervals $\Delta d1$ and $\Delta d2$, respectively, so as to be positioned in a diagonal direction.

According to the present embodiment, a matrix pattern configured of rows and columns and having light sources 120 arrayed as described above may be defined as a matrix M. In the matrix M, when a position in which the light source 120 is disposed is defined as 1 and a position in which the light source 120 is not disposed is defined as 0, the matrix M may be represented as follows.

$$M = \begin{pmatrix} 1 & 0 & 1 & 0 & 1 & 0 \\ 0 & 1 & 0 & 1 & 0 & 1 \\ 1 & 0 & 1 & 0 & 1 & 0 \\ 0 & 1 & 0 & 1 & 0 & 1 \\ 1 & 0 & 1 & 0 & 1 & 0 \\ 0 & 1 & 0 & 1 & 0 & 1 \\ 1 & 0 & 1 & 0 & 1 & 0 \\ 0 & 1 & 0 & 1 & 0 & 1 \\ 1 & 0 & 1 & 0 & 1 & 0 \end{pmatrix}$$

That is, according to the present embodiment, the number of light sources 120 may be reduced to approximately half that of the following matrix prior_M in which light sources are arrayed in a single matrix configured of a plurality of rows and columns. In addition, since the light sources 120 are disposed to be offset from one another, the degradation of light uniformity may be effectively decreased, even with a reduction in the number of light sources 120.

$$\text{prior\_M} = \begin{pmatrix} 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \\ 1 & 1 & 1 & 1 & 1 & 1 \end{pmatrix}$$

In addition, as represented in the matrix M above, the array may be designed such that the number of light sources disposed in a first column of the matrix M (five (5)) is different from the number of light sources disposed in a last column of the matrix M (four (4)). For example, a difference in the number of the light sources disposed in first and last columns as described above may be '1'. As such, in the case in which the numbers of light sources disposed in the first column and the last column are different, relatively suitable light uniformity may be easily provided when a plurality of light source substrates 110 are disposed in a tile arrangement such that they are adjacent to each other. This will be described in detail below with reference to FIG. 28.

Meanwhile, the plurality of light sources 120 according to the embodiment may be disposed on the light source substrate 110 including the spine parts 112 and the branch parts 114, i.e. on a light source substrate that is not a single flat-type square or rectangular substrate. Because of the shape of the light source substrate 110, it may be difficult to position the plurality of light sources 120 so as to be disposed in an optimum layout, such as in a repeated quadrilateral pattern (e.g., a diamond shape pattern).

Figure 5:
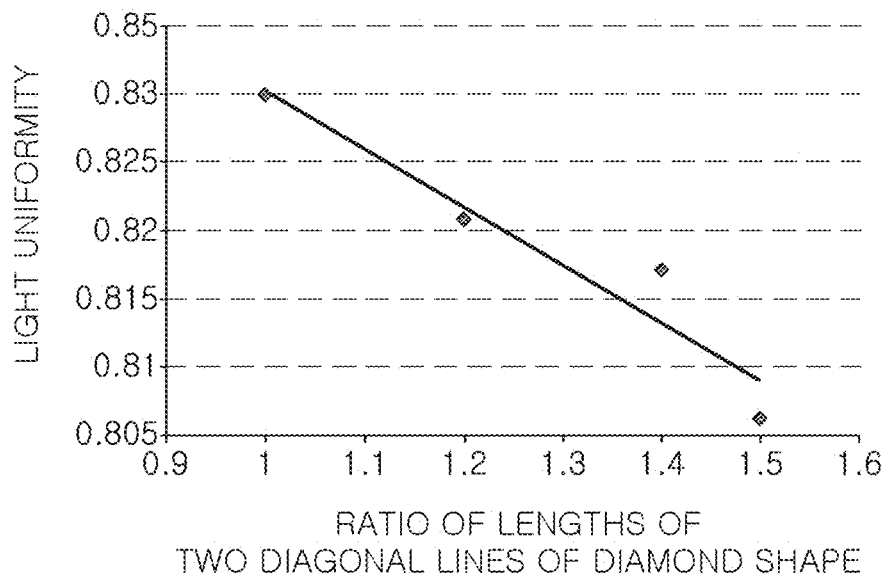
FIG. 5 is a graph illustrating a relationship between a ratio MH of lengths of two diagonal lines within a diamond shape and a degree of light uniformity.

That is, as illustrated in an experimental data graph of FIG. 5, the plurality of light sources may be disposed in the repeated diamond shape pattern as described above to satisfy a 1:1 ratio between the lengths of the two diagonal lines (x and y) of the diamond pattern, to thus provide significantly enhanced light uniformity. However, it may be difficult to dispose the light sources 120 are repeatedly arrayed according to diamond shapes satisfying the 1:1 ratio between the lengths of the two diagonal lines (x and y) on the light source substrate 110 including the spine part 112 and the branch parts 114. Thus, the plurality of light sources 120 may need to be disposed to satisfy alleviated and reinforced conditions to be described below by simultaneously considering light uniformity and suitability for realization of a layout on the light source substrate 110.

In detail, the plurality of light sources 120 may be arrayed to satisfy a 1:1 to 1:1.5 ratio between the lengths of the two diagonal lines (x and y) of the diamond shapes. This range of values is a less stringent requirement compared to the relatively optimum light uniformity condition, i.e., the 1:1 ratio of lengths. More generally, in order to maintain light uniformity despite the alleviated condition on the ratio of diagonal lengths as described above, the plurality of light sources 120 and the diffusion plate 130 may be disposed to satisfy the following reinforced condition:

$$0.8 \leq -0.0592 MH^4 + 0.4979 MH^3 - 1.5269 MH^2 + 1.9902 MH - 0.0888,$$

where $$MH = \frac{\text{Distance } (h) \text{ between plurality of light sources and diffusion plate}}{\text{Greater line length between two diagonal lines } (x, y) \text{ of diamond shape}}$$

and the numerator and denominator have the same length unit.

The above formula will be described in more detail with reference to FIG. 6.

Figure 6:
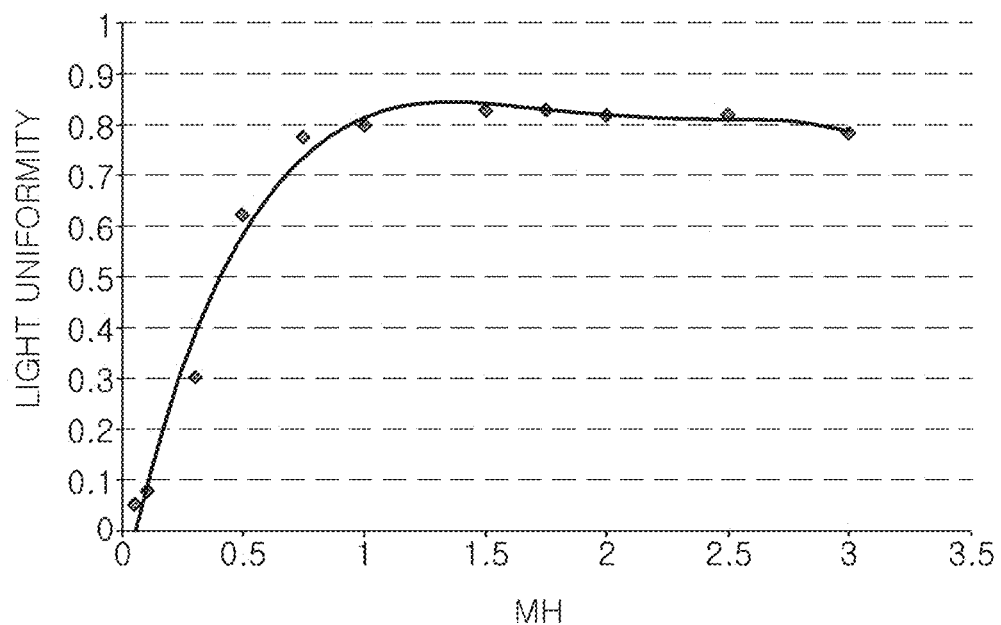
FIG. 6 is a graph illustrating a relationship of light uniformity with regard to MH.

FIG. 6 is a graph illustrating a relationship between MH and the uniformity of light emitted from the diffusion plate 130. MH is plotted along the x axis of the graph, and corresponds to a ratio of a distance h, from the plurality of light sources 120 to the diffusion plate 130, to a greater of two diagonal line lengths (x and y) in a diamond shape pattern according to which the light sources 120 are disposed. The graph of FIG. 6 shows light uniformity values obtained for each of a plurality of different values of MH. According to an empirical formula derived from the above-mentioned graph, light uniformity has the following relational formula with regard to MH:

$$\text{Light Uniformity} = -0.0592 MH^4 + 0.4979 MH^3 - 1.5269 MH^2 + 1.9902 MH - 0.0888,$$

where the R squared value indicating the accuracy of the empirical formula is 0.9873.

In general, the MH value is selected to be within the range of 0.01≤MH≤3, which is provided by considering an actual layout of the diffusion plate 130. In some examples, the distance h from the plurality of light sources 120 to the diffusion plate 130 is a set distance, and a distance between adjacent light sources of the plurality is selected such that the ratio MH remains within a specified range (e.g., 1≤MH≤3).

In general, light uniformity is theoretically the most ideal when a numerical value thereof approximates 1. In a case in which light uniformity is 0.8 or more, it may be difficult to perceive abnormalities in light uniformity when visually perceived, and thus, a resultant value from the above-mentioned formula according to the present embodiment may be 0.8 or more. According to the present embodiment, deterioration in light uniformity may be prevented while improving use efficiency of the light source substrate 110 and layout efficiency of the light sources 120 by selecting a value of MH that maintains light uniformity at or above 0.8. Hence, values of MH within the range of 1 MH 3 may be preferentially selected so as to maintain light uniformity at or above 0.8, according to the graph of FIG. 6. Values of MH below 1 may result in low light uniformity (i.e., a uniformity below 0.8), while values of MH in excess of 3 are associated with large distances between the plurality of light sources 120 and the diffusion plate 130 resulting in bulky lighting apparatuses.

Hereinafter, referring again to FIG. 1, other characteristics of the light emitting module 100 according to an embodiment of the inventive concepts will be described.

With reference to FIG. 1, the light source substrate 110 may include at least one hook part 118 or through-hole 116 for screw fastening, to allow the light source substrate to be fastened to a base part when the light source substrate is applied to a surface lighting device, such as a backlight unit or the like. The light source substrate 110 may include both the hook part 118 and the through-hole 116 for screw fastening in order to increase compatibility in a fastening scheme and allow for a high degree of design freedom. The through-hole 116 may be spaced apart from the hook part 118 as shown in FIG. 1, or the through-hole 116 may be located in the hook part 118.

Figure 7A:
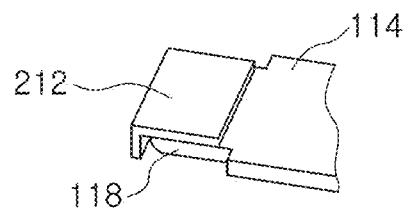
FIGS. 7A and 7B are views illustrating fastening schemes using hook parts according to an embodiment of the present inventive concepts.
Figure 7B:
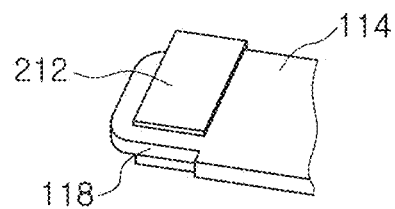

Here, the hook part 118 may be closely fastened to a hook 212 of FIG. 7A or 7B provided in the base part and extending from a surface of the base part. A front fastening scheme as shown in FIG. 7A or a side fastening scheme as shown in FIG. 7B may be applied thereto, but fastening schemes should not be construed as being limited thereto. Thus, various schemes for closely fastening the hook part 118 to the hook 212 may be employed. While a single hook 212 is shown in FIGS. 7A and 7B, more commonly a plurality of hooks 212 are disposed on the surface of the base part and are configured to simultaneously engage a plurality of hook parts 118 formed in the light emitting module 100 to securely hold the light emitting module 100 in place on the base part.

As shown in FIG. 1, the hook part 118 is configured to engage with a hook 212 of the base part to securely fix the light emitting module to the base part. As shown in FIG. 1, the hook part 118 can be disposed at an end of a branch part 114, and is spaced away from the spine part 112.

Additionally, the hook part 118 has a width that is smaller than a width of the branch part 114. Specifically, in a branch part 114 having a width and a length greater than the width, a width of the hook part 118 is measured in the same direction as the width of the branch part 114. The width of the hook part 118 is smaller than the width of the branch part 114. As a result, when the hook part 118 is inserted into a hook 212 having a width corresponding to the width of the hook part 118, only the hook part 118 can fit into the hook 212. In particular, the branch part 114 cannot fit into the hook 212 because the branch part 114 has a width greater than a width of the hook 212.

In one example, the hook part 118 has a length $L_h$, measured in the same direction as a length of the branch part 114, that is greater than or equal to 3 mm. In general, the hook part has a length $L_h$ of at least 5 mm. Additionally, the hook part 118 has a width $W_h$ that is at least 1.4 mm less than a width of the branch part 114, and that is generally at least 2 mm less than the width of the branch part 114. As shown in FIG. 1, the differences in widths of the branch part 114 and hook part 118 result in a step change between the widths of the branch part 114 and hook part 118. The step change $W_{d1}, W_{d2}$ can be a step change of at least 0.7 mm (and commonly at least 1 mm) on each side of the branch part 118, resulting in a total change in widths of at least 1.4 mm (and commonly at least 2 mm).

In addition, FIG. 1 illustrates that the hook part 118 is disposed on an edge portion of the branch part 114, but the position of the hook part 118 is not limited thereto. That is, the hook part 118 may be disposed on another portion of the light source substrate 110. For example, the hook part 118 may be disposed on a side surface of the spine part 112.

The light source substrate 110 may include at least one connector part 140 to transmit and receive power (e.g., as an external electrical signal) to drive the plurality of light sources 120.

Figure 8A:
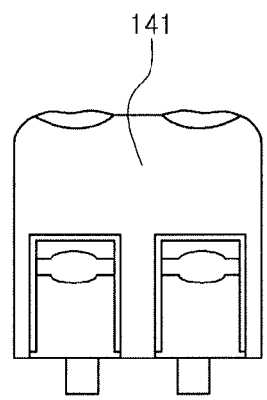
FIGS. 8A and 8B are views illustrating connector parts according to an embodiment of the present inventive concepts.
Figure 8B:
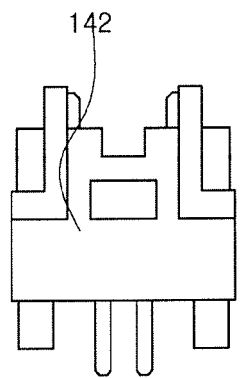

In detail, the connector part 140 may include at least one of a poke-in type connector 141 as shown in FIG. 8A and a push-in type connector as shown in FIG. 8B. In consideration of compatibility and design freedom, both the poke-in type connector 141 and the push-in type connector 142 may be included in a single light source substrate 110.

Hereinafter, various examples of a light source substrate and a light source according to various embodiments of the inventive concepts will be described with reference to FIGS. 9 through 22.

FIGS. 9 through 15 are views illustrating examples of the light source substrate 110 applicable to the light emitting module 100 according to embodiments of the inventive concepts.

<First Embodiment of Light Source Substrate>

Figure 9:
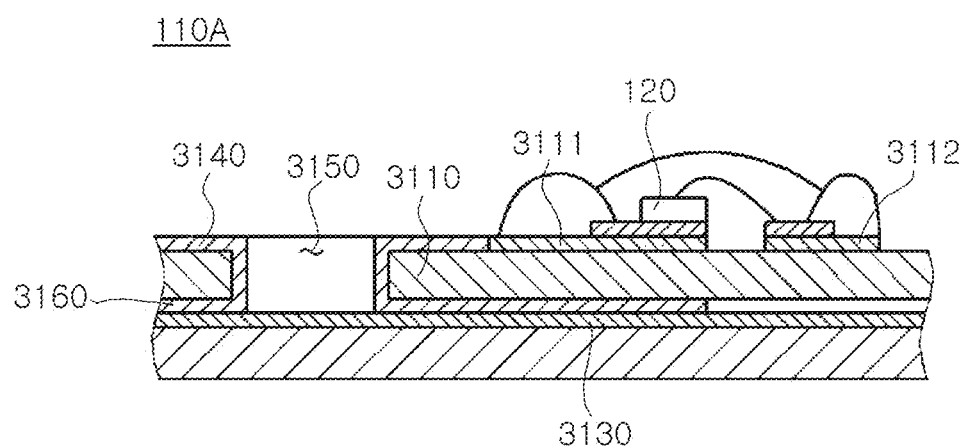
FIGS. 9 through 15 are views illustrating examples of various light source substrates applicable to a light emitting module according to embodiments of the present inventive concepts.

As illustrated in FIG. 9, a light source substrate 110A applicable to the present embodiment may include an insulating substrate 3110 including predetermined circuit patterns 3111 and 3112 formed on one surface thereof. An upper thermal diffusion plate 3140 can be formed on the insulating substrate 3110 such that the upper thermal diffusion plate 3140 is in contact with at least one of the circuit patterns 3111 and 3112, and dissipates heat generated by a light source 120. A lower thermal diffusion plate 3160 can further be formed on the other surface of the insulating substrate 3110 to transmit heat from the upper thermal diffusion plate 3140 outwardly. Although not shown, the light source substrate 110A may include a spine part 112 and at least one branch part 114 extending from a side surface of the spine part 112, as described in the embodiment of FIG. 1.

In the present embodiment, the upper thermal diffusion plate 3140 and the lower thermal diffusion plate 3160 may be connected by at least one through-hole 3150 that penetrates through the insulating substrate 3110 and has plated inner walls so as to conduct heat between the thermal diffusion plates.

In the insulating substrate 3110, the circuit patterns 3111 and 3112 may be formed by cladding a ceramic or epoxy resin-based FR4 core with copper and performing an etching process thereon. An insulating thin film 3130 may be formed by coating an insulating material on a lower surface of the insulating substrate 3110.

<Second Embodiment of Light Source Substrate>

Figure 10A:
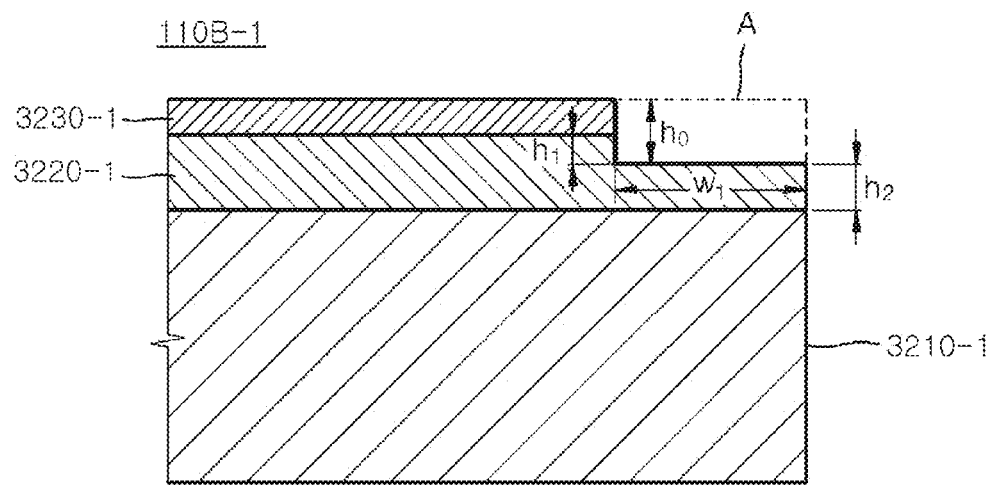

FIG. 10A schematically illustrates another example of a light source substrate. As illustrated in FIG. 10A, a light source substrate 110B-1 may include a first metal layer 3210-1, an insulating layer 3220-1 formed on the first metal layer 3210-1, and a second metal layer 3230-1 formed on the insulating layer 3220-1. A step region 'A' can be formed in the second metal layer 3230-1 to allows the insulating layer 3220-1 to be exposed in at least one end portion of the light source substrate 110B-1.

The first metal layer 3210-1 may be made of a material having excellent exothermic characteristics. For example, the first metal layer 3210-1 may be made of a metal such as aluminum (Al), iron (Fe), or the like, or an alloy thereof. The first metal layer 3210-1 may have a single layer structure or a multi-layer structure. The insulating layer 3220-1 may be made of a material having insulating properties, and may be formed using an inorganic material or an organic material. For example, the insulating layer 3220-1 may be made of an epoxy-based insulating resin, and may include metal powder such as aluminum (Al) powder, or the like, in order to enhance heat conductivity. The second metal layer 3230-1 may generally be formed of a copper (Cu) thin film.

As illustrated in FIG. 10A, in the light source substrate 110B-1 according to the present embodiment, a length of an exposed region A at one end portion of the insulating layer 3220-1, e.g., an insulation length, may be greater than a thickness of the insulating layer 3220-1. Here, the insulation length refers to a length of the exposed region A of the insulating layer 3220-1 between the first metal layer 3210-1 and the second metal layer 3230-1. When viewed from above, a width of the exposed region A of the insulating layer 3220-1 is an exposure width W1. The region 'A' in FIG. 10A is removed through a grinding process, or the like, during the manufacturing process of the light source substrate 110B-1. The region may reach to a depth '$h_0$' downwardly from a top surface of the second metal layer 3230-1 to expose the insulating layer 3220-1 by the exposure width W1, thereby forming a step structure. If the end portion of the light source substrate 110B-1 is not removed, the insulation length between the first and second metal layer 3210-1 and 3230-1 may be equal to a thickness ($h_1+h_2$) of the insulating layer 3220-1. However, by removing a portion of the end portion of the light source substrate 110B-1, an additional insulation length equal to approximately W1 may be secured. Thus, when a withstand voltage of the light source substrate 110B-1 is tested, the likelihood of contact between the two metal layers 3210-1 and 3230-1 in the end portion may be minimized.

Figure 10B:
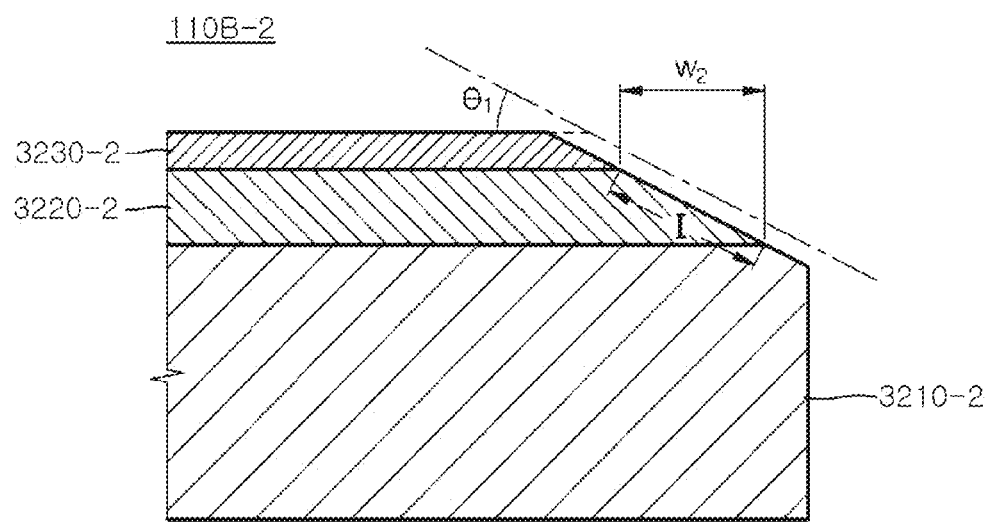

FIG. 10B is a view schematically illustrating a structure of a light source substrate 110B-2 according to a modification of FIG. 10A. Referring to FIG. 10B, the light source substrate 110B-2 may include a first metal layer 3210-2, an insulating layer 3220-2 formed on the first metal layer 3210-2, and a second metal layer 3230-2 formed on the insulating layer 3220-2. The insulating layer 3220-2 and the second metal layer 3230-2 may include regions removed at a predetermined tilt angle θ1 measured with respect to a plane of an upper surface of the second metal layer 3230-2, and the first metal layer 3210-2 may also include a region removed at the predetermined tilt angle θ1.

Here, the tilt angle θ1 may be an angle between an interface surface between the insulating layer 3220-2 and the second metal layer 3230-2 and an end portion of the insulating layer 3220-2. The tilt angle θ1 may be selected to secure a desired insulation length I in consideration of a thickness of the insulating layer 3220-2. The tilt angle θ1 may be selected from within a range of 0<θ1<90 (degrees). As the tilt angle θ1 is reduced, the insulation length I and a width W2 of the exposed region of the insulating layer 3220-2 are increased. Thus, in order to secure a relatively great insulation length, the tilt angle θ1 may be selected to be smaller. For example, the tilt angle may be selected from within a range of 0<θ1≤45 (degrees).

Although not shown in FIGS. 10A and 10B, the light source substrates 110B-1 and 110B-2 may include a spine part 112 and at least one branch part 114 extending from a side surface of the spine part 112, as described in the embodiment of FIG. 1.

<Third Embodiment of Light Source Substrate>

Figure 11:
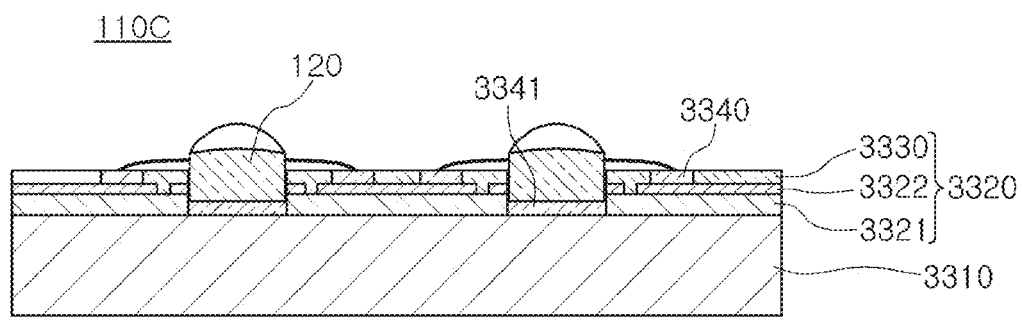

FIG. 11 schematically illustrates another example of a light source substrate. Referring to FIG. 11, a light source substrate 110C may include a metal support substrate 3310 and resin-coated copper (RCC) 3320 formed on the metal support substrate 3310. The RCC 3320 may include an insulating layer 3321 and a copper foil 3322 laminated on the insulating layer 3321. A portion of the RCC 3320 may be removed to form at least one recess in which a light source 120 may be installed. The light source substrate 110C has a structure in which the RCC 3320 is removed from a lower region of the light source 120 such that the light source 120 may be indirect contact with the metal support substrate 3310 (e.g., in direct contact through metal solder 3341). Thus, heat generated by the light source 120 is directly transmitted to the metal support substrate 3310, enhancing heat dissipation performance. The light source 120 may be electrically connected or fixed through solders 3340 and 3341. A protective layer 3330 made of a liquid photo solder resist (PSR) may be formed on the copper foil 3322.

Although not shown, the light source substrate 110C may include a spine part 112 and at least one branch part 114 extending from a side surface of the spine part 112, as described in the embodiment of FIG. 1.

<Fourth Embodiment of Light Source Substrate>

Figure 12A:
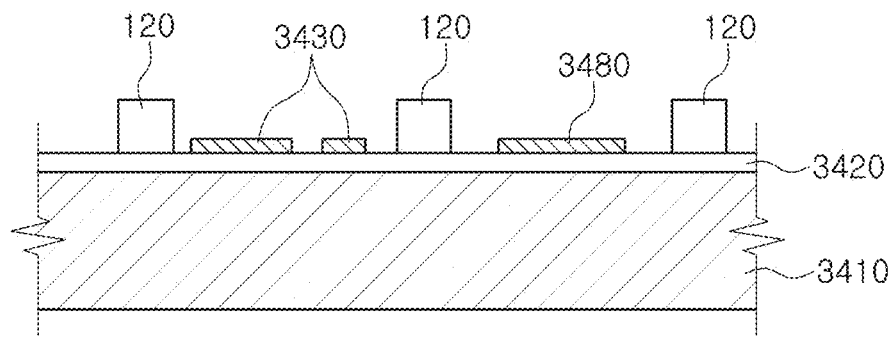
Figure 12B:
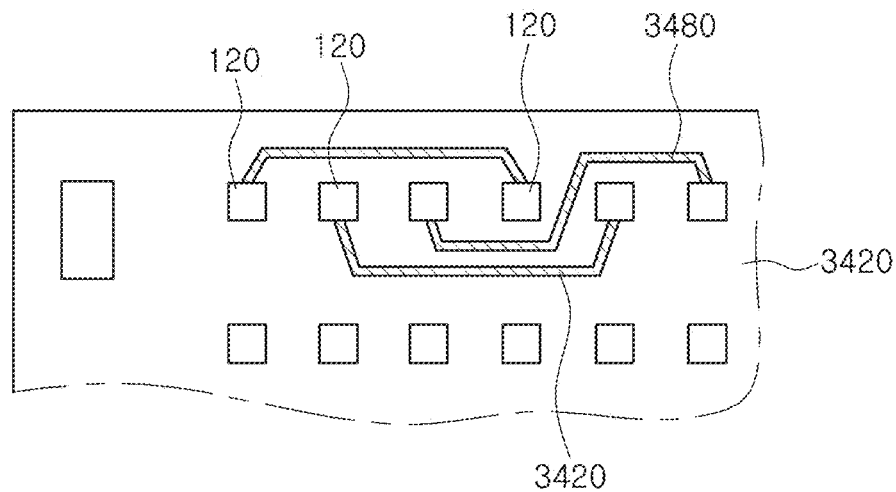

FIGS. 12A and 12B schematically illustrate another example of a light source substrate. A light source substrate 110D according to the present embodiment may include an anodized metal substrate having excellent heat dissipation characteristics and incurring low manufacturing costs. FIG. 12A is a cross-sectional view of the light source substrate 110D and FIG. 12B is a top view of the light source substrate 110D.

Referring to FIGS. 12A and 12B, the light source substrate (anodized metal substrate) 110D according to the present embodiment may include a metal board 3410, an anodic oxide film 3420 formed on the metal board 3410, and electrical wirings 3430 formed on the anodic oxide film 3420. Here, the light source substrate 110D may include a spine part 112 and at least one branch part 114 extending from a side surface of the spine part 112.

The metal board 3410 may be made of aluminum (Al) or an Al alloy that may be easily obtained at low cost. The metal board 3410 may also be made of any other anodizable metal, for example, a material such as titanium (Ti), magnesium (Mg), or the like.

The aluminum oxide film ($Al_2O_3$) 3420 obtained by anodizing aluminum has a relatively high heat transmission characteristics ranging from about 10 W/mK to 30 W/mK. Thus, the light source substrate (anodized metal substrate) 110D has superior heat dissipation characteristics as compared to those of a PCB, an MCPCB, or the like, of conventional polymer substrates.

<Fifth Embodiment of Light Source Substrate>

Figure 13:
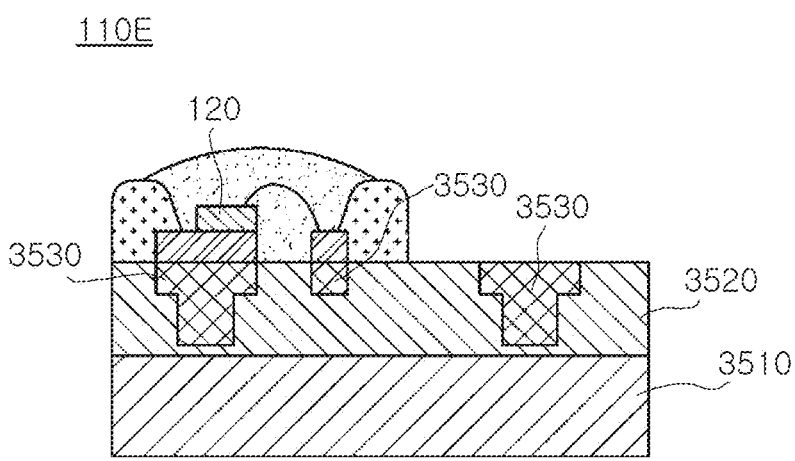

FIG. 13 schematically illustrates another example of a light source substrate. As illustrated in FIG. 13, a light source substrate 110E according to the present embodiment may include a metal substrate 3510, an insulating resin 3520 coated on the metal substrate 3510, and a circuit pattern 3530 formed on the insulating resin 3520. Here, the insulating resin 3520 may have a thickness equal to or less than 200 μm. The insulating resin 3520 may be laminated on the metal substrate 3510 in the form of a solid film or may be coated in a liquid form using spin coating or a blade.

In addition, the light source substrate 110E may include a spine part 112 and at least one branch part 114 extending from a side surface of the spine part 112, as described in the embodiment of FIG. 1.

The circuit pattern 3530 may be formed by filling a metal such as copper (Cu), or the like, in a circuit pattern intaglioed in the insulting layer 3520. A light source 120 may be mounted to be electrically connected to the circuit pattern 3530.

<Sixth Embodiment of Light Source Substrate>

Figure 14:
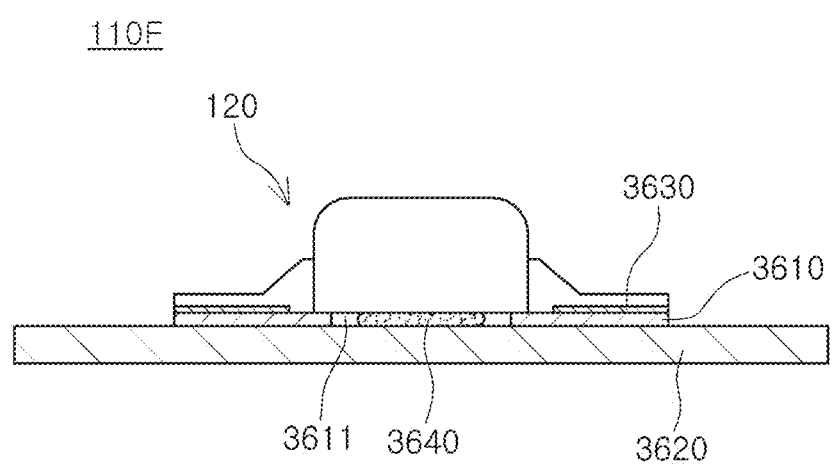

Meanwhile, a light source substrate 110F may include a flexible PCB (FPCB) that can be freely deformed. In detail, as illustrated in FIG. 14, the light source substrate 110F may include a flexible circuit board 3610 having one or more through-holes 3611, and a support substrate 3620 on which the flexible circuit board 3610 is mounted. A heat dissipation adhesive 3640 may be provided in the through-hole 3611 to couple a lower surface of a light source 120 and an upper surface of the support substrate 3620 to one another. Here, the lower surface of the light source 120 may be a lower surface of a chip package, a lower surface of a lead frame having a chip mounted on an upper surface thereof, or a metal block. A circuit wiring 3630 is formed on the flexible circuit board 3610 and is electrically connected to the light source 120.

In this manner, since the flexible circuit board 3610 is used, thickness and weight can be reduced, whereby slimness and weight reduction may be achieved and manufacturing costs may be reduced. Since the light source 120 is directly bonded to the support substrate 3620 by the heat dissipation adhesive 3640, heat dissipation efficiency in dissipating heat generated by the light source 120 may be increased. Here, the light source substrate 110F may include a spine part 112 and at least one branch part 114 extending from a side surface of the spine part 112.

<Seventh Embodiment of Light Source Substrate>

Figure 15:
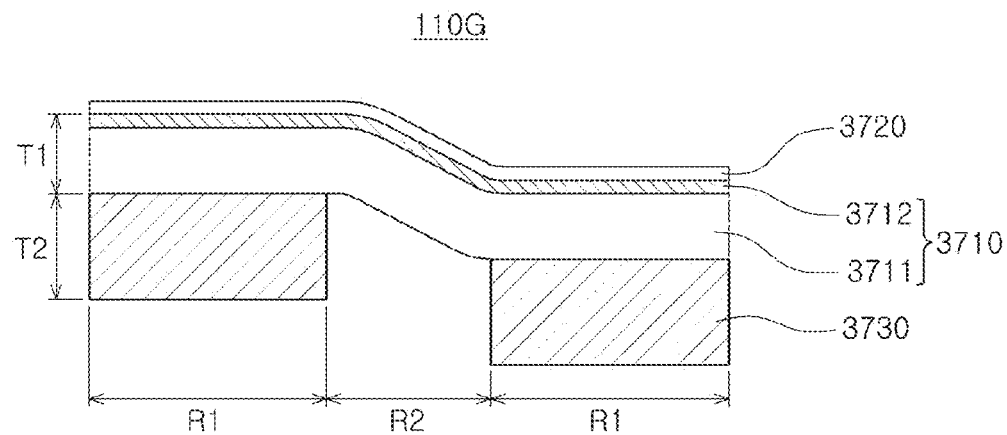

FIG. 15 schematically illustrates another example of a light source substrate. As illustrated in FIG. 15, a light source substrate 110G includes a flexible structure 3710, a solder resist layer 3720, and a heat dissipation structure 3730. Also, the light source substrate 110G may have first regions R1 and a second region R2 adjacent to one another. The first regions R1 may be device regions in which one or more electronic components, e.g., a light source, are mounted, and the second region R2 may be disposed between adjacent first regions R1 and may be a flexible region which is easily bendable. However, the amount and disposition of the first regions R1 and the second region R2 may be variously modified, and only the first regions R1 may be provided according to an embodiment.

The flexible structure 3710 may be a film formed by laminating a flexible insulating layer 3711 and a conductive layer 3712. The flexible insulating layer 3711 may include an insulating resin having excellent flexibility. For example, the flexible insulating layer 3711 may be made of a mixture obtained by mixing a ceramic filler or a light-reflective filler with an organic resin containing epoxy, triazine, silicon, or the like. In this case, the ceramic filler may serve to lower a coefficient of thermal expansion of the epoxy resin. The conductive layer 3712 may include a conductive material such as a metal. For example, the conductive layer 3712 may be formed as a resin coated copper (RCC) foil. In this case, the conductive layer 3712 may have a structure in which an epoxy resin having a thickness ranging from 50 µm to 80 µm is coated on a copper (Cu) layer having a thickness ranging from 5 µm to 70 µm. According to an embodiment, the flexible structure 3710 may be formed as an RCC foil. The conductive layer 3712 may be a patterned layer, but the inventive concept is not limited thereto.

Meanwhile, the flexible insulating layer 3711 and the conductive layer 3712 constituting the flexible structure 3710 may have excellent flexibility. Also, the flexible structure 3710 may not include a polyimide layer generally used in an FPCB or may include a polyimide layer having a relatively reduced thickness, so it has low tension, thus having excellent flexibility.

The solder resist layer 3720 may be disposed on the flexible structure 3710 and cover the pattern of the conductive layer 3712 to prevent undesired connection when an electronic component is mounted, thus protecting the conductive layer 3712 and providing insulating properties between circuits formed by the pattern of the conductive layer 3712. The solder resist layer 3720 may be made of a photosensitive resin, for example. Although not shown, the solder resist layer 3720 may be a layer patterned to expose the conductive layer 3712 in at least a partial region.

The heat dissipation structure 3730 may be disposed on one surface of the flexible structure 3710 in one or more of the first regions R1. The heat dissipation structure 3730 may be made of a material having excellent heat conductivity, for example, may be made of one or more of metal consisting of silver (Ag), aluminum (Al), nickel (Ni), chromium (Cr), copper (Cu), gold (Au), palladium (Pd), platinum (Pt), tin (Sn), tungsten (W), rhodium (Rh), Iridium (Ir), ruthenium (Ru), magnesium (Mg), zinc (Zn), titanium (Ti), or an alloy thereof, ceramics, semiconductor such as silicon (Si), germanium (Ge), or the like, and a resin.

In particular, the heat dissipation structure 3730 may be made of a metal having a high degree of heat conductivity. Thus, the heat dissipation structure 3730 may serve to dissipate heat generated by an electronic component mounted in the first regions R1 downwardly. Also, the heat dissipation structure 3730 is not formed in the second region R2, so flexibility of the light source substrate 110G in the second region R2 may be secured.

The flexible structure 3710 may have a first thickness T1, and the heat dissipation structure 3730 may have a second thickness T2 greater than the first thickness T1. The first thickness T1 may range from 0.1 µm to 0.15 µm, for example. However, the first thickness T1 may be similar to the second thickness T2 according to an embodiment. A size of the heat dissipation structure 3730, i.e., the area of the first regions R1, may be designed variously, but it is advantageous for the heat dissipation structure 3730 to have the area equal to or greater than at least one of the area of the flexible structure 3710 laminated thereon and the area of a light emitting device, in terms of heat dissipation.

The light source substrate 110G according to the present embodiment may include a small number of layers such as three layers of the heat dissipation structure 3730, the flexible insulating layer 3711, and the conductive layer 3712 or four layers of the heat dissipation structure 3730, the flexible insulating layer 3711, the conductive layer 3712, and the solder resist layer 3720, having a relatively small thickness ranging from 0.1 µm to 0.15 µm, and heat dissipation characteristics may be secured. In addition, since the light source substrate 110G is formed of a smaller number of layers, it may be formed to have a relatively small thickness and secure heat dissipation characteristics. Also, the degree of design freedom using the light source substrate 110G may be enhanced by the second region R2 as a flexible region.

FIGS. 16 through 22 are views illustrating examples of the light source 120 applicable to the light emitting module 100 according to embodiments of the inventive concepts.

<First Embodiment of Light Source>

Figure 16:
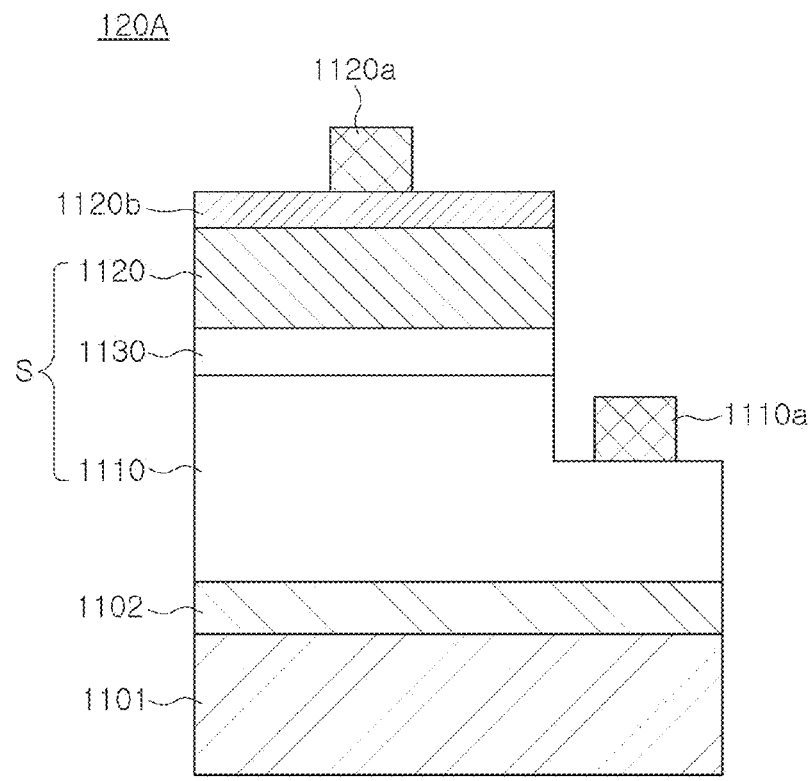
FIGS. 16 through 22 are views illustrating examples of various light sources applicable to a light emitting module according to embodiments of the present inventive concepts.

First, referring to FIG. 16, a light source according to an embodiment of the inventive concepts may be provided as an LED 120A including a light emitting laminate S formed on a semiconductor substrate 1101.

As the substrate 1101, an insulating substrate, a conductive substrate, or a semiconductor substrate may be used as necessary. For example, the substrate 1101 may be made of sapphire, SiC, Si, $MgAl_2O_4$, MgO, $LiAlO_2$, $LiGaO_2$, GaN, AlN, or AlGaN. Among them, a sapphire substrate, a silicon carbide (SiC) substrate, or the like, is commonly used as a heterogeneous substrate. In the case of a sapphire substrate, sapphire is a crystal having Hexa-Rhombo R3c symmetry, of which lattice constants in c-axis and a-axis directions are approximately 13.001 Å and 4.758 Å, respectively, and has a C-plane (0001), an A-plane (1120), an R-plane (1102), and the like. In this case, a nitride thin film may be relatively easily grown on the C-plane of the sapphire crystal, and because sapphire crystal is stable at high temperatures, the sapphire substrate is commonly used as a nitride growth substrate.

A silicon (Si) substrate may also be employed as a heterogeneous substrate. Since the Si substrate is more appropriate for increasing a diameter of a semiconductor wafer and is relatively low in price, the Si substrate may be used to facilitate mass-production. Further, when using a Si substrate, a technique of inducing a difference in lattice constants between the silicon substrate having a (111) plane as the substrate surface and GaN to a degree of 17% can be used to suppress the generation of crystal defects due to the difference between the lattice constants. Also, because a difference in coefficients of thermal expansion between silicon and GaN is approximately 56%, a technique of suppressing bowing of a wafer generated due to the difference in the coefficients of thermal expansion can further be used to prevent bowing of the wafer. Bowed wafers may result in cracks in the GaN thin film and make it difficult to control processes to increase dispersion of emission wavelengths of light in the same wafer, or the like. The Si substrate can absorb light generated in GaN-based semiconductor, and thereby lower external quantum efficiency of the LED 120A. Thus, the substrate 1101 may be removed and a support substrate such as a silicon substrate, a germanium substrate, an SiAl substrate, a ceramic substrate, a metal substrate, or the like, including a reflective layer, may be additionally or alternatively formed to be used as necessary.

The substrate 1101 of the LED 120A employed in the present embodiment is not limited to a heterogeneous substrate, and a GaN substrate, a homogeneous substrate, or the like, may alternatively be used. A GaN substrate does not have great mismatch in lattice constants and coefficient of thermal expansion with a GaN material used to form the light emitting laminate S, so the use of a GaN substrate allows a high quality semiconductor thin film to be grown thereon.

Meanwhile, when using a heterogeneous substrate, defects such as dislocation may be increased due to a difference in lattice constants between a substrate material and a thin film material. Also, differences in coefficients of thermal expansion between the substrate material and the thin film material can cause bowing of the substrate when a temperature is changed, and the bowing of the substrate may cause the formation of cracks in the thin film. These problems may be reduced by using a buffer layer 1102 formed between the substrate 1101 and the GaN-based light emitting laminate S.

Thus, in the present embodiment, the LED 120A can further include the buffer layer 1102 formed between the substrate 1101 and the light emitting laminate S. The buffer layer 1102 may serve to adjust or reduce a degree of bowing of the substrate when an active layer 1130 is grown, to thereby reduce wavelength distribution of a wafer.

The buffer layer 1102 may be made of $Al_xIn_yGa_{1-x-y}N$ ($0 \leq x \leq 1$, $0 \leq y \leq 1$), in particular, GaN, AlN, AlGaN, InGaN, or InGaAlN, and a material such as $ZrB_2$, $HfB_2$, ZrN, HfN, TiN, or the like, may also be used as necessary. Also, the buffer layer 1102 may be formed of a plurality of layers, or may be formed of a material having a gradually changing composition (e.g., such that a composition of the buffer layer 1102 changes depending on the location or depth of the layer).

Also, when employing a silicon substrate as the substrate 1101, silicon has a coefficient of thermal expansion significantly different (about 56%) from that of GaN. Thus, when growing a GaN-based thin film on the silicon substrate, the GaN thin film is generally grown at a high temperature and is subsequently cooled to room temperature. Tensile stress can thus be generated and applied to the GaN thin film during the cooling due to the difference in the coefficients of thermal expansion between the silicon substrate and the GaN thin film, thereby generating cracks. In order to prevent the generation of cracks, a method of growing the GaN thin film can be used such that compressive stress is applied to the GaN thin film while the GaN thin film is being grown so as to compensate for tensile stress. In addition, in order to restrain the generation of defects due to a difference in lattice constants, the buffer layer 1102 having a composite structure may be used. In this case, the buffer layer 1102 may serve to control stress for restraining warpage as well as for controlling the formation of defects.

For example, first, an AlN layer is formed as the buffer layer 1102 on the substrate 1101. In this case, a material not including gallium (Ga) may be used in order to prevent a reaction between silicon (Si) and gallium (Ga). The AlN layer is grown at a temperature ranging from 400° C. to 1,300° C. by using an aluminum (Al) source and a nitrogen (N) source. Here, an AlGaN intermediate layer may be inserted between a plurality of AlN layers to control stress, as necessary, to form the buffer layer 1102 having a composite or multi-layer structure.

Meanwhile, the substrate 1101 may be completely or partially removed or patterned during a fabrication process in order to enhance optical properties or electrical characteristics of the LED before or after the light emitting laminate S is grown. For example, in the case of a sapphire substrate, the substrate may be separated by irradiating a laser on an interface between the substrate 1101 and the buffer layer 1102 or on an interface between the substrate 1101 and the light emitting laminate S. In the case of a silicon substrate or a silicon carbide substrate, the substrate may be removed through a method of polishing/etching, or the like.

Also, in removing the substrate 1101, a different support substrate may be used to support the light emitting laminate structure S. In such a case, the support substrate may be attached to the opposite side of the original growth substrate by using a reflective metal. A reflective structure may be inserted into a middle portion of a bonding layer to enhance light efficiency of the LED 120A.

Referring to substrate patterning, an uneven surface or a sloped surface may be formed on a main surface (one surface or both surfaces) or a lateral surface of the substrate 1101 before or after the growth of the light emitting laminate S to enhance light extraction efficiency. A size of the pattern may be selected from within a range of 5 nm to 500 μm, and any pattern may be employed, as long as it can enhance light extraction efficiency as a regular or an irregular pattern. The pattern may have various shapes such as a columnar shape, a peaked shape, a hemispherical shape, a polygonal shape, and the like.

The light emitting laminate S includes first and second conductivity-type semiconductor layers 1110 and 1120 and the active layer 1130 interposed therebetween. The first and second conductivity-type semiconductor layers 1110 and 1120 may have a single layer structure, or the first and second conductivity-type semiconductor layers 1110 and 1120 may have a multilayer structure including layers having different compositions, thicknesses, and the like. For example, the first and second conductivity-type semiconductor layers 1110 and 1120 may include a carrier injection layer for improving electron and hole injection efficiency, or may include various types of superlattice structures.

The first conductivity-type semiconductor layer 1110 may further include a current spreading layer in a region adjacent to the active layer 1130. The current spreading layer may have a structure in which a plurality of $In_xAl_yGa_{(1-x-y)}N$ layers having different compositions or different impurity contents are iteratively laminated or have an insulating material layer partially formed therein.

The second conductivity-type semiconductor layer 1120 may further include an electron blocking layer in a region adjacent to the active layer 1130. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 1130, thus preventing electrons from being transferred over the second conductivity-type (e.g., p-type) semiconductor layer 1120.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 1101 is installed as the substrate 1101 is maintained at a high temperature ranging from 900° C. to 1,100° C. While a gallium nitride-based compound semiconductor is being grown, an impurity gas is supplied as necessary to laminate the gallium nitride-based compound semiconductor as an undoped n-type or p-type semiconductor. Silicon (Si) is a well-known n-type impurity. P-type impurities can include zinc (Zn), cadmium (Cd), beryllium (Be), magnesium (Mg), calcium (Ca), barium (Ba), and the like. Among them, magnesium (Mg) and zinc (Zn) are commonly used.

Also, the active layer 1130 disposed between the first and second conductivity-type semiconductor layers 1110 and 1120 may have a multi-quantum well (MQW) structure in which quantum well layers and quantum barrier layers are alternately laminated. For example, in the case of a nitride semiconductor, a GaN/InGaN structure may be used, or a single quantum well (SQW) structure may also be used.

In the present embodiment, an ohmic-contact layer 1120b may be formed on the second conductivity-type semiconductor layer 1120. The ohmic-contact layer 1120b may have a relatively high impurity concentration so as to have low ohmic-contact resistance, to lower an operating voltage of the element, and to enhance element characteristics. The ohmic-contact layer 1120b may be formed of a GaN layer, a InGaN layer, a ZnO layer, or a graphene layer, for example.

First or second electrodes 1110a and 1120a are electrically connected to the first and second conductivity-type semiconductor layers 1110 and 1120, respectively. The electrodes 1110a and 1120a may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

The LED 120A illustrated in FIG. 16 may have a structure in which the first and second electrodes 1110a and 1120a face in the same direction as a light extraction surface, for example. However, conversely, the first and second electrodes 1110a and 1120a may also be mounted to face in a direction opposite to the light extraction surface, for example for use in a flip-chip structure.

<Second Embodiment of Light Source>

Figure 17:
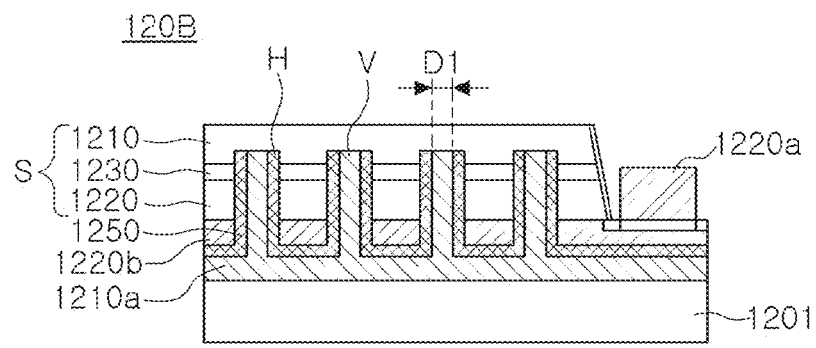

FIG. 17 illustrates a different type of LED employable as a light source according to an embodiment of the inventive concepts.

In the case of an LED 120B shown in FIG. 17, current spreading efficiency and heat dissipation efficiency in a chip unit of a light emitting module are improved. Additionally, the LED 120B can be formed as a large high output LED.

Referring to FIG. 17, the LED 120B according to the present embodiment may include a light emitting laminate S having a first conductivity-type semiconductor layer 1210, an active layer 1230, and a second conductivity-type semiconductor layer 1220 sequentially laminated therein, a second electrode layer 1220b, an insulating layer 1250, a first electrode layer 1210a, and a substrate 1201. In order to be electrically connected to the first conductivity-type semiconductor layer 1210, the first electrode layer 1210a is formed to extend through one or more contact holes H extending through the active layer 1230, second conductivity-type semiconductor layer 1220, and the second electrode layer 1220b from one surface of the first electrode layer 1210a to at least a partial region of the first conductivity-type semiconductor layer 1210. Each contact holes H is electrically insulated from the second conductivity-type semiconductor layer 1220 and the active layer 1230 by the insulating layer 1250. However, the first electrode layer 1210a is not an essential element in the present embodiment.

Each contact hole H may extend from an interface of the first electrode layer 1210a, passing through the second electrode layer 1220b, the second conductivity-type semiconductor layer 1220, and the active layer 1230, to the interior of the first conductivity-type semiconductor layer 1210. The contact hole H may extend at least to an interface between the active layer 1230 and the first conductivity-type semiconductor layer 1210 and, preferably, extend to an interior portion of the first conductivity-type semiconductor layer 1210. However, the contact hole H may be formed for electrical connectivity to and current spreading of the first conductivity-type semiconductor layer 1210, so the purpose of the contact hole H is achieved when it is in contact with the first conductivity-type semiconductor layer 1210. Thus, it is not necessary for the contact hole H to extend through the first conductivity-type semiconductor layer 1210 to an upper external surface of the first conductivity-type semiconductor layer 1210.

The second electrode layer 1220b formed on the second conductivity-type semiconductor layer 1220 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like. The material forming the second electrode layer 1220b can be selected in consideration of a light reflecting function and an ohmic-contact function with the second conductivity-type semiconductor layer 1220. The second electrode layer 1220b may be formed by using a process such as sputtering, deposition, or the like.

The contact hole H may penetrate the second electrode layer 1220b, the second conductivity-type semiconductor layer 1220, and the active layer 1230 so as to extend and be connected to the first conductivity-type semiconductor layer 1210. The contact hole H may be formed through an etching process, e.g., inductively coupled plasma-reactive ion etching (ICP-RIE), or the like.

The insulating layer 1250 is formed to cover a side wall of the contact hole H and a surface of the second conductivity-type semiconductor layer 1220. In this case, at least a portion of the first conductivity-type semiconductor layer 1210 corresponding to a lower surface of the contact hole H may be exposed. The insulating layer 1250 may be formed by depositing an insulating material such as $SiO_2$, $SiO_xN_y$, or $Si_xN_y$.

A conductive via is formed by filling the contact hole H with a conductive material. Subsequently, the substrate 1201 is formed on the second electrode layer 1220b. In this structure, the substrate 1201 may be electrically connected by the conductive to the first conductivity-type semiconductor layer 1210.

The substrate 1201 may be made of a material including any one of Au, Ni, Al, Cu, W, Si, Se, GaAs, SiAl, Ge, SiC, AlN, $Al_2O_3$, GaN, and AlGaN, and may be formed through a process such as plating, sputtering, deposition, bonding, or the like.

In order to reduce contact resistance, the amount, shape, and pitch of the contact hole H, a contact area of the contact hole H with the first and second conductivity-type semiconductor layers 1210 and 1220, and the like, may be appropriately selected. The contact holes H may be arranged in various patterns or shapes (e.g., in rows and columns) to improve a current flow. In the illustrated case, the conductive via formed in the contact holes H may be surrounded by the insulating layer 1250 so as to be electrically separated from the active layer 1230 and the second conductivity-type semiconductor layer 1220.

The number of vias V and contact area of each via may be adjusted such that the total area of the plurality of vias V, disposed in rows and columns in contact with the first conductivity-type semiconductor, ranges from 1% to 5% of the planar area of the light emitting laminate S. A radius (half (½) of the diameter D1) of the via may range, for example, from 5 um to 20 um, and the number of vias V may be 1 to 50 per light emitting device region according to a width of the light emitting region. Although different according to a width of the light emitting device region, two or more vias may be provided. A distance between the vias V may range from 100 um to 500 um, and the vias V may be disposed in a matrix pattern including rows and columns. Preferably, the distance between the vias may range from 150 um to 450 um. If the distance between the vias is smaller than 100 um, the number of vias V is increased and, as a result, the light emitting area is reduced and the luminous efficiency is similarly lowered. Conversely, if the distance between the vias is greater than 500 um, current spreading suffers and luminous efficiency is thereby degraded. A depth of the conductive via V may range from 0.5 um to 5.0 um, although the depth of the conductive via V may vary according to a thickness of the second conductivity-type semiconductor layer 1220 and the active layer 1230.

<Third Embodiment of Light Source>

In general, when an LED is driven, a partial amount of energy driving the LED is emitted as thermal energy. Thus, with a light emitting module employing an LED as a light source, heat dissipation should be considered. The light emitting module can include a heat dissipation unit such as a heat sink, or the like, and a heating problem may be more effectively managed by using one or more LED(s) having low heating values. LEDs including, for example, nano-structures (hereinafter, referred to as 'nano-LED') may be used for this purpose.

Figure 18:
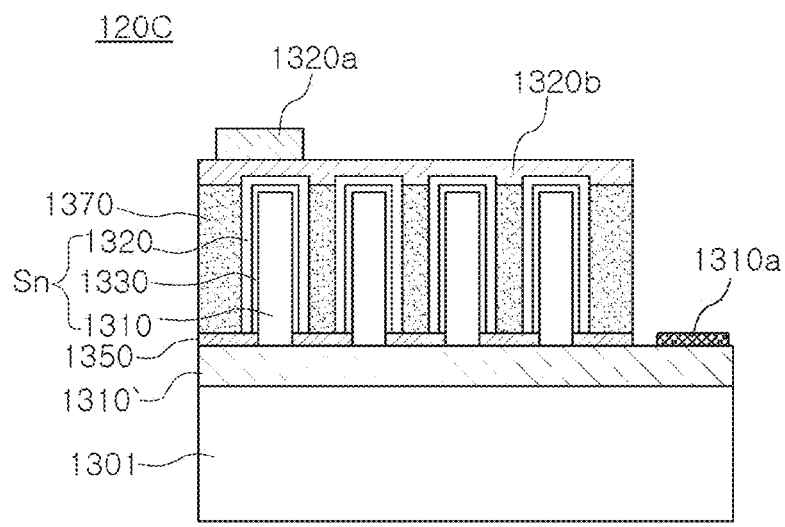

Referring to FIG. 18, an LED 120C includes a plurality of nano light emitting structures Sn formed on a substrate 1301. In the present embodiment, it is illustrated that each nano light emitting structure Sn has a core-shell structure including a rod structure, but the nano-light emitting structure may more generally have a different structure such as a pyramid structure.

The LED 120C includes a base layer 1310' formed on the substrate 1301. The base layer 1310' is a layer providing a growth surface for the nano light emitting structure Sn, and may be formed of a first conductivity-type semiconductor layer. A mask layer 1350 having an open area for the growth of the nano light emitting structure (in particular, a core) may be formed on the base layer 1310'. The mask layer 1350 may be made of a dielectric material such as $SiO_2$ or $SiN_x$.

In the nano light emitting structure Sn, a first conductivity-type nanocore 1310 is formed by selectively growing a first conductivity-type semiconductor through an open area in the mask layer 1350. An active layer 1330 and a second conductivity-type semiconductor layer 1320 are formed as shell layers on a surface of the nanocore 1310. Accordingly, the nano-light emitting structure Sn may have a core-shell structure in which the first conductivity-type semiconductor is the nanocore and the active layer 1330 and the second conductivity-type semiconductor layer 1320 enclosing the nanocore are shell layers.

The LED 120C includes a filler material 1370 filling spaces between the nano-light emitting structures Sn. The filler material 1370 may structurally stabilize the nano-light emitting structures Sn. The filler material 1370 may be made of a transparent material such as $SiO_2$, SiN, or a silicone resin, or a reflective material such as polymer (Nylon), PPA, PCE, silver (Ag), or aluminum (Al). An ohmic-contact layer 1320b may be formed on the nano-light emitting structures Sn and connected to the second conductivity-type semiconductor layer 1320. The LED 120C includes first and second electrodes 1310a and 1320a respectively connected to the base layer 1310' formed of the first conductivity-type semiconductor and to the ohmic-contact layer 1320b.

By forming the nano light emitting structures Sn such that they have different diameters, components, and doping densities, light having two or more different wavelengths may be emitted from a single device. By appropriately adjusting light having different wavelengths, white light may be emitted from the single device without using phosphors, and light having various desired colors or white light having different color temperatures may be emitted by combining the foregoing device with a different LED or wavelength conversion materials such as phosphors.

The LED 120C using the nano light emitting structures Sn has an increased luminous efficiency provided by increasing a light emitting area through the use of the nano-structures. The LED 120C prevents a degradation of efficiency due to polarization by obtaining a non-polar active layer, thus improving drop characteristics.

Meanwhile, as for the LED 120C employed in the light emitting module, LEDs having various structures other than the foregoing LED may be used. For example, an LED in which surface-plasmon polarities (SPP) are formed in a metal-dielectric boundary to interact with quantum well exciton to thus have significantly improved light extraction efficiency may also be advantageously used.

<Fourth Embodiment of Light Source>

Figure 19:
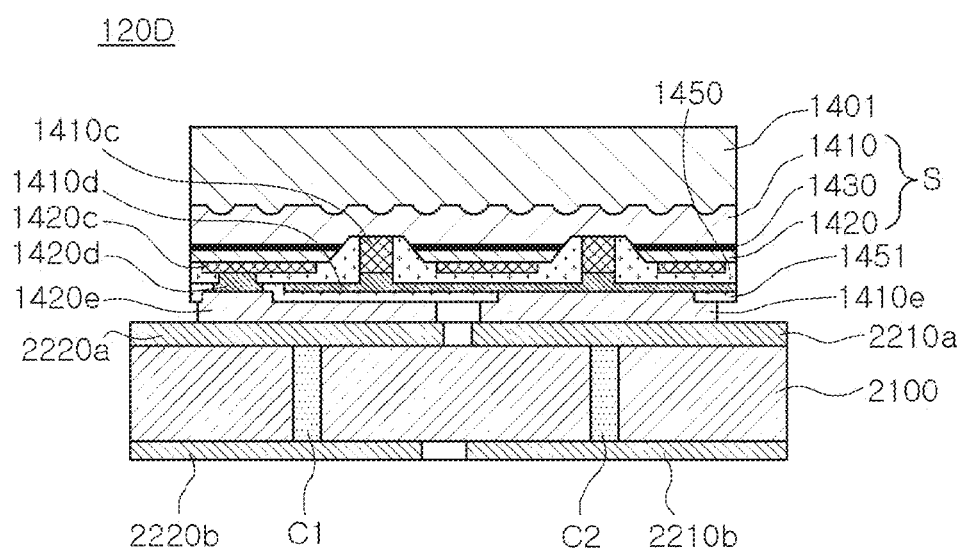

FIG. 19 illustrates an example of a light source employed in a form different from the foregoing example.

Referring to FIG. 19, an LED 120D may include a light emitting laminate S disposed in one surface of a substrate 1401, and first and second electrodes 1410c and 1420c disposed on the light emitting laminate S. The first and second electrodes 1410c and 1420c may be disposed on a side of the light emitting laminate S opposite to the side of the light emitting laminate S contacting the substrate 1401. In addition, the LED 120D may include an insulating unit 1450 covering the first and second electrodes 1410c and 1420c. The first and second electrodes 1410c and 1420c may respectively be electrically connected to first and second electrode pads 1410e and 1420e by respective electrical connection units 1410d and 1420d.

The light emitting laminate S may include a first conductivity-type semiconductor layer 1410, an active layer 1430, and a second conductivity-type semiconductor layer 1420 sequentially disposed on the substrate 1401. The first electrode 1410c may be provided as a conductive via connected to the first conductivity-type semiconductor layer 1410. The first electrode 1410c may include a conductive via extending through the second conductivity-type semiconductor layer 1420 and the active layer 1430. The second electrode 1420c may be connected to the second conductivity-type semiconductor layer 1420.

The insulating layer 1450 has an open area exposing at least portions of the first and second electrodes 1410c and 1420c, and the first and second electrode pads 1410e and 1420e may be respectively connected to the first and second electrodes 1410c and 1420c through the open area of the insulating layer 1450.

The first and second electrodes 1410c and 1420c may be made of a conductive material having ohmic characteristics with respect to the first and second conductivity-type semiconductor layers 1410 and 1420, respectively. The first and second electrodes 1410c and 1420c may have a single layer structure or a multilayer structure. For example, the first and second electrodes 1410c and 1420c may be formed by depositing or sputtering one or more of silver (Ag), aluminum (Al), nickel (Ni), chromium (Cr), a transparent conductive oxide (TCO), and the like. The first and second electrodes 1410c and 1420c may be disposed in the same direction or on a same surface of the light emitting laminate S, such that the light emitting device may be mounted as a so-called flip-chip on a lead frame, or the like, as described hereinafter. In this case, the first and second electrodes 1410c and 1420c may be disposed to face in the same direction.

The first electrode 1410c may have a conductive via V connected to the first conductivity-type semiconductor layer 1410 through the second conductivity-type semiconductor layer 1420 and the active layer 1430 within the light emitting laminate S, and may be electrically connected to a first electrical connection unit 1410d.

The LED 120D may include the second electrode 1420c directly formed on the second conductivity-type semiconductor layer 1420 and a second electrical connection unit 1420d formed on the second electrode 1420c. The second electrode 1420c forms an electrical-ohmic connection with the second conductivity-type semiconductor layer 1420. In addition, the second electrode 1420c may be made of a light reflective material whereby, as illustrated in FIG. 19, in a state in which the LED 120D is mounted as a so-called flip chip structure, light emitted from the active layer 1430 can be reflected on the second electrode 1420c so as to effectively be emitted toward the substrate 1401. The second electrode 1420c may be made of a light-transmissive conductive material such as a transparent conductive oxide, according to a main light emitting direction.

The second electrode 1420c is formed of a material selected on the basis of the second conductivity-type semiconductor layer 1420. For example, the second electrode 1420c can be an ohmic-electrode formed of a laminated Ag layer. The Ag ohmic-electrode also serves as a light reflective layer. A single layer of nickel (Ni), titanium (Ti), platinum (Pt), or tungsten (W) or an alloy layer thereof may be alternately laminated on the Ag layer. In detail, Ni/Ti layers, TiW/Pt layers, or Ti/W layers may be laminated or these layers may be alternately laminated on the Ag layer.

As for the first electrode 1410c, the material and structure of the first electrode 1410c may be selected on the basis of the first conductivity-type semiconductor layer 1410. In one example, a chromium (Cr) layer may be laminated and Au/Pt/Ti layers may be sequentially laminated on the Cr layer, as the first electrode 1410c. In another example, an Al layer may be laminated and Ti/Ni/Au layers may be sequentially laminated on the Al layer, as the first electrode 1410c.

In order to enhance ohmic characteristics or reflecting characteristics, the first and second electrodes 1410c and 1420c may employ various materials or lamination structures other than those of the foregoing embodiments.

The two electrode structures as described above may be electrically separated and insulated from each other by the insulating layer 1450. The insulating layer 1450 may be made of any material as long as it has electrically insulating properties. Preferably, a material having a low degree of light absorption may be used. For example, a silicon oxide or a silicon nitride such as $SiO_2$, $SiO_xN_y$, $Si_xN_y$, or the like, may be used. If necessary, a light reflective filler may be dispersed in the light-transmissive material of the insulating layer 1450 to form a light reflective structure.

The first and second electrode pads 1410e and 1420e may respectively be connected to the first and second electrical connection units 1410d and 1420d to serve as external terminals of the LED 120D. An insulating material layer 1451 may be disposed in partial regions between the first and second electrical connection units 1410d and 1420d and the first and second electrode pads 1410e and 1420e. The first and second electrode pads 1410e and 1420e may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED is mounted on the substrate 1401, the first and second electrode pads 1410e and 1420e may be bonded by using the eutectic metal, so solder bumps generally required for flip chip bonding may not be used. The use of a eutectic metal in the mounting method advantageously provides superior heat dissipation effects in comparison to the use of solder bumps. In this case, in order to obtain excellent heat dissipation effects, the first and second electrode pads 1410e and 1420e may be formed to occupy a relatively large area.

Also, a buffer layer may be formed between the light emitting structure S and the substrate 1401. The buffer layer may be an undoped semiconductor layer made of a nitride, or the like, and employed to alleviate lattice defects in the light emitting structure grown thereon.

In the present embodiment, the substrate 1401 may have first and second main surfaces opposing one another, and an uneven structure (e.g., a depression and protrusion pattern) may be formed on at least one of the first and second main surfaces. The uneven structure formed on one surface of the substrate 1401 may be formed by etching a portion of the substrate 1401. The uneven structure may be made of the same material as that of the substrate 1401. Alternatively, the uneven structure may be made of a heterogeneous material different from that of the substrate 1401.

In the present embodiment, since the uneven structure is formed on the surface of the substrate 1401 that interface with the first conductivity-type semiconductor layer 1410, light emitted from the active layer 1430 may be diverted along a diversity of paths through the first conductivity-type semiconductor layer 1410, the uneven structure, and the substrate 1401. As a result, a light absorption ratio of light absorbed within the semiconductor layer may be reduced and a light scattering ratio may be increased, thereby increasing light extraction efficiency of the LED.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as $SiO_2$, $SiN_x$, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. Materials other than those listed here can also advantageously be used.

In some examples, the substrate 1401 may be removed from the first conductivity-type semiconductor layer 1410. To remove the substrate 1401, a laser lift-off (LLO) process using a laser, an etching process or a polishing process may be used. Also, after the substrate 1401 is removed, depressions and protrusions may be formed on the surface of the first conductivity-type semiconductor layer 1410.

As illustrated in FIG. 19, the LED 120D is mounted on a package body 2100. The package body 2100 may be a semiconductor substrate such as a silicon (Si) substrate, an insulating substrate, or a conductive substrate. Surface electrodes 2210a and 2220a and rear electrodes 2210b and 2220b are formed on upper and lower surfaces of the package body 2100, and conductive vias C1 and C2 are formed to penetrate through the package body 2100 to respectively connect the surface electrodes 2210a and 2220a to the rear electrodes 2210b and 2220b.

In the embodiment of FIG. 19, the LED 120D may uniformly spread current and obtain excellent heat dissipation effects in a chip unit since a contact area between the LED and the package body is increased.

<Fifth Embodiment of Light Source>

Figure 20A:
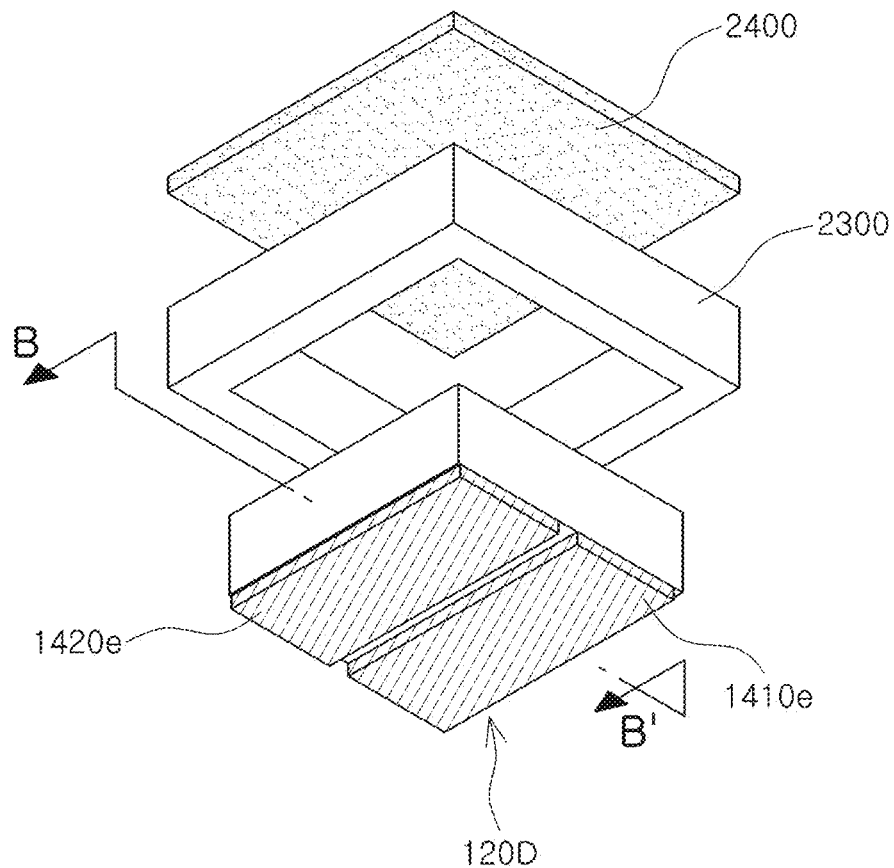
Figure 20B:
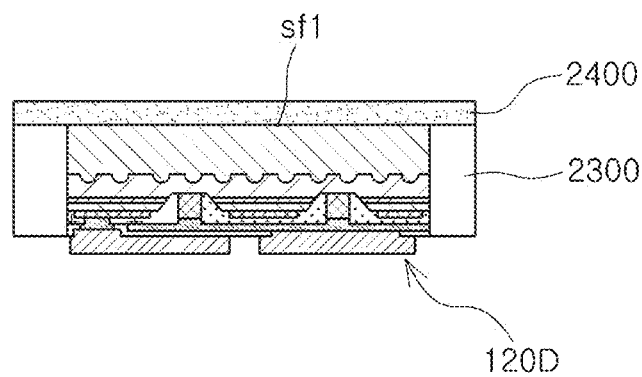

FIG. 20A is a perspective view illustrating a light source according to another embodiment of the inventive concepts. FIG. 20B is a cross-sectional view of the light source of FIG. 20A taken along line B-B'.

Referring to FIGS. 20A and 20B, the light source according to the present embodiment may include an LED 120D, a reflective material layer 2300, and a wavelength conversion film 2400. As the LED 120D, the LED 120D described with reference to FIG. 19 can be used, but the inventive concepts are not limited thereto and other LEDs can alternatively be used.

In the present embodiment, the reflective material layer 2300 may be formed to surround all of the lateral sides of the LED 120D. Thus, light emitted laterally from the sides of the LED 120D may be effectively guided. The reflective material layer 2300 may include a material having a high degree of light reflectivity. Also, the reflective material layer 2300 may include a material having a high degree of heat conductivity to allow heat generated by the LED 120D to be easily dissipated outwardly.

The wavelength conversion film 2400 may be mounted on the reflective material layer 2300 above the LED 120D. The wavelength conversion film 2400 may be excited by light emitted from the LED 120D, and thereby caused to emit wavelength-converted light. For this purpose, the wavelength conversion film 2400 may include a wavelength conversion material. The light source according to the present embodiment may emit white light through a mixture of light emitted from the LED 120D and wavelength-converted light emitted from the wavelength conversion film 2400. However, the inventive concepts are not limited thereto and the light source may be implemented to emit light of a different color (e.g., light other than white light).

The light source according to the present embodiment will be described in detail with reference to FIG. 20B. When the light emitting surface of the LED 120D is a main surface sf1, an upper surface of the reflective material layer 2300 may be coplanar with the main surface sf1. The wavelength conversion film 2400 may be formed on the coplanar surface of the main surface sf1 of the LED 120D and the upper surface of the reflective material layer 2300. In the present embodiment, the wavelength conversion film 2400 may be formed as a thin film having a predetermined thickness and covering the coplanar surface. This structure may be implemented through a process as described hereinafter with reference to FIGS. 21A through 21D.

In the light source according to the present embodiment, by providing the reflective material layer 2300, light emitted laterally from the sides of the LED 120D and moving in an undesired direction may be reduced, and light emitted from the LED 120D may be guided to be output externally through the wavelength conversion film 2400, whereby a light source having a simple structure implementing high quality white light can be obtained.

Hereinafter, a method for manufacturing the light source according to the fifth embodiment will be described with reference to FIGS. 21A through 21D.

Figure 21A:
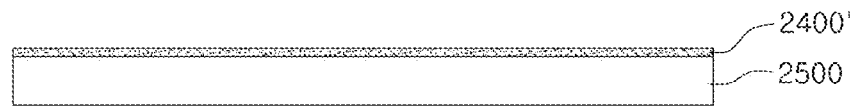

First, as illustrated in FIG. 21A, a resin 2400' containing a wavelength conversion material is formed on a support 2500. The resin 2400' may be cured to form the wavelength conversion film 2400. The resin 2400' may have a predetermined thickness, and this may be understood as completing the wavelength conversion film 2400 having a predetermined thickness.

Figure 21B:
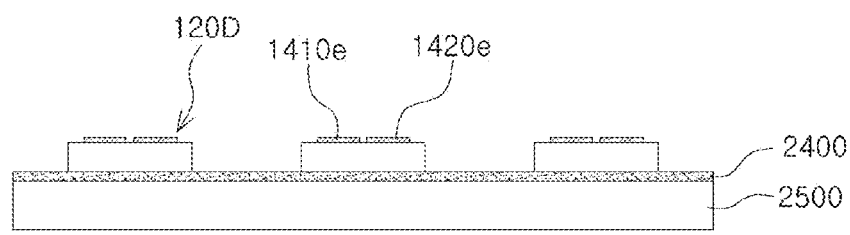

Next, as illustrated in FIG. 21B, a plurality of LEDs 120D are disposed on the wavelength conversion film 2400. The plurality of LEDs 120D may be disposed such that the main surface sf1 as a light emitting surface of the LEDs 120D is placed on the wavelength conversion film 2400. Here, the plurality of LEDs 120D may be disposed to be spaced apart from one another.

Figure 21C:
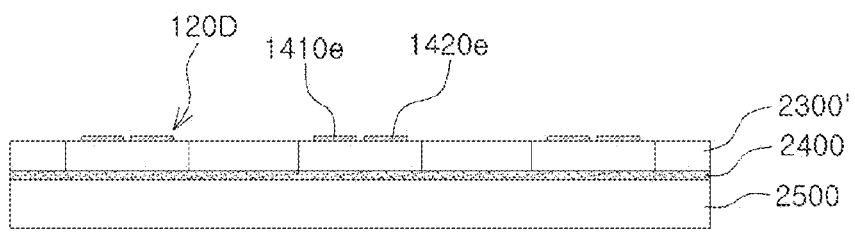
Figure 21D:
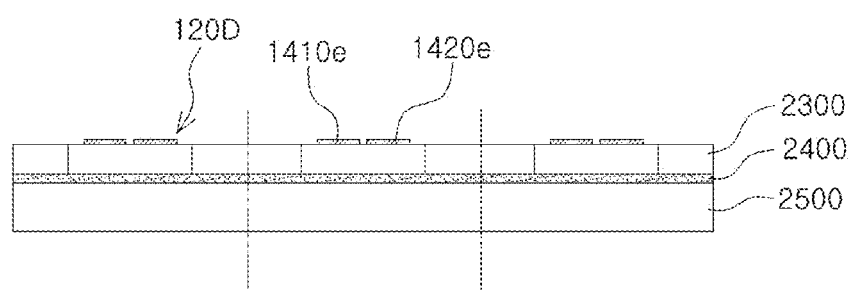

Thereafter, as illustrated in FIG. 21C, a resin 2300' including a light-reflective material is coated on the wavelength conversion film 2400 with the plurality of LEDs 120D disposed thereon. The resin 2300' including the light-reflective material may be cured to form the reflective material layer 2300. Thereafter, portions between the plurality of LEDs 120D as indicated by the dotted lines in FIG. 21D are cut, and the support 2500 is removed to obtain the light source as illustrated in FIGS. 20A and 20B.

According to the present manufacturing process, after the wavelength conversion film 2400 is formed, the LEDs 120D are disposed on the wavelength conversion film 2400 and the reflective material layer 2300 is formed, whereby the structure in which the reflective material layer 2300 surrounds the sides of the LED 120D and is coplanar with the light emitting surface of the LED 120D can be easily implemented.

<Sixth Embodiment of Light Source>

Figure 22:
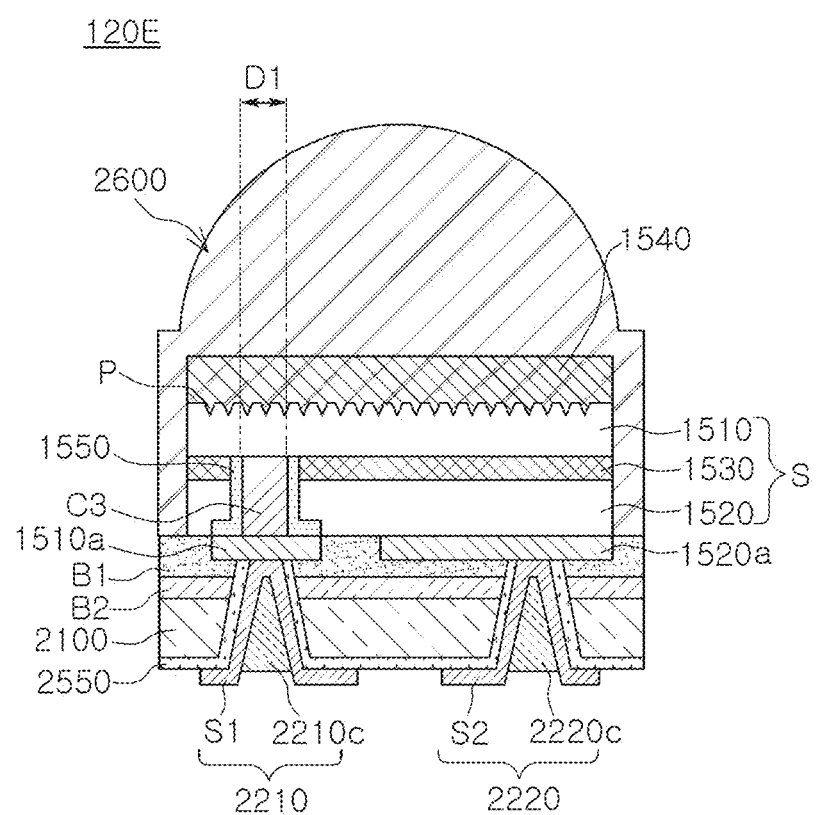

FIG. 22 illustrates an LED implemented as a so-called chip scale package (CSP) according to another embodiment of the present inventive concepts.

In detail, referring to FIG. 22, an LED 120E may include a package body 2100 including first and second electrode structures 2210 and 2220, and a light emitting laminate S and a lens 2600 disposed above the package body 2100. A wavelength conversion layer 1540 may be formed on the light emitting laminate S.

The package body 2100 may be a silicon (Si) substrate, a conductive support substrate, or an insulating support substrate having two or more conductive vias formed therethrough. The conductive vias are connected to a first electrode 1510a and a second electrode 1520a of the light emitting laminate S.

The light emitting laminate S has a lamination structure including first and second conductivity-type semiconductor layers 1510 and 1520 and an active layer 1530 disposed therebetween. In the present embodiment, the first and second conductivity-type semiconductor layers 1510 and 1520 may be p-type and n-type semiconductor layers, respectively, and may be made of a nitride semiconductor, e.g., $In_xAl_yGa_{(1-x-y)}N$ ($0 \leq x \leq 1$, $0 \leq y \leq 1$, $0 \leq x+y \leq 1$). However, besides a nitride semiconductor, a GaAs-based semiconductor or GaP-based semiconductor may also be used.

The active layer 1530 formed between the first and second conductivity-type semiconductor layers 1510 and 1520 may emit light having a predetermined level of energy according to electron-hole recombination, and may have a multi-quantum well (MQW) structure in which quantum well layers and quantum barrier layers are alternately laminated. In the case of the MQW structure, for example, an InGaN/GaN or AlGaN/GaN structure may be used.

Meanwhile, the first and second conductivity-type semiconductor layers 1510 and 1520 and the active layer 1530 may be formed by using a semiconductor growth process such as metal-organic chemical vapor deposition (MOCVD), molecular beam epitaxy (MBE), hydride vapor phase epitaxy (HVPE), or the like.

The LED 120E illustrated in FIG. 22 has had a growth substrate removed therefrom. A depression and protrusion pattern P may optionally be formed on the surface of the first conductivity-type semiconductor layer 1510 from which the growth substrate was removed.

The LED 120E includes the first and second electrodes 1510a and 1520a connected to the first and second conductivity-type semiconductor layers 1510 and 1520, respectively. The first electrode 1510a includes a conductive via C3 connected to the first conductivity-type semiconductor layer 1510 and extending through the second conductivity-type semiconductor layer 1520 and the active layer 1530. An insulating layer 1550 is formed between the conductive via C3 and the active layer 1530 and the second conductivity-type semiconductor layer 1520 to prevent a short circuit.

A single conductive via C3 is illustrated, but two or more conductive vias C3 may be provided and arranged in various patterns of rows and columns on the surface of the light emitting laminate S to promote current spreading.

Similarly to the embodiment of FIG. 19, the composition and structure of the second electrode 1520a may be selected on the basis of the second conductivity-type semiconductor layer 1520. In one example, the second electrode 1520a is an ohmic-electrode formed of an Ag layer that is laminated. The Ag ohmic-electrode also serves as a light reflective layer. A single layer of nickel (Ni), titanium (Ti), platinum (Pt), or tungsten (W) or an alloy layer thereof may be alternately laminated on the Ag layer. In detail, Ni/Ti layers, TiW/Pt layers, or Ti/W layers may be laminated or these layers may be alternately laminated on the Ag layer.

As for the first electrode 1510a, the composition and structure of the first electrode 1510a may be selected on the basis of the first conductivity-type semiconductor layer 1510. For example, a chromium (Cr) layer may be laminated, and Au/Pt layers may be sequentially laminated on the Cr layer, as the first electrode 1510a. In another example, an Al layer may be laminated and Ti/Ni/Au layers may be sequentially laminated on the Al layer as the first electrode 1510a.

In order to enhance ohmic characteristics or reflecting characteristics, the first and second electrodes 1510a and 1520a may employ various materials or lamination structures other than those of the foregoing embodiments.

The package body 2100 and the LED 120E may be bonded to each other by bonding layers B1 and B2. The bonding layers B1 and B2 may be made of an electrically insulating material or an electrically conductive material. For example, the electrically insulating material may include an oxide such as $SiO_2$ and SiN, a resin material such as a silicone resin and an epoxy resin, or the like, and the electrically conductive material may include silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. This process may be implemented by applying the first and second bonding layers B1 and B2 to respective bonding surfaces of the LED 120E and the package body 2100 and subsequently bonding them together.

Two or more contact holes are formed from a lower surface of the package body 2100 so as to each be connected to a respective one of the first and second electrodes 1510a and 1520a of the LED 120E. An insulating layer 2550 may be formed on a lateral surface of each contact hole and on a lower surface of the package body 2100. In a case in which the package body 2100 is a silicon substrate, the insulating layer 2550 may be provided as a silicon oxide film through thermal oxidation. Each contact hole is filled with a conductive material, to form one of the first and second electrodes 2210 and 2220 such that they are respectively connected to the first and second electrodes 1510a and 1520a. The first and second electrode structures 2210 and 2220 may include seed layers S1 and S2 and plating charged units 2210c and 2220c formed through a plating process by using the seed layers S1 and S2.

The chip-scale package (CSP) as described above and as illustrated in FIG. 22 does not require an additional package. The CSP thus provides a package having a reduced size and a simplified manufacturing process appropriate for mass-production. In addition, since an optical structure such as a lens can be integrally manufactured, the CSP can be appropriately employed in the light emitting module according to the present embodiment.

Meanwhile, light finally or eventually generated by the light emitting module may be white light. However, the present inventive concepts are not limited thereto, and the light emitting module may emit visible light, infrared light, or ultraviolet light, besides white light.

Hereinafter, embodiments of white light implementation by the light emitting module 100 according to the present inventive concept will be described.

<First Embodiment of White Light Implementation: Combination of Phosphors>

In order for the light emitting module 100 to emit white light, for example, the light emitting module 100 may be implemented such that a light source according to the present embodiment includes a blue LED and a wavelength conversion unit having wavelength conversion materials emitting wavelength-converted light upon being directly or indirectly excited by light output from the blue LED. Here, white light may be a mixture color of light from the blue LED and light from the wavelength conversion unit. For example, white light may be implemented by combining a yellow phosphor to the blue LED, or by combining at least one of yellow, red, and green phosphors to the blue LED. Also, the wavelength conversion unit may be provided in units of LED chips.

Meanwhile, phosphors used in the light emitting module may have the following empirical formulas and colors.

In case of oxide-based phosphors, yellow and green phosphors may include a composition of (Y, Lu, Se, La, Gd, Sm)$_3$(Ga, Al)$_5$O$_{12}$:Ce. A blue phosphor may include a composition of BaMgAl$_{10}$O$_{17}$:Eu, 3Sr$_3$(PO$_4$)$_2$.CaCl:Eu.

In case of silicate-based phosphors, yellow and green phosphors may include a composition of (Ba, Sr)$_2$SiO$_4$:Eu, and yellow and orange phosphors may include a composition of (Ba, Sr)$_3$SiO$_5$:Eu.

In case of nitride-based phosphors, a green phosphor may include a composition of β-SiAlON:Eu, a yellow phosphor may include a composition of (La, Gd, Lu, Y, Sc)$_3$Si$_6$N$_{11}$:Ce, and an orange phosphor may include a composition of α-SiAlON:Eu. A red phosphor may include at least one of compositions of (Sr, Ca)AlSiN$_3$:Eu, (Sr, Ca)AlSi(ON)$_3$:Eu, (Sr, Ca)$_2$Si$_5$N$_8$:Eu, (Sr, Ca)$_2$Si$_5$(ON)$_8$:Eu, and (Sr, Ba)SiAl$_4$N$_7$:Eu.

In case of sulfide-based phosphors, a red phosphor may include a composition of at least one of (Sr, Ca)S:Eu and (Y, Gd)$_2$O$_2$S:Eu, and a green phosphor may include a composition of SrGa$_2$S$_4$:Eu.

In case of fluoride-based phosphors, a red phosphor may include a composition of K$_2$SiF$_6$:Mn$^{4+}$.

Table 1 below shows types of phosphors in applications fields of a light emitting module using a blue LED (wavelength: 440 nm to 460 nm).

TABLE 1

| Purpose | Phosphors |
|---|---|
| LED TV BLU | β-SiAlON:Eu$^{2+}$ |
| | (Ca, Sr)AlSiN$_3$:Eu$^{2+}$ |
| | L$_3$Si$_6$O$_{11}$:Ce$^{3+}$ |
| | K$_2$SiF$_6$:Mn$^{4+}$ |
| Lighting | Lu$_3$Al$_5$O$_{12}$:Ce$^{3+}$ |
| | Ca-α-SiAlON:Eu$^{2+}$ |
| | L$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | K$_2$SiF$_6$:Mn$^{4+}$ |
| Side View (Mobile, Note PC) | Lu$_3$Al$_5$O$_{12}$:Ce$^{3+}$ |
| | Ca-α-SiAlON:Eu$^{2+}$ |
| | L$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | (Sr, Ba, Ca, Mg)$_2$SiO$_4$ |
| | K$_2$SiF$_6$:Mn$^{4+}$ |
| Electrical Components (Head Lamp, etc.) | Lu$_3$Al$_5$O$_{12}$:Ce$^{3+}$ |
| | Ca-α-SiAlON:Eu$^{2+}$ |
| | L$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | K$_2$SiF$_6$:Mn$^{4+}$ |

Phosphor compositions should basically conform with Stoichiometry, and respective elements may be substituted with different elements of respective groups of a periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone or a co-activator, or the like, may be additionally applied to change characteristics.

Also, in implementing white light, the light source does not necessarily emit visible light. For example, the LED may generate UV light and at least one of blue, red, green, and yellow phosphors may be combined therewith to implement white light.

<Second Embodiment of White Light Implementation: Combination of Plurality of Light Sources>

When the light emitting module 100 includes a plurality of light sources 120, different light sources among the plurality of light sources may emit light having different wavelengths. For example, white light may be implemented by combining a red light source, a green light source, and a blue light source, for example.

Figure 23:
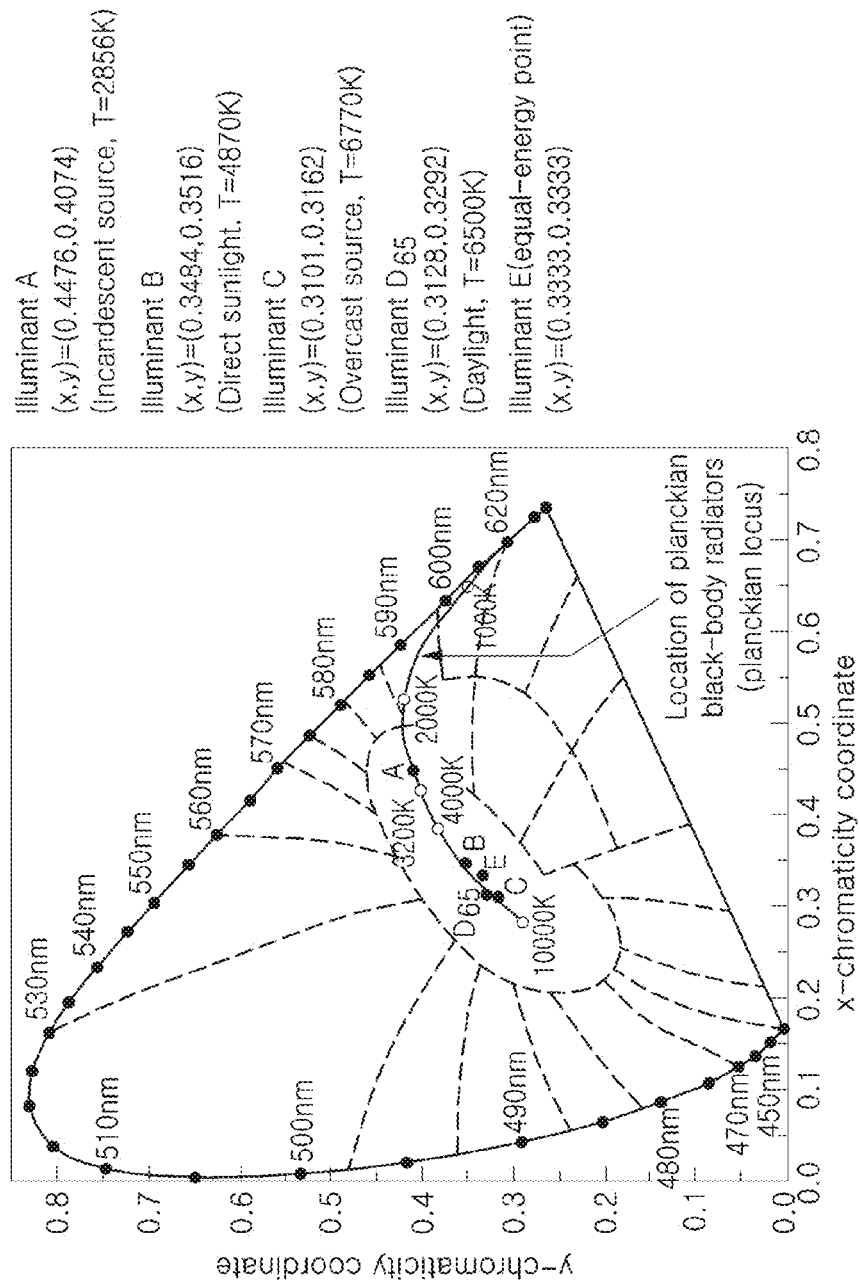
FIG. 23 illustrates the Planckian spectrum.

White light can be generated by applying yellow, green, red phosphors to a blue light source (e.g., a blue LED chip) and combining at least one of a green light source (e.g., a green LED chip) and a red light source (e.g., a red LED chip) thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram such as the diagram shown in FIG. 23. Alternatively, white light may be positioned in a region surrounded by a spectrum of black body radiation and the segment. A color temperature of white light corresponds to a range from about 2000K to about 20000K. FIG. 23 illustrates the Planckian spectrum.

In this case, the light emitting module may control a color rendering index (CRI) to range from the CRI of a sodium-vapor lamp to the CRI of a sunlight level by adjusting a mixture of phosphors and LEDs, and control a color temperature ranging from 2000K to 20000K level to generate various levels of white light.

If necessary, the light emitting module may generate visible light having purple, blue, green, red, orange colors, or infrared light to control an illumination color according to a surrounding atmosphere or mood. Also, the light emitting module may be applied to generate light having a special wavelength stimulating plant growth.

<Third Embodiment of White Light Implementation: Quantum Dot>

Materials such as quantum dots, or the like, may be applied as materials that replace phosphors, and phosphors and quantum dots may be used in combination or alone in the light source 120.

Figure 24:
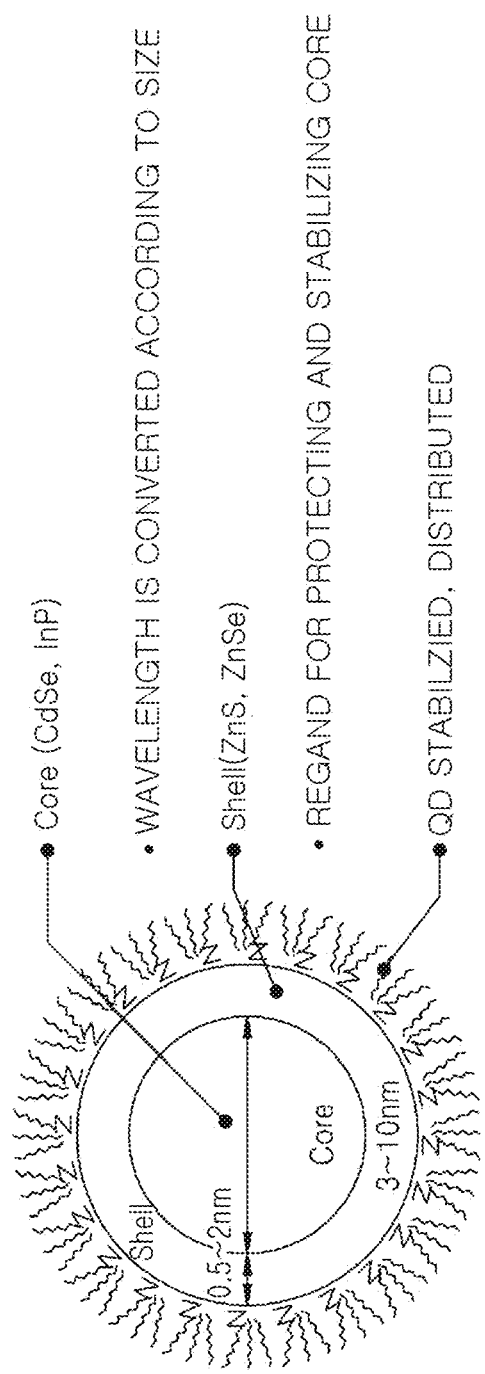
FIG. 24 is a cross-sectional view illustrating a structure of a quantum dot.

A quantum dot may have a structure including a core (3 to 10 nm) such as CdSe, InP, or the like, a shell (0.5 to 2 nm) such as ZnS, ZnSe, or the like, and a regand for stabilizing the core and the shell, and may implement various colors according to sizes. FIG. 24 is a view illustrating a structure of a quantum dot (QD) as described above.

Phosphors or quantum dots may be applied to the light emitting module 100 including the plurality of light sources 120 by using at least one of a method of spraying them thereon, a method of covering as a film, and a method of attaching as a sheet of ceramic phosphor, or the like.

As the spraying method, dispensing, spray coating, or the like, is generally used, and dispensing includes a pneumatic method and a mechanical method such as screw, linear type, or the like. Through a jetting method, an amount of dotting may be controlled through a very small amount of discharging and color coordinates may be controlled therethrough. In case of a method of collectively applying phosphors to the light sources on a wafer level or to a region in which the light sources are mounted, productivity may be enhanced and thickness control may be facilitated.

The method of directly covering the light source substrate 110 or the light source 120 with a film of phosphors or quantum dots may include electrophoresis, screen printing, or a phosphor molding method, and these methods may be appropriately selected according to whether a lateral surface of the light source is required to be coated or not.

Meanwhile, in order to control efficiency of a long wavelength light emitting phosphor re-absorbing light emitted in a short wavelength, of two types of phosphors having different light emitting wavelengths, two types of phosphor layers having different light emitting wavelengths may be provided, and in order to minimize re-absorption and interference of the light sources 120 and two types of phosphor layers, a distributed Bragg reflector (DBR) (e.g., an optical diffraction radiation (ODR)) layer may be included between respective layers.

The phosphors or quantum dots are provided to form a uniform coated film, for example after a phosphor is fabricated as a film or a ceramic form and attached to the light source 120.

In order to differentiate light efficiency and light distribution characteristics, a light conversion material may be positioned in a remote form (e.g., the light conversion material can be positioned to as to be spaced away from the light source), and in this case, the light conversion material may be positioned together with a material such as a light-transmissive polymer, glass, or the like, according to durability and heat resistance.

A phosphor applying technique plays a very important role in determining light characteristics in the light emitting module 100, so techniques of controlling a thickness of a phosphor application layer, uniform phosphor distribution, and the like, can advantageously be used. Quantum dots may also be positioned in the light source 120 in the same manner as that of phosphors, and may be positioned in glass or light-transmissive polymer material to perform optical conversion.

Meanwhile, in a case in which an LED is employed as the light source 120, a light-transmissive material may be positioned as a filter on the LED in order to protect the LED from an external environment or in order to improve light extraction efficiency of light emitted outwardly from the LED.

In this case, a transparent organic solvent such as epoxy, silicone, a hybrid of epoxy and silicone, or the like, may be used as a light-transmissive material, and the light-transmissive material may be cured according to heating, light irradiation, a time-lapse method, or the like.

In case of silicone, polydimethyl siloxane is classified as a methyl-based silicone and polymethylphenyl siloxane is classified as a phenyl-based silicone. The methyl-based silicone and the phenyl-based silicone have differences in refractive indexes, water vapor transmission rates, light transmittance amounts, light fastness qualities, and thermostability. Also, the methyl-based silicone and the phenyl-based silicone have differences in curing speeds according to a cross linker and a catalyst, affecting phosphor distribution.

Light extraction efficiency varies according to a refractive index of a filler, and in order to minimize a gap between a refractive index of the outermost medium from which light is emitted and a refractive index of the outside (air), two or more types of silicone having different refractive indices may be sequentially laminated.

In general, the methyl-based silicone has the highest level of thermostability, and variations in a temperature increase are reduced in order of phenyl-based silicone, hybrid silicone, and epoxy silicone. Silicone may be classified as a gel type silicone, an elastomer type silicone, and a resin type silicone according to the degree of hardness thereof.

Also, the light source may further include a lens for radially guiding light irradiated therefrom. In this case, a method of attaching a previously formed lens to the light source, a method of injecting an organic solvent having fluidity to the light source or to a mold and solidify the same, and the like, may be used. As the injecting method with the use of a mold, injection molding, transfer molding, compression molding, or the like, may be used.

Light transmission characteristics may be changed according to shapes of lenses (concave, convex, uneven, conical, and geometrical structures), and lenses may be deformed according to provide desired efficiency and light distribution characteristics.

Figure 25:
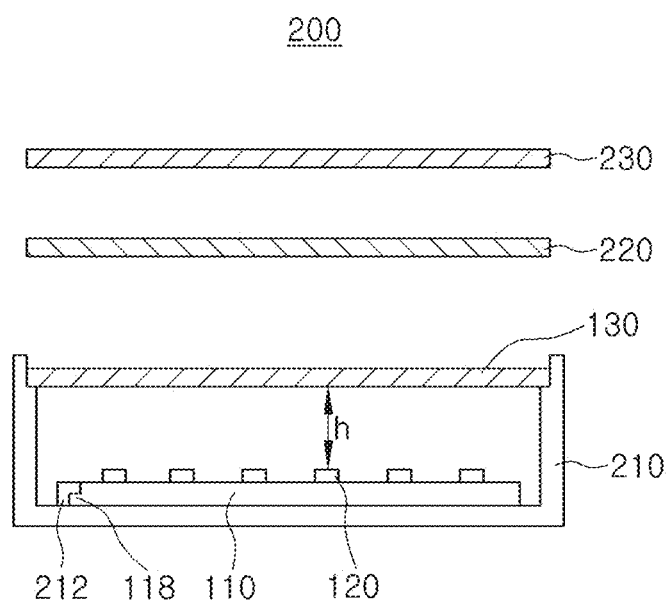
FIG. 25 is a cross-sectional view illustrating a surface lighting device according to an embodiment of the present inventive concepts.

FIG. 25 is a schematic cross-sectional view of a surface lighting device according to an embodiment of the inventive concepts.

With reference to FIG. 25 along with FIG. 1, a surface lighting device 200 according to the present embodiment may include a base part 210 and the light emitting module 100 safely mounted on the base part 210.

The light emitting module may include the light source substrate 110 including the spine part 112 and the at least one branch part 114 extending laterally from a side surface of the spine part 112, the plurality of light sources 120 disposed on the light source substrate 110, and the diffusion plate 130 disposed in a path of light emitted from the plurality of light sources 120. The plurality of light sources 120 may be disposed in a pattern of repeated diamond shapes each having four vertices, with respective light sources 120 disposed in vertex positions of the diamond shapes while having no light source in the interior of the diamond shapes.

In addition, the plurality of light sources 120 may be arrayed to satisfy a 1:1 to 1:1.5 ratio of lengths of two diagonal lines of the diamond shapes. The plurality of light sources 120 and the diffusion plate 130 may be disposed to satisfy the following formula:

$$0.8 \leq -0.0592MH^4 + 0.4979MH^3 - 1.5269MH^2 + 1.9902MH - 0.0888$$

$$MH = \left( \frac{\text{Distance } (h) \text{ between plurality of light sources and diffusion plate}}{\text{Greater line length between two diagonal lines } (x, y) \text{ of diamond shape}} \right)$$

and/or the formula:

$$1 \leq MH \leq 3.$$

The surface lighting device 200 may include a light collecting sheet 220 disposed above the diffusion plate 130 and collecting light incident thereinto in a vertical direction, and may also further include a protective sheet 230 disposed on the light collecting sheet 220 to protect an optical structure disposed therebelow.

In the present embodiment, the base part 210 and the light source substrate 110 mounted on the base part 210 are fixed to each other by the hook 212 and the hook part 118 fastened to each other, but the inventive concepts are not limited thereto. That is, a screw fastening scheme using a through hole 116, formed in the light source substrate 110, may be used for screw fastening. In addition, the base part 210 and the light source substrate 110 may be fixed to each other by applying the hook fastening scheme to one side of the light source substrate 110, and applying the screw fastening scheme to the other side thereof.

Figure 26:
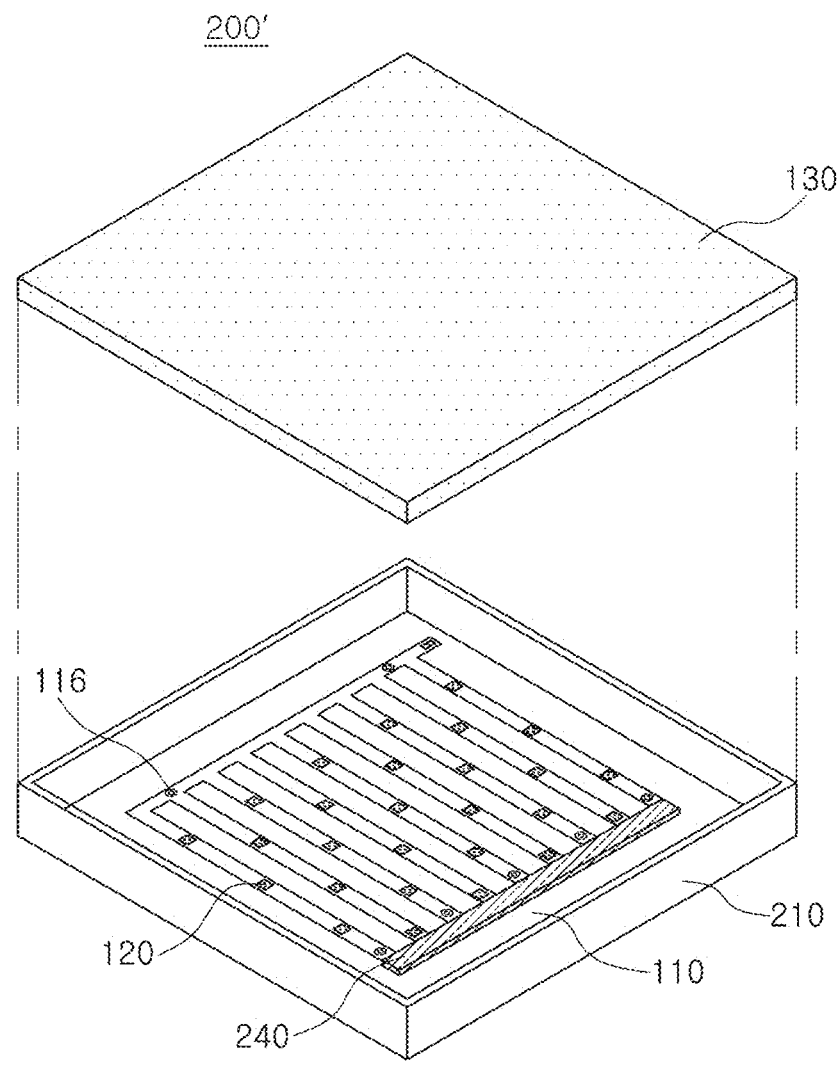
FIG. 26 is a perspective view illustrating a fastening structure of a surface lighting device according to another embodiment of the present inventive concepts.

FIG. 26 is a perspective view of a surface lighting device according to another embodiment of the inventive concepts.

With reference to FIG. 26 along with FIG. 1, a surface lighting device 200' according to the present embodiment may include a fixing bar 240 fixing the base part 210 and the light source substrate 110 to each other.

The fixing bar 240 may be disposed to cover a portion of the light source substrate 110 on which the light sources 120 are not located. As shown in FIG. 26, the fixing bar 240 may be disposed to cover a portion of the at least one branch part 114, such as an end portion of the at least one branch part 114 that is located distally from the spine part 112. However, the fixing bar 240 may also be disposed to cover a portion of the spine part 112.

Figure 27A:
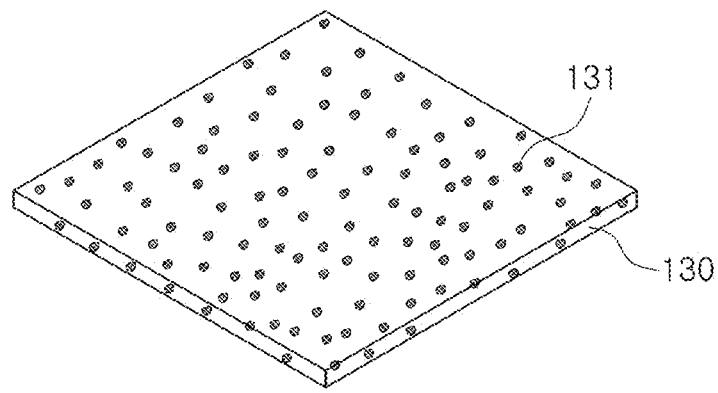
FIGS. 27A through 27C are views illustrating examples of diffusion plates employable in a surface lighting device according to embodiments of the present inventive concepts.
Figure 27B:
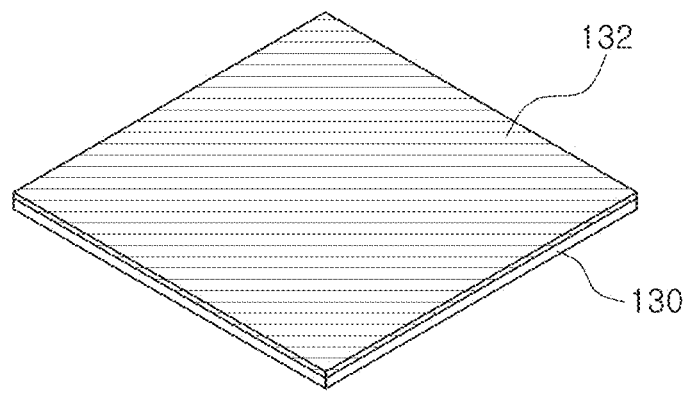
Figure 27C:
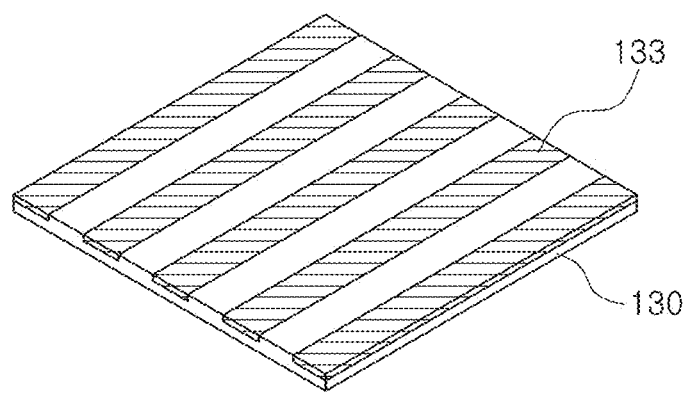

FIGS. 27A through 27C are views illustrating examples of the diffusion plate 130 employable in the surface lighting device 200 according to an embodiment of the inventive concepts.

First, referring to FIG. 27A, the diffusion plate 130 serves to increase a color rendering index (CRI) value of light output from a light source and passing therethrough. The diffusion plate 130 may be formed to have red phosphors 131 dispersed therein.

Also, as illustrated in FIG. 27B, the diffusion plate 130 may have a structure including a red phosphor material thin film 132 disposed on at least one surface thereof. The red phosphor material thin film 132 may be formed by using a sheet made of a red phosphor material, or by coating a red phosphor material on the diffusion plate 130. In order to obtain a better effect, the red phosphor material thin film 132 may be provided on both surfaces of the diffusion plate 130, but the inventive concepts are not limited thereto.

Alternatively, as illustrated in FIG. 27C, the diffusion plate 120 may be formed to have a structure including a red phosphor material thin film 133 formed discontinuously (e.g., as stripes) on at least one surface thereof.

According to the present embodiment, it was confirmed that in a case in which white light having a CRI value equal to approximately 64 and a color temperature (CCT) equal to approximately 5570 k was output from a plurality of light sources, when the white light passed through the diffusion plate including a red phosphor material, it had a CRI value equal to approximately 78 and a color temperature (CCT) equal to approximately 3080K.

Figure 28:
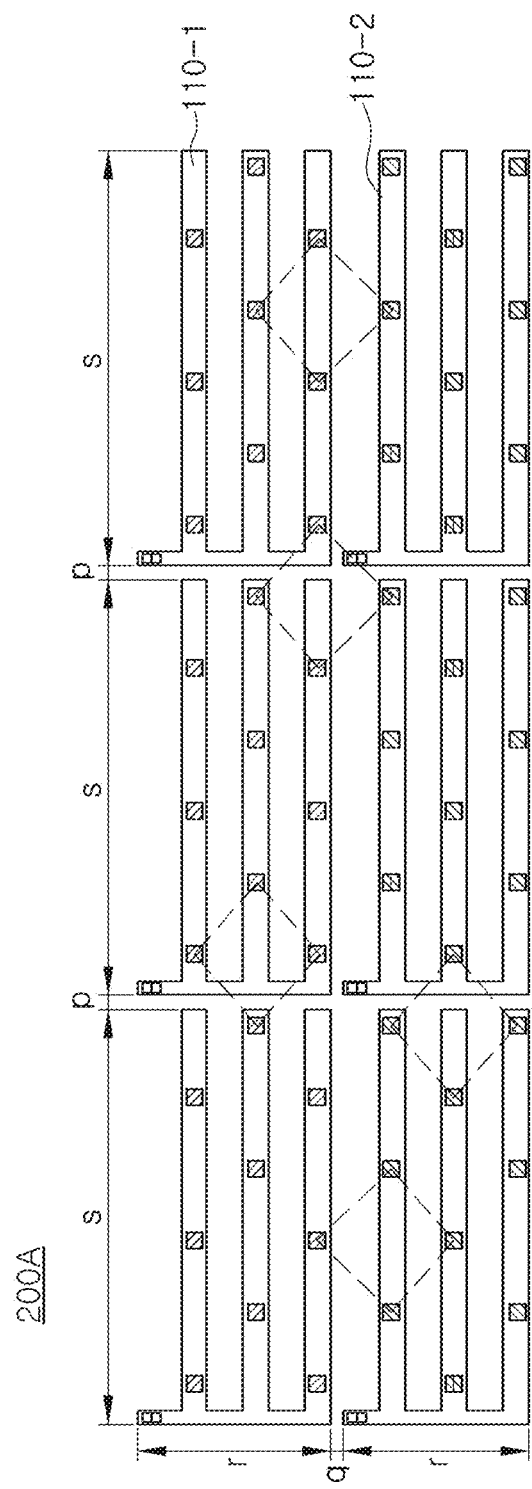
FIGS. 28 through 32 are views illustrating surface lighting devices according to other embodiments of the present inventive concepts.

FIG. 28 is a schematic plan view of a surface lighting device according to another embodiment of the inventive concepts. In order to clearly illustrate the present embodiment, only light source substrates are illustrated in FIG. 28 while other elements (e.g., a base part on which the light source substrates are disposed) are omitted.

Referring to FIG. 28, a surface lighting device 200A according to the present embodiment may include a plurality of light source substrates 110-1 and 110-2 disposed to be adjacent to each other. As shown, the light source substrates can be disposed such that light sources 120 of adjacent light source substrates satisfy the conditions for a regular repeated arrangement (e.g., the repeated arrangement condition whereby light sources 120 are disposed according to a regular diamond shaped pattern). In particular, the light sources 120 may satisfy the condition whereby a ratio between the lengths x, y of the two diagonal lines of the diamond shaped pattern remains within a specified interval, and may satisfy the dispositional relationship formula with respect to spacing h to the diffusion plate 130 from each of the light source substrates 110-1 and 110-2. The lengths x, y may be measured between centers of light sources disposed at apexes of the diamond shaped pattern.

Namely, the condition for the arrangement of the light sources 120 disposed on each of the light source substrates 110-1 and 110-2, in particular the condition for the ratio between the lengths of the two diagonal lines of the diamond shaped pattern and the condition for the dispositional relationship formula with respect to the spacing to the diffusion plate 130 satisfied between the plurality of light sources 120 disposed in each of the light source substrates 110-1 and 110-2, are also satisfied between the plurality of light source substrates 110-1 and 110-2.

In detail, when an array of the plurality of light sources 120 disposed on the light source substrates 110-1 and 110-2 separated from a single mother substrate are defined as a matrix M1 and a matrix M2, the matrices M1 and M2 may be represented as follows:

$$M1 = \begin{pmatrix} 1 & 0 & 1 & 0 & 1 & 0 \\ 0 & 1 & 0 & 1 & 0 & 1 \\ 1 & 0 & 1 & 0 & 1 & 0 \end{pmatrix},$$

$$M2 = \begin{pmatrix} 0 & 1 & 0 & 1 & 0 & 1 \\ 1 & 0 & 1 & 0 & 1 & 0 \\ 0 & 1 & 0 & 1 & 0 & 1 \end{pmatrix}$$

In this manner, when the number of light sources 120 disposed in a first column and the amount of the light sources 120 disposed in the last column are set to be different in each of the matrices M1 and M2, the respective conditions (the arrangement of light sources, the ratio between the lengths of the two diagonal lines of the diamond shape, and the dispositional relationship formula with respect to the diffusion plate) may be easily satisfied in disposing the plurality of light source substrates 110-1 and 110-2.

Namely, the plurality of light source substrates 110-1 and 110-2 installed on the base part 210 may be disposed to form a matrix $$T = \begin{pmatrix} M1 & M1 & M1 \\ M2 & M2 & M2 \end{pmatrix},$$

and all of the plurality of light sources 120 disposed in the matrix T may satisfy the condition (i.e., the repeated arrangement condition having a diamond pattern) for the arrangement of the light sources 120, the condition for the ratio between the lengths of the two diagonal lines of the diamond shape, and the dispositional relationship formula with respect to the diffusion plate 130 satisfied in each of the light source substrates 110-1 and 110-2. Furthermore, the spacing between and alignment of adjacent light source substrates 110-1 and 110-2 can be set to respect each of the conditions.

In this manner, the provision of the plurality of light source substrates 110-1 and 110-2 is advantageous for heat dissipation and the plurality of light source substrates 110-1 and 110-2 can be protected from damage due to an impact, relative to the use of a single large light source substrate.

Also, in the present embodiment, as compared to a case in which when a single large light source substrate is implemented, a required area thereof is $$\frac{(2r+q)\cdot(3s+2p)}{2},$$

in the case in which the plurality of light source substrates 110-1 and 110-2 are implemented, a required area thereof is 3rs, and thus, the area can be effectively reduced.

FIG. 29 is a plan view schematically illustrating a surface lighting device according to another embodiment of the inventive concepts. In order to clarify the present embodiment, only light source substrates are illustrated and other components are omitted in FIG. 29.

Referring to FIG. 29, a surface lighting device 200B according to the present embodiment may include a plurality of light source substrates 110-6-1 to 110-6-4. The light source substrates may each be a light source substrate such as light source substrate 110-6 illustrated in FIG. 4, for example, but the inventive concepts are not limited thereto.

When a light source substrate disposed in a right upper portion is a first light source substrate 110-6-1, second to fourth light source substrates 110-6-2 to 110-6-4 are disposed in a clockwise direction on the basis of the first light source substrate 110-6-1. The number of light source substrates according to the present embodiment is not limited to four, and the number n (n is a natural number equal to or greater than 3) of light source substrates may be disposed in a clockwise direction on the basis of the first light source substrate 110-6-1.

In the present embodiment, the first to fourth light source substrates 110-6-1 to 110-6-4 may include connector parts 140. The connector part 140 included in the first light source substrate 110-6-1 may be disposed to be adjacent to one vertex of the first light source substrate 110-6-1. In this case, the vertex of the first light source substrate 110-6-1 corresponds to a central point of the square formed by the first to fourth light source substrates 110-6-1 to 110-6-4, namely, the entire surface lighting device.

Here, 'adjacency' may be understood such that the connector part 140 is disposed to be nearest to a particular vertex among four vertices of the first light source substrate 110-6-1, and the particular vertex is a rotational center point of the second to fourth light source substrates 110-6-2 to 110-6-4.

The second to fourth light source substrates 110-6-2 to 110-6-4 are disposed with respect to the first light source substrate 110-6-1 so as to be sequentially rotated at an angle of 90° on the basis of the rotational center point as an axis. Namely, the second light source substrate 110-6-2 is disposed such that the plurality of light sources 120 and the connector part 140 included in the second light source substrate 110-6-2 are rotated by 90° in the clockwise direction with respect to the corresponding plurality of light sources 120 and connector part 140 included in the first light source substrate 110-6-1. Similarly, the third light source substrate 110-6-3 is disposed such that the plurality of light sources 120 and the connector part 140 included in the third light source substrate 110-6-3 are rotated by 90° in the clockwise direction with respect to the corresponding plurality of light sources 120 and connector part 140 included in the second light source substrate 110-6-2. The fourth light source substrate 110-6-4 may be disposed in the same manner. The rotation disposition scheme may not necessarily follow the clockwise direction, and obviously, the first to fourth light source substrates 110-6-1 to 110-6-4 may be disposed and/or rotated in a counterclockwise direction.

In the present embodiment, the connector parts 140 included in the respective first to fourth light source substrates 110-6-1 to 110-6-4 are disposed to be adjacent to the central point of the square formed by the first to fourth light source substrates 110-6-1 to 110-6-4 and to be significantly close to each other. Thus, a wiring structure for power connection may be simplified.

In the present embodiment, the light sources located proximate to adjacent light source substrates among the plurality of light source substrates 110-6-1 to 110-6-4 may satisfy the conditions for the arrangement of the light sources (i.e., the repeated arrangement condition having a diamond pattern, the condition for the ratio between the lengths of the two diagonal lines of the diamond shape, and the dispositional relationship formula with respect to the diffusion plate in each of the light source substrates satisfied in each of the light source substrates).

Namely, the conditions for the arrangement of the light sources between the plurality of light sources disposed on the light source substrates, the condition for the ratio between the lengths of the two diagonal lines of the diamond shaped pattern, and the dispositional relationship formula with respect to the diffusion plate satisfied between the plurality of light sources disposed in each of the light source substrates are also satisfied between the plurality of light source substrates. In this case, optical quality may be further enhanced.

Figure 30:
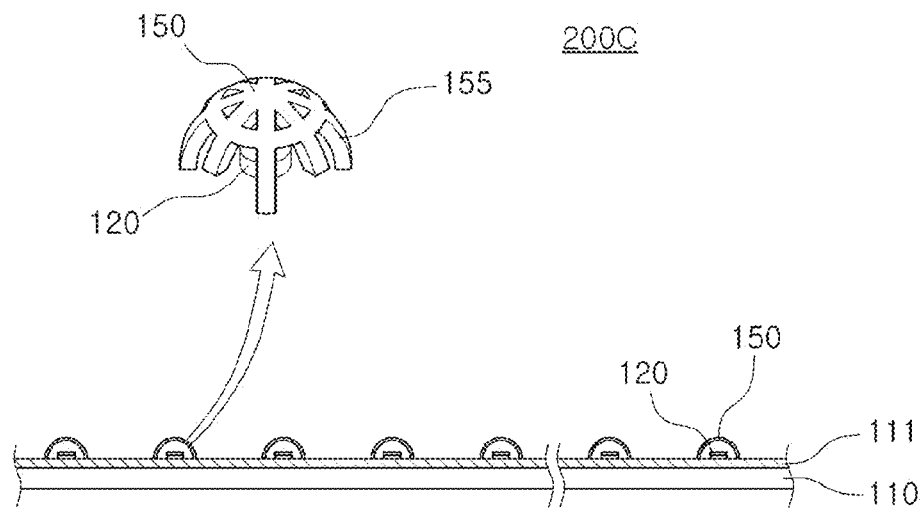

FIG. 30 is a cross-sectional view schematically illustrating a surface lighting device according to another embodiment of the inventive concepts. In order to clarify the present embodiment, only a light source substrate is illustrated and other components are limited in FIG. 30. Also, for clarification, a description of portions applicable in the same manner as that of the former embodiments will be omitted and different portions will be mainly described.

Referring to FIG. 30, a surface lighting device 200C according to the present embodiment may include a plurality of first reflective parts 150 each disposed above one of the plurality of light sources 120, and a second reflective part 111. Each first reflective part 150 may be formed with respect to a corresponding one of the individual light sources 120 disposed on the light source substrate 110. The second reflective part 111 may be formed on the surface of the light source substrate 110. The second reflective part 111 may be provided in the form of a sheet, but is not limited thereto.

The first reflective part 150 may be formed to have a curved surface encompassing the light source 120, and include openings 155 allowing light generated by the light source 120 and light reflected from the first reflective part 150 to pass therethrough.

Namely, since light generated by the light source 120 has a directivity and intensity focused in an upward direction from the light source 120, light emitted upwards is stronger than light emitted in a sideways direction from the light source 120. The first reflective part 150 is thus formed above the light source 120 to reflect light to the second reflective part 111. Accordingly, light immediately above the light source 120 may be more uniformly distributed or dispersed through the first reflective part 150.

Here, the openings 155 allow light generated by the light source 120 and light reflected from the first reflective part 150 to pass therethrough, and light reflected from the second reflective part 111 may also pass through the openings 155.

Also, as illustrated in FIG. 30, sizes of the openings 155 may be decreased as they increase in distance from the light source substrate 110. Since the openings 155 allow light generated by the light source 120 and light reflected from the first reflective part 150 and the second reflective part 111 to pass therethrough, openings 155 located along the sides of the light source 120 may be larger and openings 155 located immediately above the light source 120 may be smaller. As a result, in the case in which light generated by the light source 120 has an upward directivity, the openings 155 may not be formed immediately above the light source 120.

Also, light reflected from the first reflective part 150 may be reflected from the second reflective part 111 formed on the light source substrate 110. Since the second reflective part 111 is formed on the light source substrate 110, light generated by the light source 120 is reflected from the first reflective part 150 and subsequently reflected from the second reflective part 111. Accordingly, by means of the first reflective part 150 and the second reflective part 111, light emitted by the light source 120 can be more uniformly distributed and emitted outwardly from the light source substrate 110, thus securing more uniform luminance.

Figure 31A:
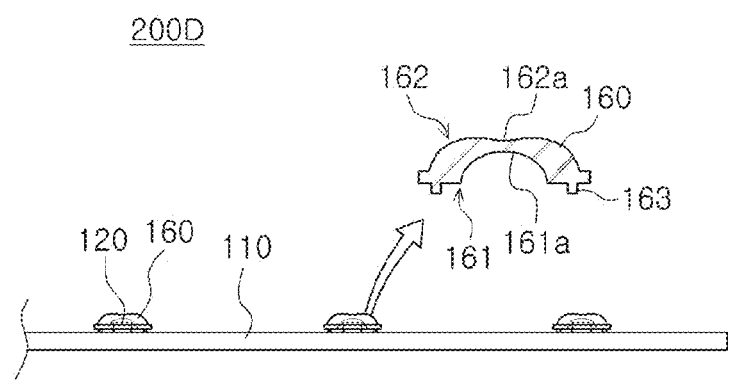
Figure 31B:
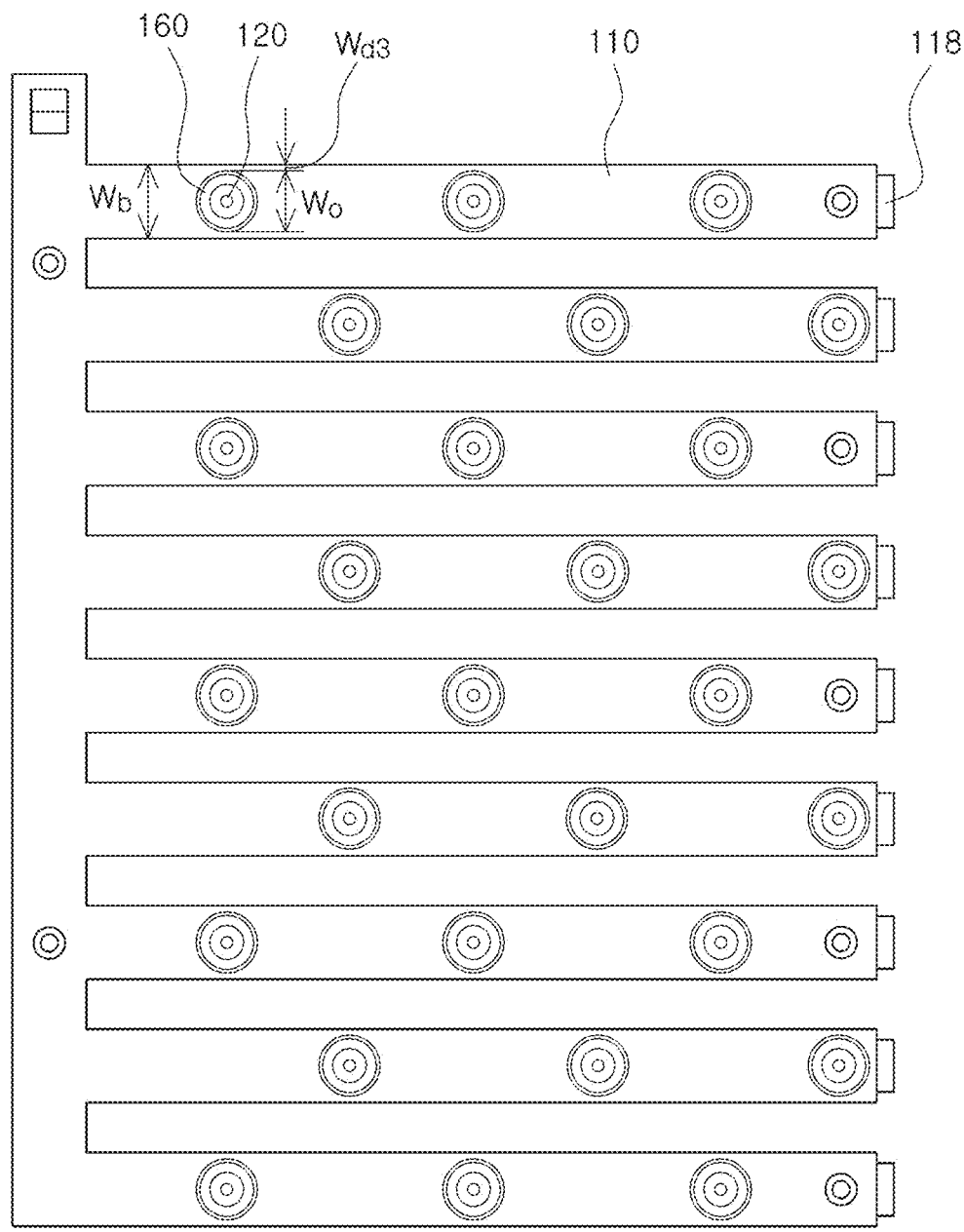

FIGS. 31A and 31B are a cross-sectional view and a top view, respectively, schematically illustrating a surface lighting device according to another embodiment of the inventive concepts. In FIGS. 31A and 31B, only a light source substrate is illustrated and other components are omitted from the figure for clarity.

Referring to FIGS. 31A and 31B, a surface lighting device 200D according to the present embodiment may include a plurality of optical members 160, such as lenses, disposed on the light source substrate 110. Each optical member 160 includes an internal curved surface 161 forming a recess portion 161a to accommodate the light source 120 and an external curved surface 162 as a surface opposite to the internal curved surface 161.

A material of the optical member 160 or lens is not particularly limited as long as it is light-transmissive, and an insulating resin having transparency such as a silicon resin composition, a modified silicon resin composition, an epoxy resin composition, a modified epoxy resin composition, an acrylic resin composition, and the like, may be used. Also, a resin having excellent weather resistance, such as a hybrid resin including one or more of silicon, epoxy, and a fluororesin, or the like, may be used. In addition, without being limited to an organic substance, an inorganic substance having excellent light stability, such as glass, silica gel, and the like, may also be used. Additionally, various surface treatments can be applied to the optical member 160. For example, a surface of the optical member 160 (e.g., an internal curved surface 161) can have a light-diffusing treatment layer applied thereto such that light incident on the surface is diffused by the treatment layer.

A light distribution provided by the optical member 160 or lens may be controlled by adjusting the shape of the internal curved surface 161 and the external curved surface 162 of the optical member 160. In the present embodiment, the external curved surface 162 may have an overall convex shape, and curvature thereof may be less than that of the recess portion 161a formed on the internal curved surface 161 so as to easily distribute light.

Also, as illustrated, the external curved surface 162 may have a concave portion 162a formed in a central axis thereof. In this case, a generation of a hot spot due to a large quantity of light being directed in an upward direction immediately above the light source 120 after being output from the light source 120 is reduced, and light may be guided to be more uniformly distributed.

In the present embodiment, the optical member 160 or lens may include a support portion 163 formed on the inner curved surface 161. The support portion 163 may serve to fix the optical member 160 to the light source substrate 110. The optical member 160 may be directly attached to the light source substrate 110 by using the support portion 163, but the inventive concepts are not limited thereto.

In the present embodiment, the light source 120 may be an LED such as that described in the former embodiment, for example, and in this case, the light source 120 may be provided as an LED directly mounted on the light source substrate 110. Alternatively, the light source 120 may be provided in the form of an LED package including an LED.

As shown in FIG. 31B, each light source 120 may have an optical member 160 or lens disposed thereon. As shown, each optical member 160 can have a substantially circular cross-section parallel to a surface of the light source substrate 200D. Each optical member 160 can further have a width $W_o$ (or diameter) that is smaller than a width $W_b$ of a branch part 114 on which the optical member 160 is disposed, such that a spacing $W_{d3}$ exists between edges of the optical member 160 and edges of the branch part 114. Because the branch part 114 extends beyond edges of the optical member 160, the branch part 114 can reflect light emitted sideways from the optical member 160 and thus provide improved lighting efficiency. Thus, in general, the width of the optical member 160 is smaller than the width of the branch part 114, and is generally smaller than or equal to 90% of the width of the branch part 114. The spacing $W_{d3}$ between an outer edge of the optical member 160 and an edge of the branch part 114 is preferably at least 0.6 mm.

In one example, the branch part 114 has a width of 13.56 mm. In general, the width of the branch part 114 can be equal to or greater than 13 mm. In the one example, the optical member 160 has a width equal to or less than 12.2 mm (90% of 13.56 mm), and can have a width of 11.56 mm for example. The optical member can have a height, measured from a surface of the branch part 114, or approximately 4.99 mm.

In general, the light sources 120 or LEDs disposed on a branch part 114 similarly have dimensions smaller than the width of the branch part 114, such that the light sources 120 are spaced away from edges of the branch part 114. In one example, the light source is spaced away from edges of the branch part 114 by at least 5% of the width of the branch part, such that a distance from an edge of the light source to a nearest edge of the branch part 114 is at least 5% of the width of the branch part. In one example in which the branch part has a width of at least 13.65 mm, such a spacing may correspond to a spacing of at least 0.68 mm. In the one example, a light source may thus have a width that is less than 12.28 mm so as to provide adequate spacing from edges of the branch part 114 on both sides of the light source.

Figure 32:
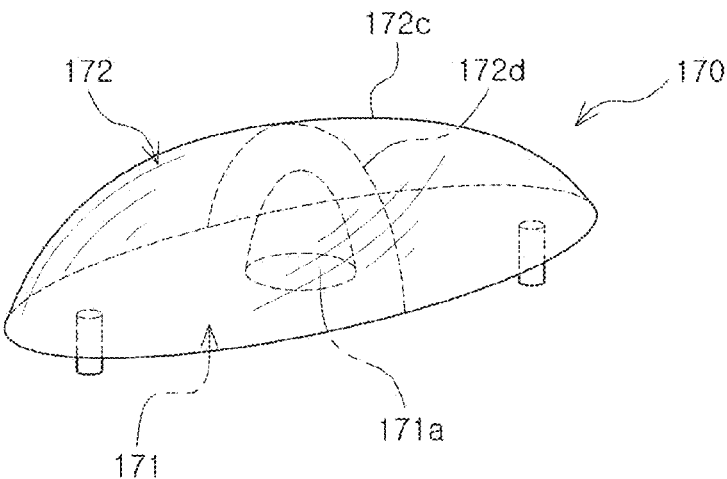

FIG. 32 is a perspective view of an optical member employable in a surface lighting device according to another embodiment of the inventive concepts.

Referring to FIG. 32, an optical member 170 employable in a surface lighting device according to the present embodiment may include an internal curved surface 171 having a recess portion 171a formed therein, and an oval external curved surface 172 having a longer axis 172c and a shorter axis 172d. A material of the optical member 170 is not particularly limited as long as it is light-transmissive.

Since the external curved surface 172 of the optical member 170 has an oval shape having the longer axis 172c and the shorter axis 172d, light may be emitted relatively in a concentrated manner in a particular direction, e.g., in any one of the longer axis 172c direction and the shorter axis 172d direction. Here, by using the optical member 170, a generation of luminance speck may be prevented. For example, a reduction in luminance in the vicinity of corners or vertices of the surface lighting device, or the like, may be prevented.

Hereinafter, a lighting system implemented by applying a surface lighting device according to an embodiment of the inventive concept thereto will be described with reference to FIGS. 33 through 44.

FIGS. 33 through 36 are views illustrating an example of a lighting system to which a surface lighting device according to an embodiment of the present inventive concepts are applied.

A lighting system according to the present embodiment may automatically regulate a color temperature according to a surrounding environment (e.g., temperature and humidity) and provide sensitivity lighting meeting human sensitivity, rather than serving as simple lighting.

Figure 33:
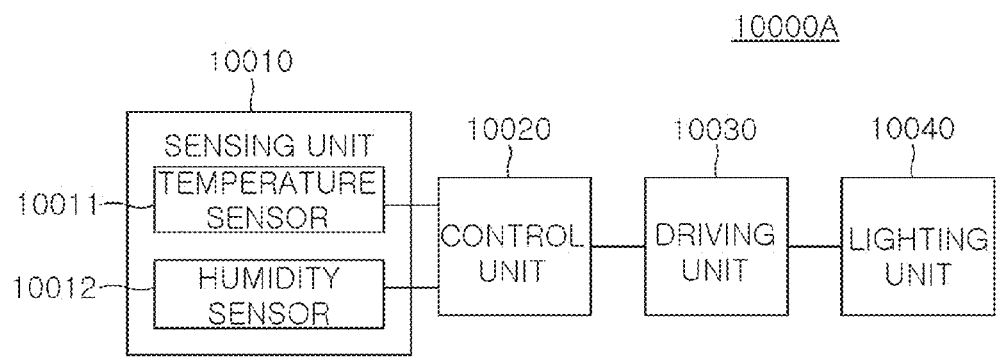
FIGS. 33 through 36 are views illustrating an example of a lighting system including a surface lighting device according to an embodiment of the present inventive concepts.

FIG. 33 is a block diagram schematically illustrating a lighting system according to an embodiment of the inventive concepts.

Referring to FIG. 33, a lighting system 10000A according to the present embodiment may include a sensing unit 10010, a control unit 10020, a driving unit 10030 and a lighting unit 10040.

The sensing unit 10010 may be installed in an indoor or outdoor area, and may have a temperature sensor 10011 and a humidity sensor 10012 to measure at least one air condition among an ambient temperature and humidity. The sensing unit 10010 delivers the measured air condition, i.e., the measured temperature and/or humidity, to the control unit 10020 electrically connected thereto.

The control unit 10020 may compare the measured air temperature and humidity with air conditions (temperature and humidity ranges) previously set by a user, and determines a color temperature of the lighting unit 10040 corresponding to the air condition. To this end, the control unit 10020 may be electrically connected to the driving unit 10030, and control the lighting unit 10040 to be driven at the determined color temperature.

Figure 34:
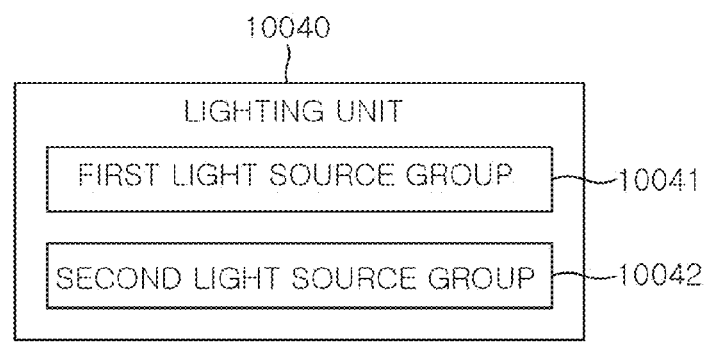

The lighting unit 10040 may operate by power supplied from the driving unit 10030. The lighting unit 10040 may include the surface lighting device according to the above-described embodiment. For example, as shown in FIG. 34, the lighting unit 10040 may include first and second light source groups 10041 and 10042 having different color temperatures in the same surface lighting device including the plurality of light sources.

For example, the first light source group 10041 may emit white light having a first color temperature, and the second light source group 10042 may emit white light having a second color temperature. The first color temperature may be lower than the second color temperature. In other examples, the first color temperature may be higher than the second color temperature. Here, white color having a relatively low color temperature corresponds to a warm white color, and white color having a relatively high color temperature corresponds to a cold white color. When power is supplied to the first and second light source groups 10041 and 10042, the first and second light source groups 10041 and 10042 emit white light having first and second color temperatures, respectively. The white light emitted by the respective light source groups may be mixed to implement white light having a color temperature determined by the control unit 10020.

In detail, in a case in which the first color temperature is lower than the second color temperature, if the color temperature determined by the control unit 10020 is relatively high, an amount of light from the first light source group 10041 may be reduced and an amount of light from the second light source group 10042 may be increased to implement mixed white light having the determined color temperature. Conversely, when the determined color temperature is relatively low, an amount of light from the first light source group 10041 may be increased and an amount of light from the second light source group 10042 may be reduced to implement white light having the determined color temperature. Here, the amount of light from each of the light source groups 10041 and 10042 may be controlled by differently regulating an amount of power supplied from the driving unit 10030 or may be controlled by regulating the number of lighted light sources in each light source group.

Figure 35:
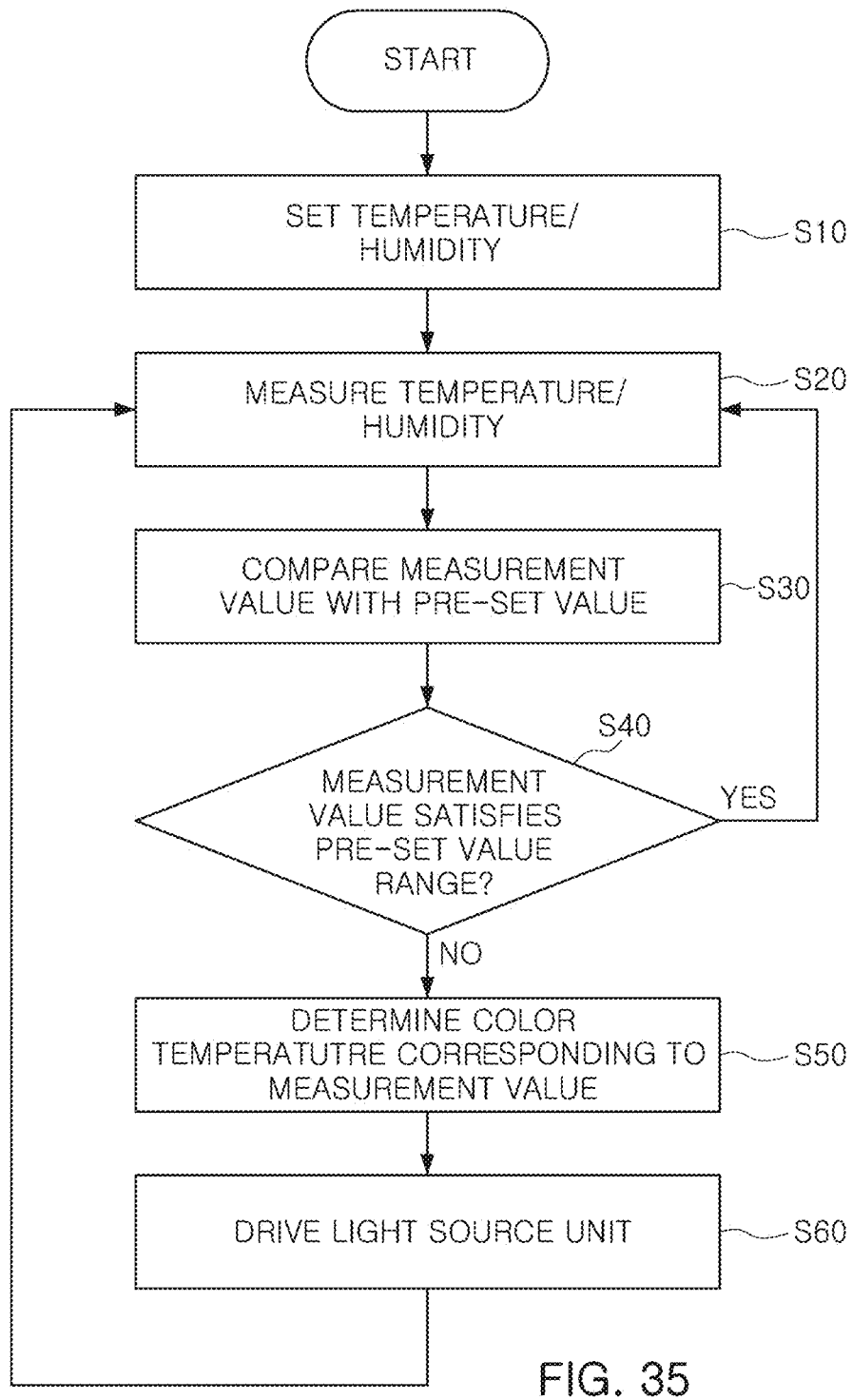

FIG. 35 is a flowchart illustrating a method for controlling the lighting system 10000A of FIG. 33. Referring to FIG. 35 along with FIG. 34, first, the user sets a color temperature according to temperature and humidity ranges through the control unit 10020 (S10). The set temperature and humidity data are stored in the control unit 10020. In particular, a color temperature can be associated with each of a plurality of ranges of temperature and/or humidity values, and the association between the color temperatures and ranges of temperature and/or humidity values are stored as pre-set values in memory.

In general, when a color temperature is equal to or more than 6000K, a color providing a cool feeling, such as blue, may be produced. When a color temperature is less than 4000K, a color providing a warm feeling, such as red, may be produced. Thus, in the present embodiment, when temperature and humidity exceed 20° C. and 60%, respectively, the user may set the lighting unit 10040 to be turned on to have a color temperature higher than 6000K through the control unit 10020; when temperature and humidity range from 10° C. to 20° C. and 40% to 60%, respectively, the user may set the lighting unit 10040 to be turned on to have a color temperature ranging from 4000K to 6000K through the control unit 10020; and when temperature and humidity are lower than 10° C. and 40%, respectively, the user may set the lighting unit 10040 to be turned on to have a color temperature lower than 4000K through the control unit 10020.

Next, the sensing unit 10010 measures at least one condition among an ambient temperature and an ambient humidity (S20). The temperature and humidity measured by the sensing unit 10010 are delivered to the control unit 10020.

Subsequently, the control unit 10020 compares the measurement values delivered from the sensing unit 10010 with pre-set values, respectively (S30). Here, the measurement values are temperature and humidity data measured by the sensing unit 10010, and the set values are temperature and humidity data which have been set by the user and stored in the control unit 10020 in advance. Namely, the control unit 10020 compares the measured temperature and humidity values with the pre-set ranges of temperature and humidity values.

According to the comparison results, the control unit 10020 determines whether the measurement values satisfy any of the pre-set ranges (S40). When the measurement values satisfy the pre-set values, the control unit 10020 maintains a current color temperature, and measures again temperature and humidity (S20). Meanwhile, when the measurement values do not satisfy the pre-set values, the control unit 10020 detects pre-set values corresponding to the measurement values, and determines a corresponding color temperature (S50). The control unit 10020 controls the driving unit 10030 to cause the lighting unit 10040 to be driven at the determined color temperature.

Then, the driving unit 10030 drives the lighting unit 10040 to have the determined color temperature (S60). That is, the driving unit 10030 supplies required power to drive the lighting unit 10040 to implement the predetermined color temperature. Accordingly, the lighting unit 10040 may be adjusted to have a color temperature corresponding to the temperature and humidity previously set by the user according to ambient temperature and humidity.

In this manner, the lighting system 10000A is able to automatically regulate a color temperature of the indoor lighting according to changes in ambient temperature and humidity, thereby satisfying human moods varied according to changes in the surrounding natural environment and providing psychological stability.

Figure 36:
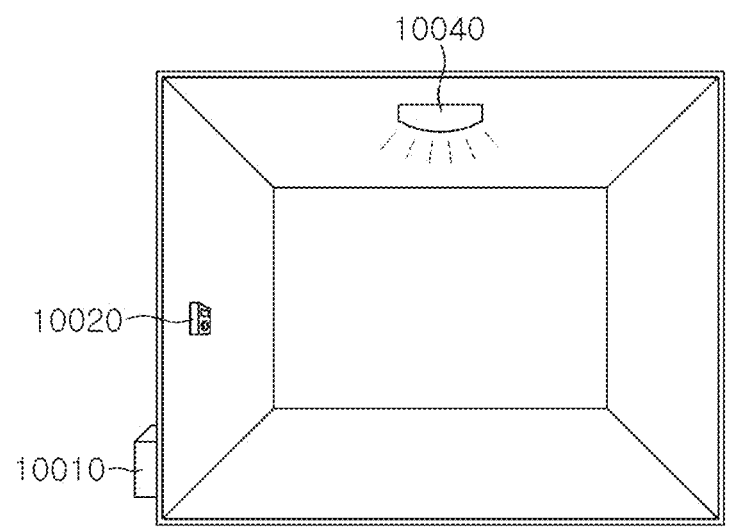

FIG. 36 is a view schematically illustrating the use of the lighting system 10000A of FIG. 33. As illustrated in FIG. 36, the lighting unit 10040 may be installed on the ceiling as an indoor lamp. Here, the sensing unit 10010 may be implemented as a separate device and installed on an outer wall in order to measure outdoor temperature and humidity. The control unit 10020 may be installed in an indoor area to allow the user to easily perform setting and ascertainment operations. The lighting system is not limited thereto, but may be installed on the wall in the place of an interior illumination device or may be applicable to a lamp, such as a desk lamp, or the like, that can be used in indoor and outdoor areas.

Hereinafter, another example of a lighting system to which a surface lighting device according to an embodiment of the inventive concepts will be described with reference to FIGS. 37 through 40.

The lighting system according to the present embodiment may automatically perform a predetermined control by detecting a motion of a monitored target and an intensity of illumination at a location of the monitored target.

Figure 37:
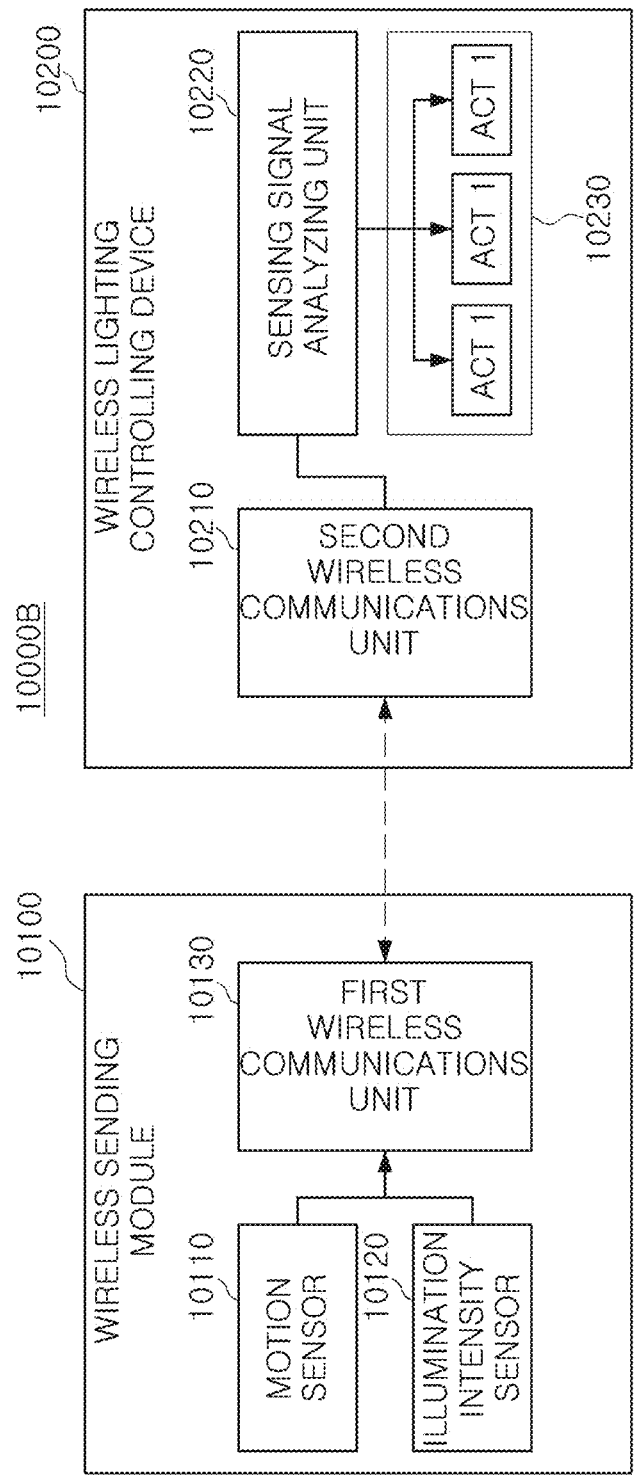
FIGS. 37 through 40 are views illustrating another example of a lighting system including a surface lighting device according to an embodiment of the present inventive concepts.

FIG. 37 is a block diagram of a lighting system according to another embodiment of the inventive concepts.

Referring to FIG. 37, a lighting system 10000B according to the present embodiment may include a wireless sensing module 10100 and a wireless lighting controlling device 10200.

The wireless sensing module 10100 may include a motion sensor 10110, an illumination intensity sensor 10120 sensing an intensity of illumination, and a first wireless communications unit 10130. The first wireless communications unit 10130 generates a wireless signal that includes a motion sensing signal from the motion sensor 10110 and an illumination intensity sensing signal from the illumination intensity sensor 10120 and that complies with a predetermined communications protocol, and transmits the generated wireless signal. For example, the first wireless communications unit 10130 may be configured as a first ZigBee communications unit generating a ZigBee signal that complies with a pre-set communications protocol and transmitting the same.

The wireless lighting controlling device 10200 may include a second wireless communications unit 10210 receiving the wireless signal from the first wireless communications unit 10130 and restoring a sensing signal, a sensing signal analyzing unit 10220 analyzing the sensing signal restored by the second wireless communications unit 10210, and an operation control unit 10230 performing a predetermined control based on analysis results from the sensing signal analyzing unit 10220. The second wireless communications unit 10210 may be configured as a second ZigBee communications unit receiving the ZigBee signal from the first ZigBee communications unit and restoring a sensing signal.

Figures 38, 39:
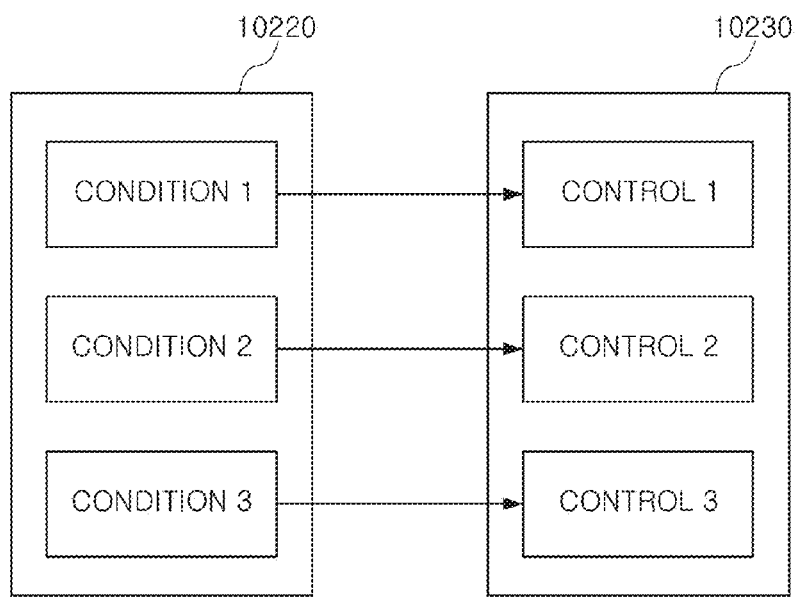

FIG. 38 is a view illustrating a format of a ZigBee signal according to an embodiment of the inventive concepts.

Referring to FIG. 38, the signal from the first wireless communications unit 10130 may be ZigBee signal that includes channel information (CH) defining a communications channel, wireless network identification (ID) information (PAN_ID) defining a wireless network, a device address (Ded_Add) designating a target device, and sensing data including the motion and illumination intensity sensing signals.

Also, the ZigBee signal received in the second wireless communications unit 10210 may include channel information (CH) defining a communications channel, wireless network identification (ID) information (PAN_ID) defining a wireless network, a device address (Ded_Add) designating a target device, and sensing data including the motion and illumination intensity sensing signal.

The sensing signal analyzing unit 10220 may analyze the sensing signal from the second wireless communications unit 10210 to detect a satisfied condition, among a plurality of conditions, based on the sensed motion and the sensed intensity of illumination.

Here, the operation control unit 10230 may set a plurality of controls based on a plurality of conditions that are previously set by the sensing signal analyzing unit 10220, and perform a control corresponding to the condition(s) detected by the sensing signal analyzing unit 10220.

FIG. 39 is a view illustrating the sensing signal analyzing unit 10220 and the operation control unit 10230 according to the embodiment of the inventive concepts. Referring to FIG. 39, for example, the sensing signal analyzing unit 10220 may analyze the sensing signal (e.g., a ZigBee signal) from the second wireless communications unit 10210 and detect a satisfied condition among first, second, and third conditions (condition 1, condition 2, and condition 3), based on the sensed motion and sensed intensity of illumination.

In this case, the operation control unit 10230 may be operative to set one of first, second, and third controls (control 1, control 2, and control 3) respectively corresponding to the first, second, and third conditions (condition 1, condition 2, and condition 3) previously set by the sensing signal analyzing unit 10220, and perform a control corresponding to the condition detected by the sensing signal analyzing unit 10220.

Figure 40:
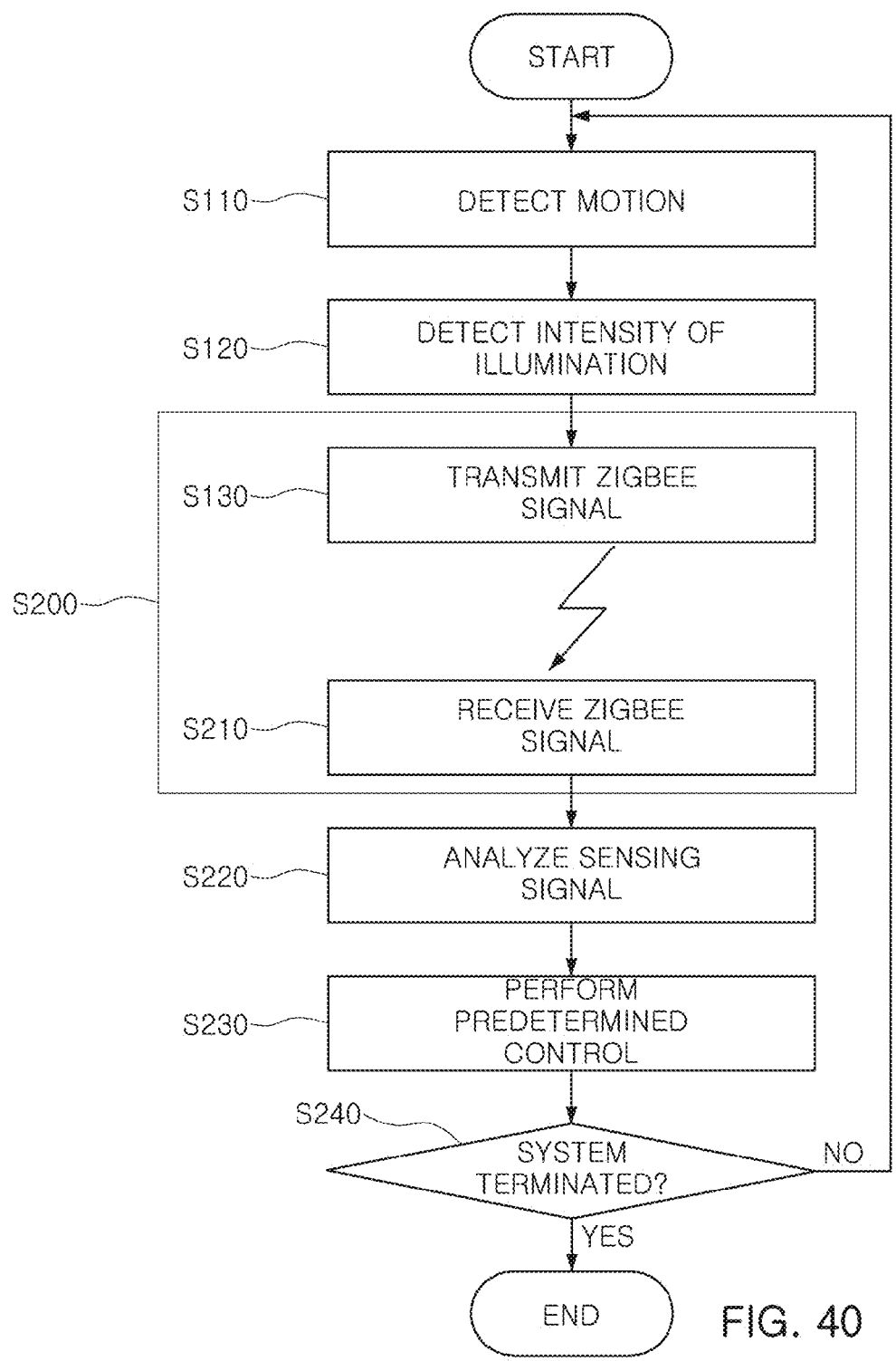

FIG. 40 is a flowchart illustrating operation of a wireless lighting system according to an embodiment of the inventive concepts.

In FIG. 40, in operation S110, the motion sensor 10110 detects a motion. In operation S120, the illumination intensity sensor 10120 detects an intensity of illumination, for example in response to detecting the motion in operation S110. Operation S200 is a process of transmitting and receiving a wireless signal, such as a ZigBee signal. Operation S200 may include operation S130 of generating and transmitting a wireless signal (e.g., a ZigBee signal) by the first wireless communications unit 10130 and operation S210 of receiving the wireless signal (e.g., the ZigBee signal) by the second wireless communications unit 10210. In operation S220, the sensing signal analyzing unit 10220 analyzes the received sensing signal. In operation S230, the operation control unit 10230 performs a predetermined control based on the received sensing signal. In operation S240, whether the lighting system is terminated is determined.

Operations of the wireless sensing module and the wireless lighting controlling device according to an embodiment of the inventive concepts will be described with reference to FIGS. 37 through 40.

First, with reference to FIGS. 37, 38, and 40, the wireless sensing module 10100 of the wireless lighting system according to an embodiment of the inventive concepts will be described. The wireless lighting system 10100 according to the present embodiment is installed in a location in which a lighting device is installed, to detect a current intensity of illumination of the lighting device and detect human motion near the lighting device.

Namely, the motion sensor 10110 of the wireless sensing module 10100 is configured as an infrared sensor, or the like, capable of sensing a human. The motion sensor 10100 senses a motion and provides the same to the first wireless communications unit 10130 (e.g., in operation S110). The illumination intensity sensor 10120 of the wireless sensing module 10100 senses an intensity of illumination and provides the same to the first wireless communications unit 10130 (S120).

Accordingly, the first wireless communications unit 10130 generates a wireless signal (e.g., a ZigBee signal) that includes the motion sensing signal from the motion sensor 10100 and the illumination intensity sensing signal from the illumination intensity sensor 10120 and that complies with a pre-set communications protocol, and transmits the generated wireless signal (e.g., the Zigbee signal) wirelessly (S130).

Referring to FIG. 38, the wireless signal from the first wireless communications unit 10130 may include channel information (CH) defining a communications channel, wireless network identification (ID) information (PAN_ID) defining a wireless network, a device address (Ded_Add) designating a target device, and sensing data, and here, the sensing data includes a motion value and an illumination intensity value.

Next, the wireless lighting controlling device 10200 of the wireless lighting system according to an embodiment of the inventive concepts will be described with reference to FIGS. 37 through 40. The wireless lighting controlling device 10200 of the wireless lighting system according to the present embodiment may control a predetermined operation according to an illumination intensity value and a motion value included in a wireless signal (e.g., the ZigBee signal) from the wireless sensing module 10100.

Namely, the second wireless communications unit 10210 of the wireless lighting controlling device 10200 according to the present embodiment receives the wireless signal (e.g., the ZigBee signal) from the first wireless communications unit 10130, restores a sensing signal therefrom, and provides the restored sensing signal to the sensing signal analyzing unit 10220 (S210).

Referring to FIG. 38, the wireless signal from the second wireless communications unit 10210 may be a ZigBee signal that includes channel information (CH) defining a communications channel, wireless network identification (ID) information (PAN_ID) defining a wireless network, a device address (Ded_Add) designating a target device, and sensing data. A wireless network may be identified based on the channel information (CH) and the wireless network ID information (PAN_ID), and a sensed device may be recognized based on the device address. The sensing data includes a motion value and an illumination intensity value.

Also, the sensing signal analyzing unit 10220 analyzes the illumination intensity value and the motion value included in the sensing signal from the second wireless communications unit 10210 and provides the analysis results to the operation control unit 10230 (S220).

Accordingly, the operation control unit 10230 may perform a predetermined control according to the analysis results from the sensing signal analyzing unit 10220 (S230).

The sensing signal analyzing unit 10220 may analyze the sensing signal from the second ZigBee communications unit 10210 and detect a satisfied condition, among a plurality of conditions, based on the sensed motion and the sensed intensity of illumination. Here, the operation control unit 10230 may set a plurality of controls corresponding to the plurality of conditions set in advance by the sensing signal analyzing unit 10220, and perform a control corresponding to the condition detected by the sensing signal analyzing unit 10220.

For example, referring to FIG. 39, the sensing signal analyzing unit 10220 may detect a satisfied condition among the first, second, and third conditions (condition 1, condition 2, and condition 3) based on the sensed motion and the sensed intensity of illumination by analyzing the sensing signal from the second wireless communications unit 10210.

In this case, the operation control unit 10230 may set first, second, and third controls (control 1, control 2, and control 3) corresponding to the first, second, and third conditions (condition 1, condition 2, and condition 3) set in advance by the sensing signal analyzing unit 10220, and perform a control corresponding to the condition detected by the sensing signal analyzing unit 10220.

For example, when the first condition (condition 1) corresponds to a case in which human motion is sensed at a front door and an intensity of illumination at the front door is not low (not dark), the first control may turn off all predetermined lamps. When the second condition (condition 2) corresponds to a case in which human motion is sensed at the front door and an intensity of illumination at the front door is low (dim), the second control may turn on some pre-set lamps (i.e., some lamps at the front door and some lamps in a living room). When the third condition (condition 3) corresponds to a case in which human motion is sensed at the front door and an intensity of illumination at the front door is very low (very dark), the third control may turn on all of the pre-set lamps.

Unlike the foregoing cases, besides the operation of turning lamps on or off, the first, second, and third controls may be variously applied according to pre-set operations. For example, the first, second, and third controls may be associated with operations of a lamp and an air-conditioner in summer or may be associated with operations of a lamp and heating in winter.

Other examples of a lighting system using the foregoing surface lighting device will be described with reference to FIGS. 41 through 44.

Figure 41:
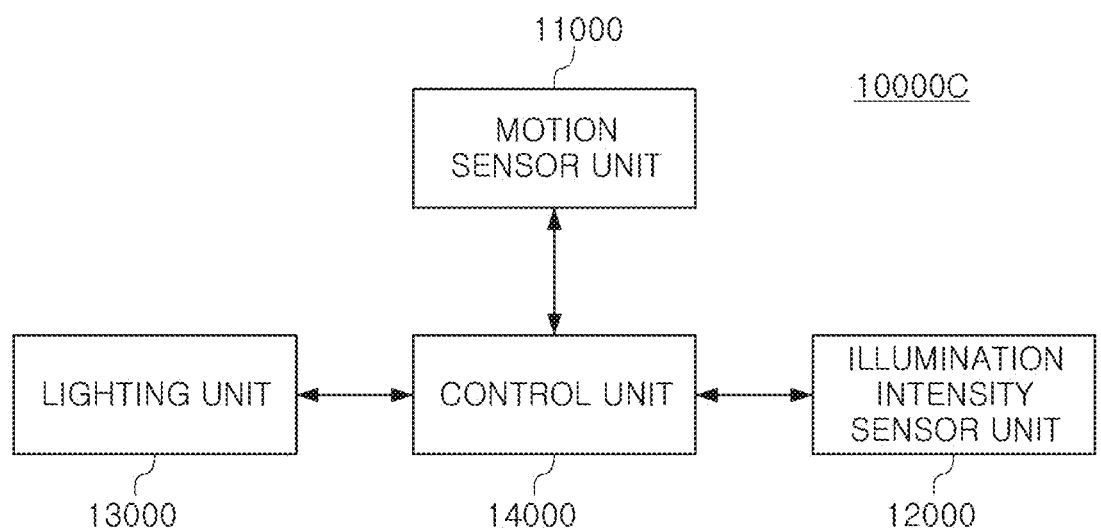
FIGS. 41 through 44 are views illustrating other examples of lighting systems including a surface lighting device according to an embodiment of the present inventive concepts.

FIG. 41 is a block diagram schematically illustrating constituent elements of a lighting system according to another embodiment of the inventive concepts. A lighting system 10000C according to the present embodiment may include a motion sensor unit 11000, an illumination intensity sensor unit 12000, a lighting unit 13000, and a control unit 14000.

The motion sensor unit 11000 senses a motion of an object. For example, the lighting system may be attached to a movable object, such as, for example, a container or a vehicle, and the motion sensor unit 11000 senses a motion of the moving object. When the motion of the object to which the lighting system is attached is sensed, the motion sensor unit 11000 outputs a signal to the control unit 14000 and the lighting system is activated. The motion sensor unit 11000 may include an accelerometer, a geomagnetic sensor, or the like.

The illumination intensity sensor unit 12000, a type of optical sensor, measures an intensity of illumination of a surrounding environment. When the motion sensor unit 11000 senses the motion of the object to which the lighting system is attached, the illumination intensity sensor unit 12000 is activated according to a signal output by the control unit 14000. The lighting system can be used to provide illumination during night work, or to call a worker or an operator's attention to their surroundings in a dark environment, and provides enhanced visibility to a driver at night. Thus, even when the motion of the object to which the lighting system is attached is sensed, if an intensity of illumination higher than a predetermined level is detected (e.g., during the day), the lighting system is not required to illuminate. Also, even in the daytime, if it rains, the intensity of illumination may be fairly low, so there is a need to inform a worker or an operator about a movement of a container, and thus the lighting unit can nonetheless be configured to emit light. Thus, whether to turn on the lighting unit 13000 is determined by the control unit 14000 according to an illumination intensity value measured by the illumination intensity sensor unit 12000.

The illumination intensity sensor unit 12000 measures an intensity of illumination of a surrounding environment and outputs the measured value to the control unit 14000. Meanwhile, when the illumination intensity value is equal to or higher than a pre-set value, the lighting unit 13000 is not required to emit light, so the overall system is terminated.

When the illumination intensity value measured by the illumination intensity sensor unit 12000 is lower than the pre-set value, the control unit 14000 causes the lighting unit 13000 to emit light. The worker or the operator may recognize the light emissions from the lighting unit 13000 as indicating that the container is moving, or the like. As the lighting unit 13000, the foregoing surface lighting device may be employed.

Also, the lighting unit 13000 may adjust intensity of light emissions thereof according to the illumination intensity value of the surrounding environment. When the illumination intensity value of the surrounding environment is low, the lighting unit 13000 may increase the intensity of light emissions therefrom, and when the illumination intensity value of the surrounding environment is relatively high, the lighting unit 13000 may decrease the intensity of light emissions therefrom, thus preventing power wastage.

The control unit 14000 controls the motion sensor unit 11000, the illumination intensity sensor unit 12000, and the lighting unit 13000 overall. When the motion sensor unit 11000 senses the motion of the object to which the lighting system is attached, and outputs a signal to the control unit 14000, the control unit 14000 outputs an operation signal to the illumination intensity sensor unit 12000 to cause the illumination intensity sensor unit 12000 to become operational and/or to measure an illumination intensity. The control unit 14000 receives an illumination intensity value measured by the illumination intensity sensor unit 12000 and determines whether to turn on (operate) the lighting unit 13000.

Figure 42:
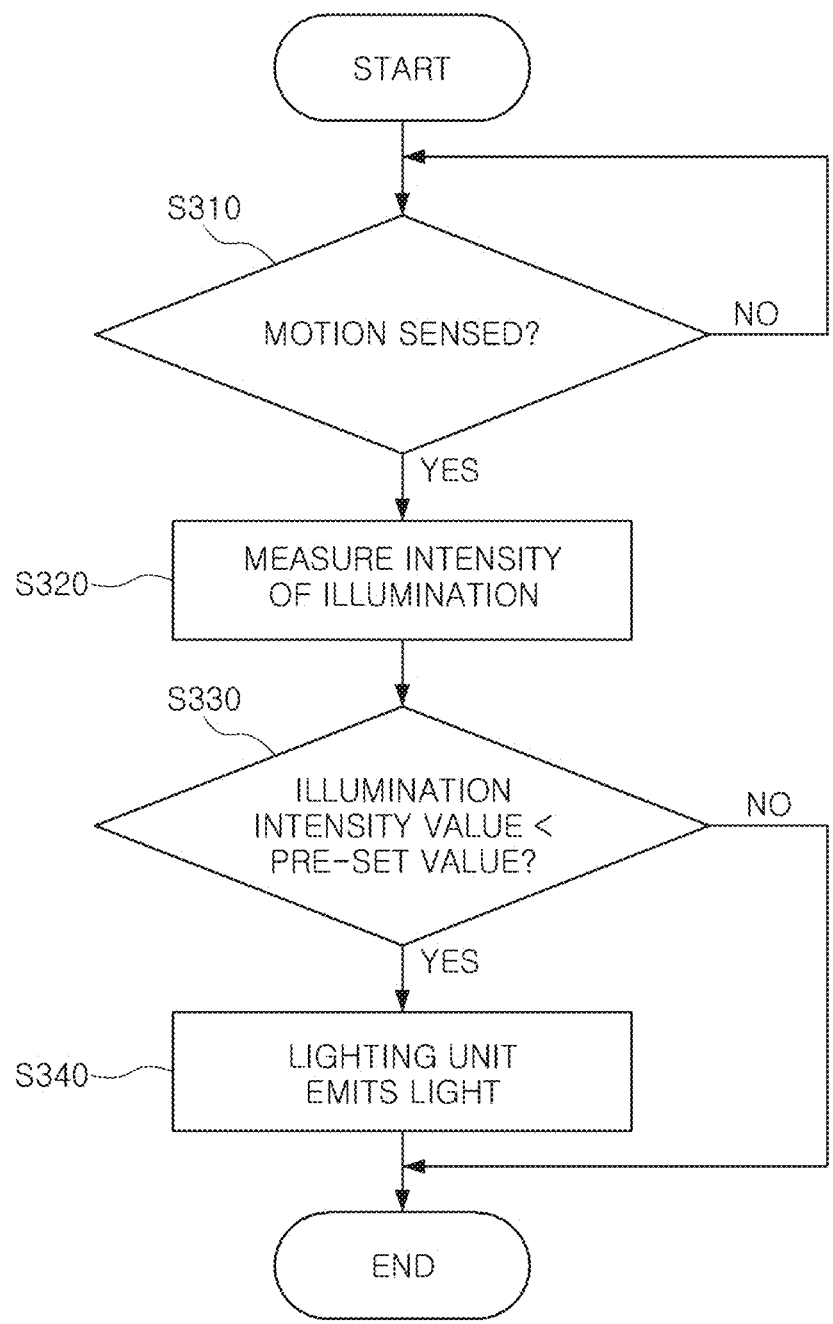

FIG. 42 is a flowchart illustrating a method for controlling a lighting system. Hereinafter, a method for controlling a lighting system will be described with reference to FIG. 42.

First, a motion of an object to which the lighting system is attached is sensed and an operation signal is output (S310). For example, the motion sensor unit 11000 may sense a motion of a container or a vehicle in which the lighting system is installed, and when the motion of the container or the vehicle is sensed, the motion sensor unit 11000 outputs an operation signal. The operation signal may be a signal for activating overall power. Namely, when the motion of the container or the vehicle is sensed, the motion sensor unit 11000 outputs the operation signal to the control unit 14000.

Next, in response to the operation signal, an intensity of illumination of a surrounding environment is measured and an illumination intensity value is output (S320). When the operation signal is applied to the control unit 14000, the control unit 14000 outputs a signal to the illumination intensity sensor unit 12000. In response to the signal, the illumination intensity sensor unit 12000 measures the intensity of illumination of the surrounding environment. The illumination intensity sensor unit 12000 outputs the measured illumination intensity value of the surrounding environment to the control unit 14000. Thereafter, whether to turn on the lighting unit 13000 is determined according to the illumination intensity value and the lighting unit 13000 emits light according to the determination.

First, the illumination intensity value is compared with a pre-set value for a determination (S330). When the illumination intensity value is input to the control unit 14000, the control unit 14000 compares the received illumination intensity value with a stored pre-set value and determines whether the former is lower than the latter. Here, the pre-set value is a value for determining whether to turn on a lighting device. For example, the pre-set value may be an illumination intensity value at which a worker or a driver may have difficulty in recognizing an object with the naked eye or may make a mistake in a situation, for example, a situation in which the sun starts to set.

When the illumination intensity value measured by the illumination intensity sensor unit 12000 is higher than the pre-set value, lighting of the lighting unit is not required, so the control unit 14000 shuts down the overall system (S330, 'No').

Meanwhile, when the illumination intensity value measured by the illumination intensity sensor unit 12000 is lower than the pre-set value (S330, 'Yes'), lighting of the lighting unit is required, so the control unit 14000 outputs a signal to the lighting unit 13000 and the lighting unit 13000 emits light (S340).

Figure 43:
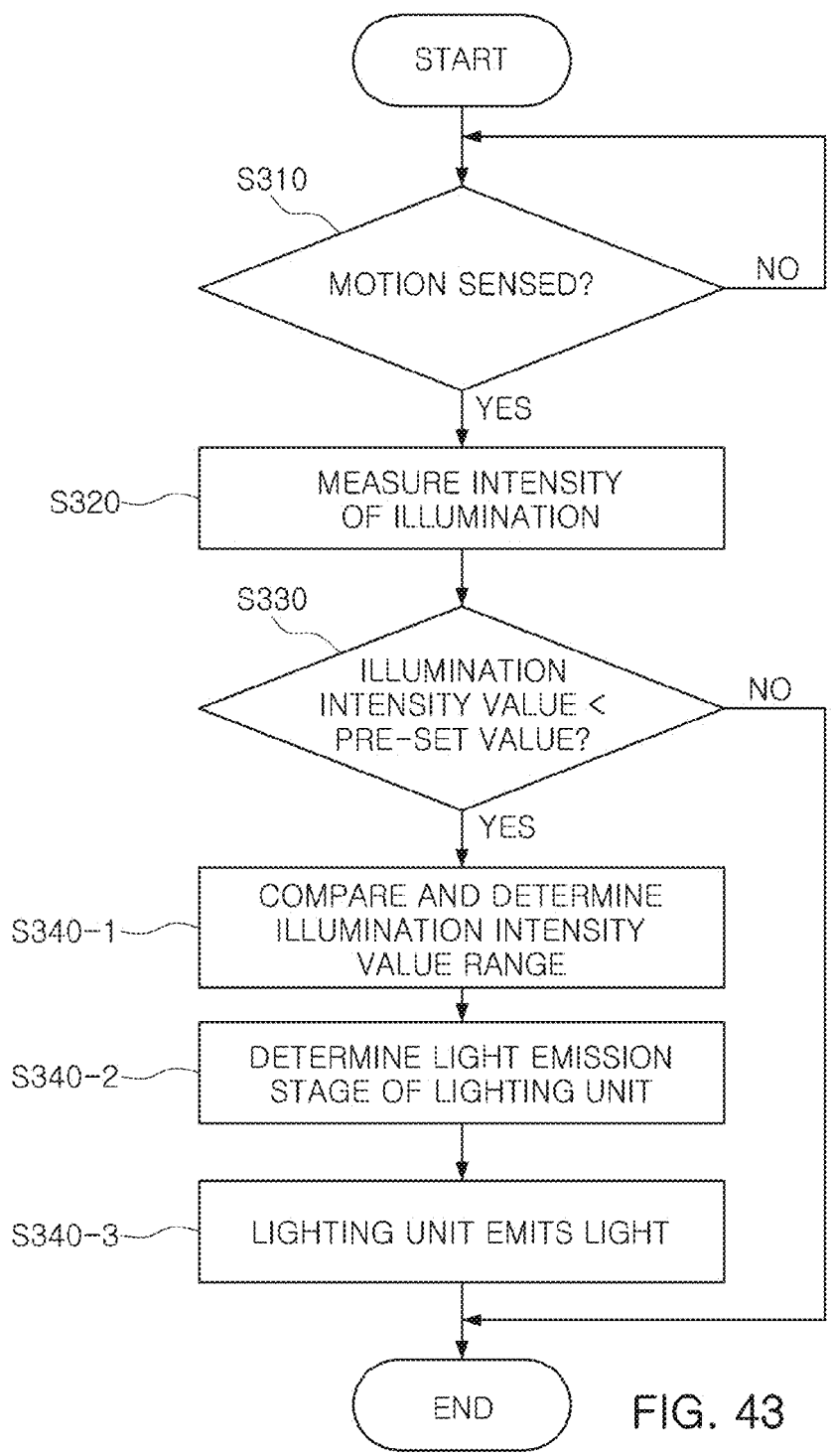

FIG. 43 is a flowchart illustrating a method for controlling a lighting system according to another embodiment of the inventive concepts. Hereinafter, a method for controlling a lighting system according to another embodiment of the inventive concepts will be described. However, the same procedure as that of the method for controlling a lighting system as described above with reference to FIG. 42 will be omitted.

As illustrated in FIG. 43, in the case of the method for controlling a lighting system according to the present embodiment, an intensity of light emissions of the lighting unit may be regulated according to an illumination intensity value of a surrounding environment.

As described above, the illumination intensity sensor unit 12000 outputs an illumination intensity value to the control unit 14000 (S320). When the illumination intensity value is lower than a pre-set value (S330, 'Yes'), the control unit 14000 determines a range of the illumination intensity value (S340-1). The control unit 14000 has a plurality of ranges of subdivided illumination intensity values, based on which the control unit 14000 determines the range of the plurality of ranges that corresponds to the measured illumination intensity value.

Next, when the range of the illumination intensity value is determined, the control unit 14000 determines an intensity of light emissions of the lighting unit 13000 that is associated with the determined range (S340-2), and accordingly, the control unit 14000 controls the lighting unit 13000 to emit light of the determined intensity (S340-3). The intensity of light emissions of the lighting unit 13000 may be determined according to the measured illumination intensity value, and here, the measured illumination intensity value varies according to weather, time, and surrounding environment, so the intensity of light emissions of the lighting unit 13000 may also be regulated based on weather, time, and surrounding environment. By regulating the intensity of light emissions according to the range of the illumination intensity value, power wastage may be prevented and a worker or an operator's attention may be drawn to their surroundings.

Figure 44:
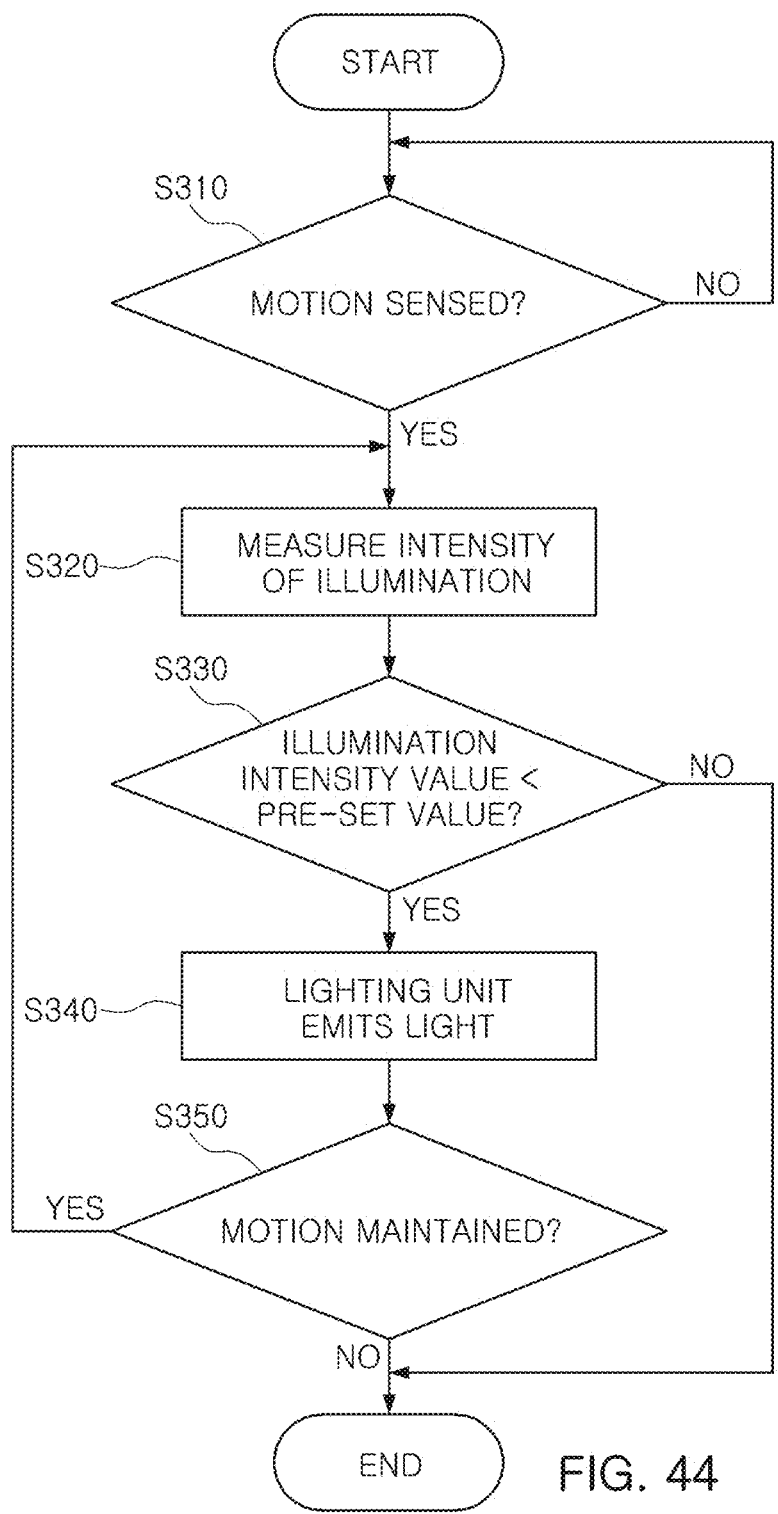

FIG. 44 is a flowchart illustrating a method for controlling a lighting system according to another embodiment of the inventive concepts. Hereinafter, a method for controlling a lighting system according to another embodiment of the inventive concepts will be described. However, description of steps similar to steps of the methods for controlling a lighting system as described above with reference to FIGS. 42 and 43 will be omitted.

The method for controlling a lighting system according to the present embodiment can further include an operation S350 of determining whether a motion of an object to which the lighting system is attached is maintained in a state in which the lighting unit 13000 emits light, and determining whether to maintain light emissions based on the determination.

First, when the lighting unit 13000 starts to emit light (operation S340), termination of the light emissions may be determined based on whether a container or a vehicle to which the lighting system is installed moves. Here, when the motion of the container is stopped (S350, 'No'), it may be determined that an operation thereof has terminated. In addition, when a vehicle temporarily stops at a crosswalk, light emissions of the lighting unit may be stopped to prevent interference with vision of oncoming drivers.

When the container or the vehicle moves again, the motion sensor unit 11000 operates and the lighting unit 14000 may start to emit light.

Whether to maintain light emissions may be determined based on whether a motion of an object to which the lighting system is attached is sensed by the motion sensor unit 11000. When the motion of the object is continuously sensed by the motion sensor unit 11000 (S350, 'Yes'), an intensity of illumination is measured again (S320) and whether to maintain light emissions is determined (S330). Meanwhile, when the motion of the object is not sensed (S350, 'No'), the system is terminated.

As set forth above, according to embodiments of the inventive concepts, a light emitting module having improved component use efficiency through a design and a layout of a light source substrate and a light source may be provided.

According to embodiments of the inventive concepts, a surface lighting device including the above-described light emitting module disposed therein may be provided.

While the present inventive concepts have been shown and described in connection with illustrative embodiments, it will be apparent to those skilled in the art that modifications and variations can be made without departing from the spirit and scope of the inventive concepts as defined by the appended claims.

What is claimed is:

1. A light emitting module configured to emit light to be diffused through a diffusion plate, the diffusion plate being disposed at a set distance from the light emitting module, the light emitting module comprising:
   a light source substrate having a substantially quadrilateral outer perimeter with at least one gap formed therein; and
   a plurality of light sources disposed on the light source substrate according to a repeated quadrilateral pattern and configured to emit the light,
   wherein a distance between adjacent light sources in the repeated quadrilateral pattern is such that a ratio MH, of the set distance h from the diffusion plate to the light emitting module divided by a greater of two diagonal distances x, y of the quadrilateral pattern, is greater or equal to 1, and wherein the distance between adjacent light sources in the repeated quadrilateral pattern is such that the ratio MH is smaller than or equal to 3.

2. The light emitting module of claim 1, wherein the plurality of light sources are disposed in a repeated diamond pattern on the light source substrate.

3. The light emitting module of claim 1, wherein the distance between adjacent light sources in the repeated quadrilateral pattern is such that the ratio MH satisfies the inequality:

$$0.8 \leq -0.0592 MH^4 + 0.4979 MH^3 - 1.5269 MH^2 + 1.9902 MH - 0.0888.$$

4. The light emitting module of claim 1, further comprising:
   at least two connectors of different types disposed on the light source substrate and configured to receive power for driving the plurality of light sources.

5. The light emitting module of claim 1, wherein the plurality of lights sources is a plurality of lights emitting diodes (LEDs).

6. The light emitting module of claim 5, wherein each LED of the plurality of LEDs is a chip comprising:
   a substrate;
   a first conductivity-type semiconductor layer disposed on the substrate;
   an active layer disposed on the first conductivity-type semiconductor layer;
   a second conductivity-type semiconductor layer disposed on the active layer; and
   first and second electrodes electrically connected to the first and second conductivity-type semiconductor layers, respectively.

7. The light emitting module of claim 6, wherein the first electrode of each LED includes a first electrode layer extending through one or more contact holes extending through the active layer and the second conductivity-type semiconductor layer, and the first electrode layer is electrically insulated from the second conductivity-type semiconductor layer and the active layer by an insulating layer.

8. The light emitting module of claim 6, wherein each LED of the plurality of LEDs comprises a plurality of nano light emitting structures, and each nano light emitting structures includes a nanocore having a rod structure and formed of the first conductivity-type semiconductor layer, the active layer disposed on the nanocore, and the second conductivity-type semiconductor layer disposed on the active layer.

9. The light emitting module of claim 6, wherein each LED chip is located within an LED package disposed on the light source substrate, the LED package comprising:
a package body having the LED chip disposed thereon;
a plurality of electrodes disposed in the package body and electrically connected to the first and second electrodes of the LED chip; and
a lens disposed above the package body and configured to guide light emitted by the LED chip.

10. The light emitting module of claim 1, wherein the light source substrate comprises:
a first metal layer;
an insulating layer disposed on the first metal layer; and
a second metal layer disposed on the insulating layer,
wherein the light source substrate includes a region located at an edge of the substrate and in which the insulating layer does not have the second metal layer disposed thereon.

11. The light emitting module of claim 1, wherein diagonal distances x, y of the quadrilateral pattern are distances between centers of light sources disposed at apexes of the quadrilateral pattern.

12. The light emitting module of claim 1, wherein the light source substrate comprises a substantially rectangular spine part and at least two substantially rectangular branch parts emanating from a side of the spine part, and the plurality of light sources are disposed on the rectangular branch parts such that the distance between adjacent light sources in the repeated quadrilateral pattern is such that the ratio MH is greater or equal to 1.

13. A lighting device comprising:
a base part;
a light source substrate mounted on the base part and having a substantially quadrilateral outer perimeter with at least one gap formed therein;
a plurality of light emitting diodes (LEDs) disposed on the light source substrate according to a repeated diamond pattern and configured to emit the light; and
a diffusion plate disposed at a set distance from the light source substrate and configured to diffuse the light emitted by the plurality of LEDs,
wherein a distance between adjacent LEDs in the repeated diamond pattern is such that a ratio MH, of the set distance h from the diffusion plate to the plurality of LEDs divided by a greater of two diagonal distances x, y of the diamond pattern, is within a prescribed range, wherein the prescribed range is MH≥1.

14. The lighting device of claim 13, wherein the prescribed range is 1≤MH≤3.

15. The lighting device of claim 13, further comprising:
a light collecting sheet disposed on the diffusion plate and configured to collect light incident thereinto in a vertical direction; and
a protective sheet disposed on the light collecting sheet and configured to protect the light collecting sheet, the diffusion plate, the light source substrate, and the plurality of LEDs.

16. The lighting device of claim 13, further comprising:
a fixing bar disposed above the light source substrate and attached to the base part so as to fix the light source substrate to the base part.

17. The lighting device of claim 16, wherein:
the light source substrate includes a substantially rectangular spine part, and at least one substantially rectangular branch part emanating from a side of the spine part, and
the fixing bar is disposed above the light source substrate so as to cover an end of the substantially rectangular branch part spaced away from the spine part.

18. A method comprising:
providing a light source substrate having a substantially quadrilateral outer perimeter with at least one gap formed therein for use in a lighting device including a diffusion plate disposed at a set distance from the light source substrate;
determining a maximum distance between adjacent light sources in a repeated quadrilateral pattern of light sources on the light source substrate,
wherein the maximum distance is such that a ratio MH, of the set distance h from the diffusion plate to the light source substrate divided by a greater of two diagonal distances x, y of the quadrilateral pattern, is greater or equal to 1; and
disposing a plurality of light sources on the light source substrate according to the repeated quadrilateral pattern such that adjacent light sources are separated by a distance not exceeding the determined maximum distance.

19. The method of claim 18, wherein the disposing of the plurality of light sources comprises disposing the plurality of light sources on the light source substrate according to a repeated diamond pattern.

20. The method of claim 18, wherein the maximum distance between adjacent light sources in the repeated quadrilateral pattern is such that the ratio MH satisfies the inequality:

$$0.8 \leq -0.0592 MH^4 + 0.4979 MH^3 - 1.5269 MH^2 + 1.9902 MH - 0.0888.$$

21. The method of claim 18, further comprising:
disposing at least two connectors of different types on the light source substrate and configured to receive power for driving the plurality of light sources.

22. The method of claim 18, wherein the plurality of lights sources is a plurality of lights emitting diodes (LEDs).

23. The method of claim 18, further comprising:
disposing a plurality of lenses on each of the plurality of light sources on the light source substrate.

24. The method of claim 18, further comprising:
disposing a plurality of reflective parts on each of the plurality of light sources on the light source substrate,
wherein each reflective part includes a curved surface facing a respective light source and a plurality of openings allowing light emitted by the respective light source to pass through.

* * * * *